(12) United States Patent
Yoshida

(10) Patent No.: US 12,249,678 B2
(45) Date of Patent: Mar. 11, 2025

(54) LIGHT-EMITTING MODULE AND LENS

(71) Applicant: NICHIA CORPORATION, Anan (JP)

(72) Inventor: Norimasa Yoshida, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/318,944

(22) Filed: May 17, 2023

(65) Prior Publication Data

US 2023/0290915 A1   Sep. 14, 2023

Related U.S. Application Data

(63) Continuation of application No. PCT/JP2021/045390, filed on Dec. 9, 2021.

(30) Foreign Application Priority Data

Dec. 24, 2020 (JP) .................................. 2020-214877
Nov. 25, 2021 (JP) .................................. 2021-190792
Dec. 7, 2021 (JP) .................................. 2021-198770

(51) Int. Cl.
  *F21V 5/04*     (2006.01)
  *F21V 14/06*    (2006.01)
  *H01L 25/075*   (2006.01)
  *H01L 33/58*    (2010.01)

(52) U.S. Cl.
  CPC .............. *H01L 33/58* (2013.01); *F21V 5/045* (2013.01); *F21V 14/06* (2013.01); *H01L 25/0753* (2013.01)

(58) Field of Classification Search
  CPC .................................. F21V 14/02; F21V 14/06
  See application file for complete search history.

(56) References Cited

U.S. PATENT DOCUMENTS

| 4,153,926 A * | 5/1979 | Hurt ........................ F21S 10/06 |
|   |   | 362/35 |
| 9,068,726 B2 * | 6/2015 | Zhang ........................ F21S 8/00 |
| 9,651,222 B2 * | 5/2017 | Jørgensen ............... F21V 5/007 |

(Continued)

FOREIGN PATENT DOCUMENTS

| CN | 110388596 A | 10/2019 |
| DE | 43 07 809 C1 | 10/1994 |

(Continued)

OTHER PUBLICATIONS

International Search Report with English language translation and Written Opinion of the International Searching Authority issued in the corresponding International Patent Application No. PCT/JP2021/045390, dated Jan. 25, 2022.

*Primary Examiner* — Eric T Eide
(74) *Attorney, Agent, or Firm* — FOLEY & LARDNER LLP

(57) ABSTRACT

A light-emitting module includes: a first light source unit including: a first light source, and a first lens on which light emitted from the first light source is incident; a driver configured to rotate the first lens; and a controller configured to, conjunctively with the driver, control an output of the first light source. A central axis of light emitted from the first lens is oblique to a rotation axis of the first lens. The controller is configured to control the output of the first light source according to a position along a trajectory of the central axis of the light emitted from the first lens.

19 Claims, 27 Drawing Sheets

(56) References Cited

U.S. PATENT DOCUMENTS

| | | | |
|---|---|---|---|
| 2004/0004828 A1* | 1/2004 | Chernick | F21S 10/00 |
| | | | 362/184 |
| 2006/0187654 A1 | 8/2006 | Jungel-Schmid et al. | |
| 2007/0097681 A1 | 5/2007 | Chich et al. | |
| 2015/0159842 A1* | 6/2015 | Zhang | F21V 31/00 |
| | | | 362/231 |
| 2017/0268749 A1 | 9/2017 | Pet et al. | |
| 2020/0375173 A1 | 12/2020 | Mori et al. | |
| 2021/0190295 A1 | 6/2021 | Suwa et al. | |
| 2021/0263301 A1 | 8/2021 | Oshima et al. | |

FOREIGN PATENT DOCUMENTS

| | | |
|---|---|---|
| JP | 2005-121872 A | 5/2005 |
| JP | 2006-528820 A | 12/2006 |
| JP | 2017-538260 A | 12/2017 |
| JP | 2019-088256 A | 6/2019 |
| WO | WO-2013/111376 A1 | 8/2013 |
| WO | WO-2019/234795 A1 | 12/2019 |
| WO | WO-2019/234796 A1 | 12/2019 |

* cited by examiner

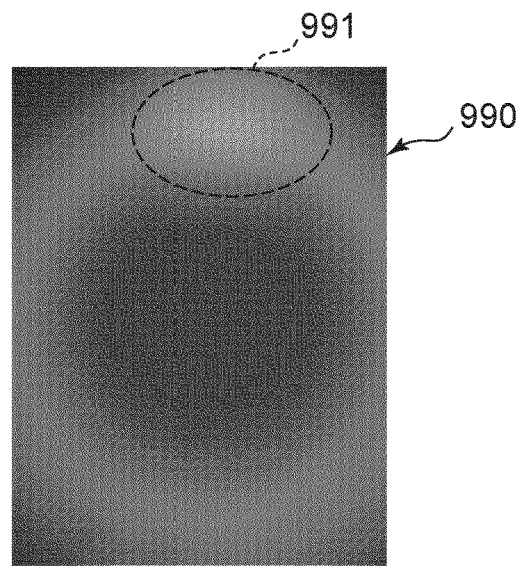
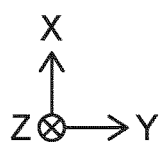
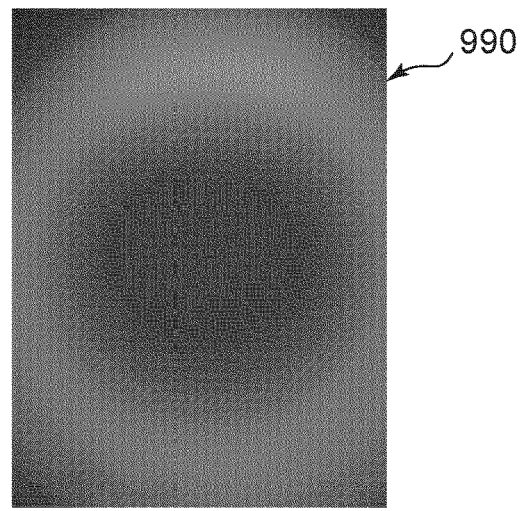
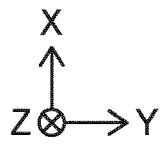
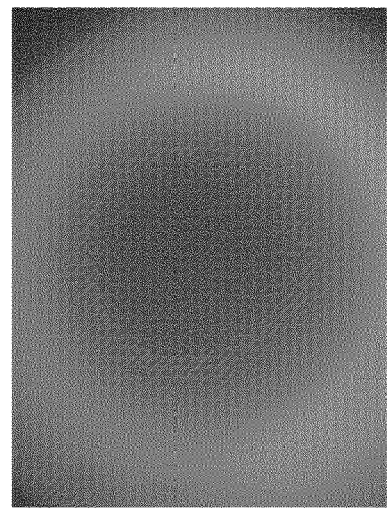
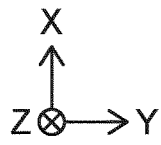

LIGHT-EMITTING MODULE AND LENS

CROSS-REFERENCE TO RELATED APPLICATIONS

This is a bypass continuation of PCT Application No. PCT/JP2021/045390, filed on Dec. 9, 2021, which claims priority to Japanese Application No. 2020-214877, filed on Dec. 24, 2020, Japanese Application No. 2021-190792, filed on Nov. 25, 2021, and Japanese Application No. 2021-198770, filed on Dec. 7, 2021. The contents of these applications are hereby incorporated by reference in their entireties.

BACKGROUND

The present disclosure relates to a light-emitting module and a lens.

A conventional lighting device that has been disclosed includes a plurality of semiconductor light-emitting elements, a housing holding the plurality of semiconductor light-emitting elements so that the optical axes of the light emitted by the plurality of semiconductor light-emitting elements are oriented in the same direction, and a housing drive means that displaces the housing along a plane crossing the optical axes. The housing is rotated around an axial center extending in a direction orthogonal to the aforementioned plane at substantially the center of the plurality of semiconductor light-emitting elements, thereby mixing the light emitted from the plurality of semiconductor light-emitting elements at the imaging subject, and eliminating unevenness of the color temperature and/or lighting occurring due to the individual differences between the single semiconductor light-emitting elements. The light distribution pattern of such a lighting device is constant (e.g., see Japanese Patent Publication No. JP 2005-121872 A).

SUMMARY

The present disclosure is directed to provide a light-emitting module that can modify a light distribution pattern, and a lens that is used in such a light-emitting module.

A light-emitting module according to an embodiment of the disclosure includes a first light source unit including a first light source and a first lens, a driver capable of rotating the first lens, and a controller controlling an output of the first light source conjunctively with the driver, wherein light that is emitted from the first light source is incident on the first lens, and a central axis of light emitted from the first lens is oblique to a rotation axis of the first lens.

A lens according to an embodiment of the disclosure is rotatable around a rotation axis by an external driver, and capable of emitting light having an optical axis oblique to the rotation axis.

A light-emitting module according to an embodiment of the disclosure includes a substrate, a plurality of light source units including a plurality of light sources located at the substrate and a plurality of lenses located respectively in pairs with the plurality of light sources, a driver capable of rotating the plurality of light source units in a state in which the substrate and the plurality of light source units are fixed, and a controller capable of controlling outputs of the plurality of light sources conjunctively with the driver, wherein light that is emitted from the plurality of light sources is incident on the plurality of lenses. Among the plurality of lenses, a number of the lenses capable of irradiating light while being on a trajectory in a first irradiation region centered on a rotation axis of the plurality of light source units is less than a number of the lenses capable of irradiating light while being on a trajectory in a second irradiation region centered on the rotation axis, wherein the trajectory in the second irradiation region is positioned outward of the trajectory in the first irradiation region.

According to certain embodiments of the disclosure, a light-emitting module that can modify a light distribution pattern and a lens that is used in such a light-emitting module can be realized.

BRIEF DESCRIPTION OF THE DRAWINGS

FIG. 24A is an image captured by a camera in an example.
FIG. 24B is an image captured by a camera in an example.
FIG. 24C is an image captured by a camera in an example.

DETAILED DESCRIPTION

Figure 1:
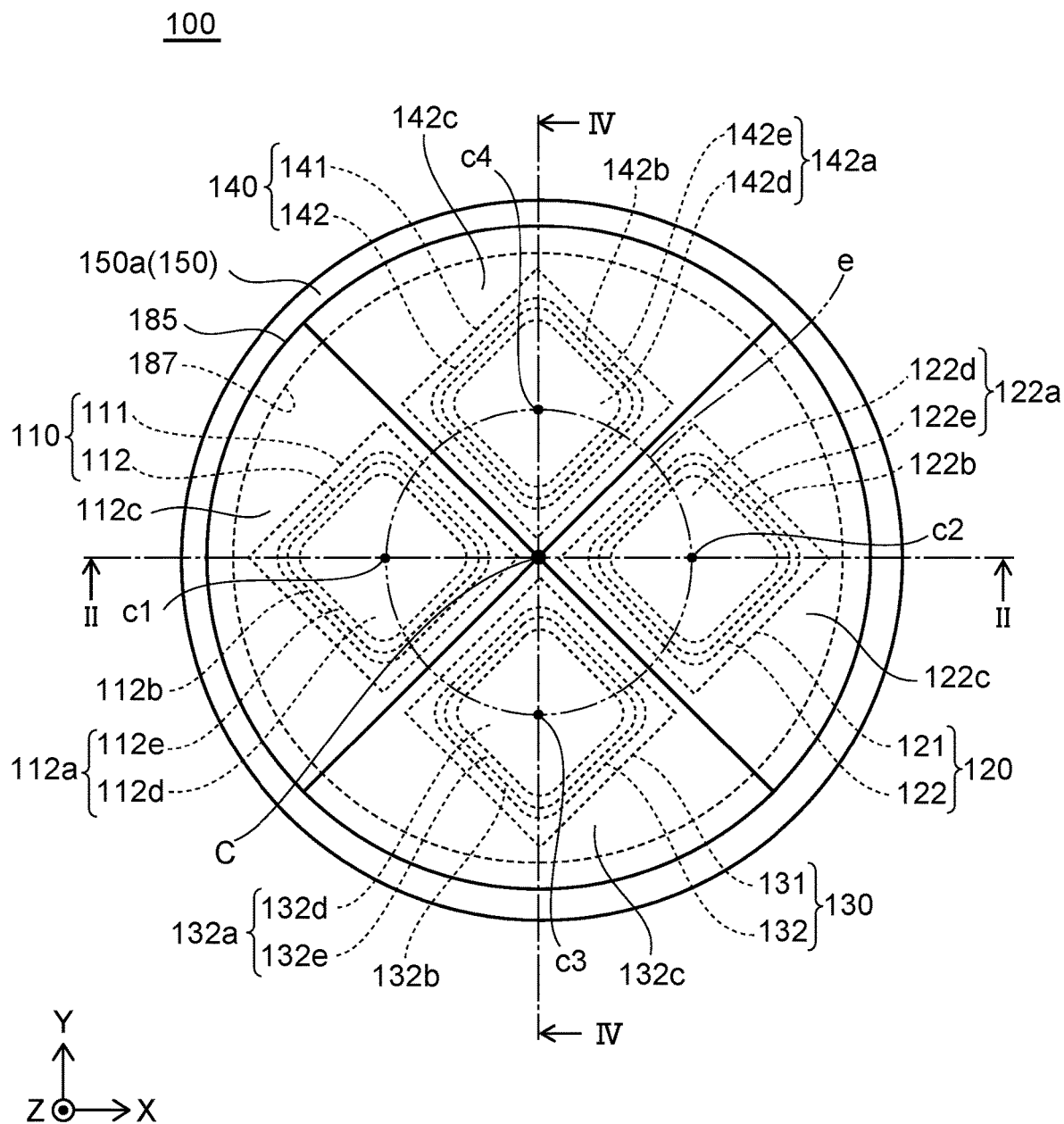
FIG. 1 is a top view showing a light-emitting module according to a first embodiment.

Embodiments for carrying out the invention will now be described with reference to the drawings. In the following description, portions having the same reference numeral in a plurality of drawings refer to the same or equivalent portion or member. End views that show only cross sections may be used as cross-sectional views.

The embodiments below illustrate light-emitting modules to give concrete form to the technical concept of the invention. However, the present invention is not limited to the embodiments described below. Unless specifically stated, the dimensions, materials, shapes, relative arrangements, and the like of the component parts described below are not intended to limit the scope of the invention thereto, and are intended to be examples. Also, the sizes, positional relationships, and the like of the members shown in the drawings may be exaggerated for clarity of description.

Although directions may be shown using an X-axis, a Y-axis, and a Z-axis in the drawings shown below, X-directions along the X-axis refer to prescribed directions in a plane (hereinbelow, also called an arrangement plane) in which light sources included in the light-emitting module according to the embodiment are arranged, Y-directions along the Y-axis refer to directions orthogonal to the X-direction in the arrangement plane of the light source, and Z-directions along the Z-axis refer to directions orthogonal to the arrangement plane of the light source.

Also, among the X-directions, the direction in which the arrow is oriented is notated as the +X direction, and the opposite direction of the +X direction is notated as the −X direction; among the Y-directions, the direction in which the arrow is oriented is notated as the +Y direction, and the opposite direction of the +Y direction is notated as the −Y direction; among the Z-directions, the direction in which the arrow is oriented is notated as the +Z direction, and the opposite direction of the +Z direction is notated as the −Z direction. As an example according to embodiments, a plurality of light sources irradiate light toward the +Z direction side. However, such examples do not limit the orientation when using the light-emitting module, and the orientation of the light-emitting module is arbitrary. In the specification, "in a top view" refers to viewing an object from the +Z direction side.

Also, when a plurality of a component exists in the specification or the claims, the plurality may be differentiated by prefixing "first," "second," or the like before the component. However, the objects that are differentiated may be different between the specification and the claims. Therefore, even when a component recited in the claims has the same prefix as in the specification, the object to be designated by this component does not necessarily match between the specification and the claims.

For example, when components in the specification are differentiated by prefixing "first," "second," and "third," and when the components in the specification to which "first" and "third" are prefixed are recited in the claims, from the perspective of ease of viewing, the components in the claims may be differentiated by prefixing "first" and "second." In such a case, the components in the claims to which "first" and "second" are prefixed refer to the components in the specification to which "first" and "third" are prefixed. The application object of this rule is not limited to components and is reasonably and flexibly applied to other objects as well.

First Embodiment

First, a first embodiment will be described.

FIG. 1 is a top view showing a light-emitting module according to the embodiment.

Figure 2:
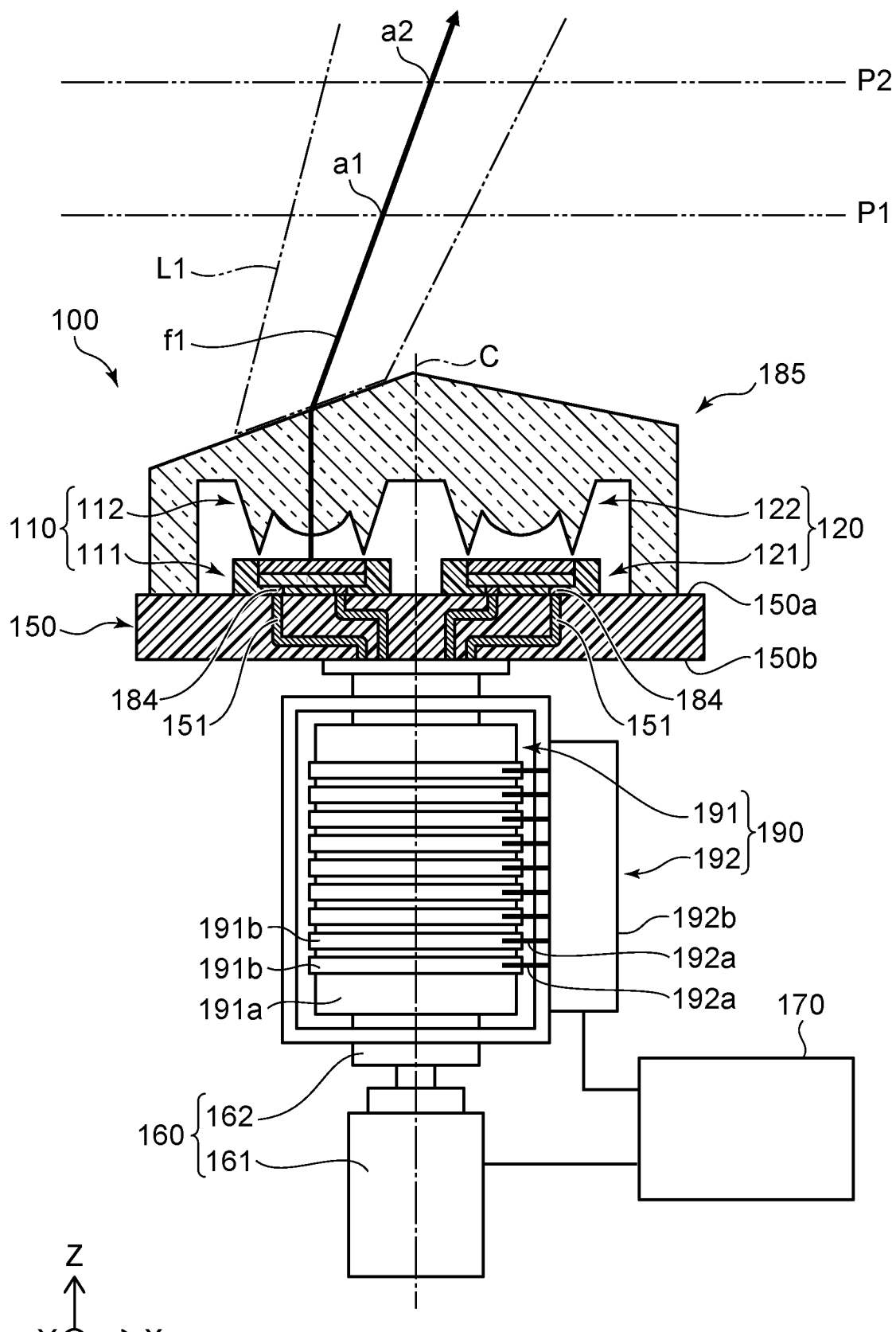
FIG. 2 is a partial cross-sectional view along line II-II of FIG. 1.

FIG. 2 is a partial cross-sectional view along line II-II of FIG. 1.

As shown in FIG. 2, generally speaking, the light-emitting module 100 includes a first light source unit 110, a driver 160, and a controller 170.

The first light source unit 110 includes a first light source 111, and a first lens 112 on which the light emitted from the first light source 111 is incident.

The driver 160 is capable of rotating the first lens 112. In the specification, "the driver being capable of rotating the first lens" may refer to either the driver rotating the first lens itself around an axis parallel to the Z-axis, or the driver rotating a component to which the first lens is mounted around an axis parallel to the Z-axis. Also, when the first lens rotates, other components may rotate together with the first lens around the axis parallel to the Z-axis. According to the embodiment as described below, the driver 160 rotates the first light source unit 110 that includes the first lens 112 by rotating a substrate 150 to which the first lens 112 is mounted around an axis parallel to the Z-axis.

The controller 170 controls the output of the first light source 111 conjunctively with the driver 160.

In FIGS. 1 and 2, the first lens 112 is rotated around a rotation axis C parallel to the Z-axis, and a central axis f1 of a light L1 emitted from the first lens 112 is oblique to the rotation axis C of the first lens 112 (namely, the Z-axis). "The central axis of the light emitted from the first lens"

means a straight line passing through a position a1 at which the illuminance of the light emitted from the first lens 112 is a maximum in an arbitrary plane P1 orthogonal to the Z-axis and a position a2 at which the illuminance of the light is a maximum in another arbitrary plane P2 orthogonal to the Z-axis and separated in the +Z direction from the plane P1. Namely, the central axis of the light is the optical axis. According to the embodiment, the first lens 112 is rotatable around the rotation axis C by the external driver 160, and is capable of emitting the light L1 having an optical axis f1 oblique to the rotation axis C.

Furthermore, "the central axis of the light emitted from the first lens being oblique to the rotation axis of the first lens" refers to the central axis of the light emitted from the first lens having a tilt with respect to the rotation axis of the first lens. Also, a straight line that is an extension of the central axis of the light emitted from the first lens and a straight line that is an extension of the rotation axis of the first lens may have an intersection or may be skew. This is similar for a second lens, a third lens, and a fourth lens described below as well.

According to the embodiment as shown in FIGS. 1 and 2, the light-emitting module 100 further includes a second light source unit 120, a third light source unit 130, a fourth light source unit 140, and the substrate 150.

The second light source unit 120 includes a second light source 121, and a second lens 122 on which the light emitted from the second light source 121 is incident. The third light source unit 130 includes a third light source 131, and a third lens 132 on which the light emitted from the third light source 131 is incident. The fourth light source unit 140 includes a fourth light source 141, and a fourth lens 142 on which the light emitted from the fourth light source 141 is incident.

The first light source unit 110, the second light source unit 120, the third light source unit 130, and the fourth light source unit 140 are mounted to the substrate 150.

The components of the light-emitting module 100 will now be elaborated.

According to the embodiment as shown in FIG. 2, the substrate 150 is a wiring substrate of which the base material is made of an insulating material such as a resin material, etc., and a plurality of wiring parts 151 that are connected to the light sources 111, 121, 131, and 141 are located inside the substrate 150.

The surfaces of the substrate 150 include an upper surface 150a, and a lower surface 150b positioned at the side opposite to the upper surface 150a. The upper surface 150a and the lower surface 150b are orthogonal to the Z-axis. Also, the upper surface 150a is the arrangement plane of the light sources 111, 121, 131, and 141. As shown in FIG. 1, the top-view shape of the upper surface 150a is circular. The center of the upper surface 150a is positioned on the rotation axis C in a top view. However, the shape of the substrate 150 in a top view is not limited to that described above and may be polygonal such as quadrilateral, etc. Also, the center of the upper surface 150a may be positioned at a location other than on the rotation axis C.

Figure 3A:
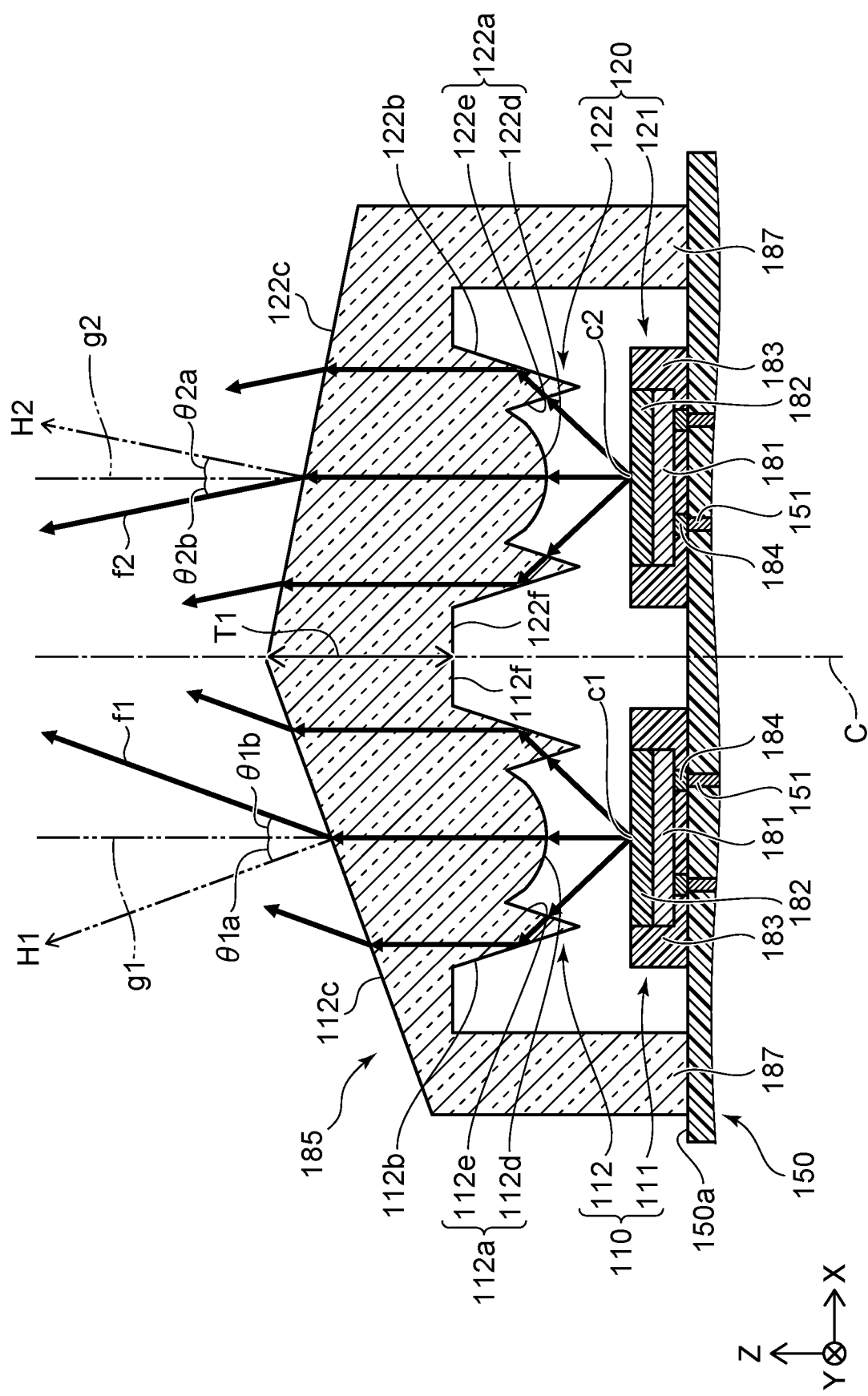
FIG. 3A is an enlarged cross-sectional view showing the first light source unit, the second light source unit, and a portion of the substrate of FIG. 2.

FIG. 3A is an enlarged cross-sectional view of the first light source unit, the second light source unit, and a portion of the substrate of FIG. 2.

Figure 3B:
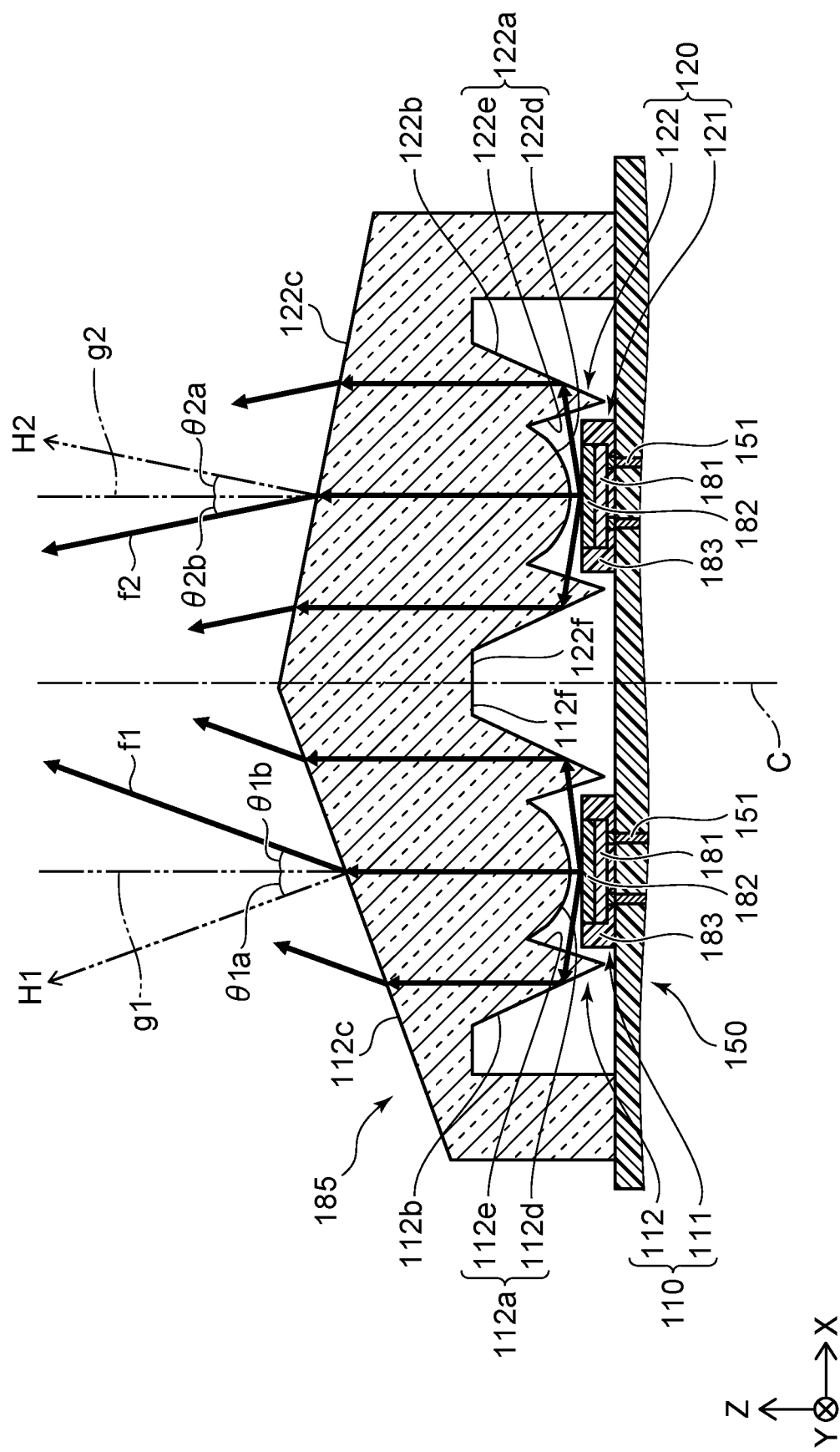
FIG. 3B is a cross-sectional view showing another example of the first light source unit and the second light source unit.

FIG. 3B is a cross-sectional view showing another example of the first light source unit and the second light source unit.

Figure 4A:
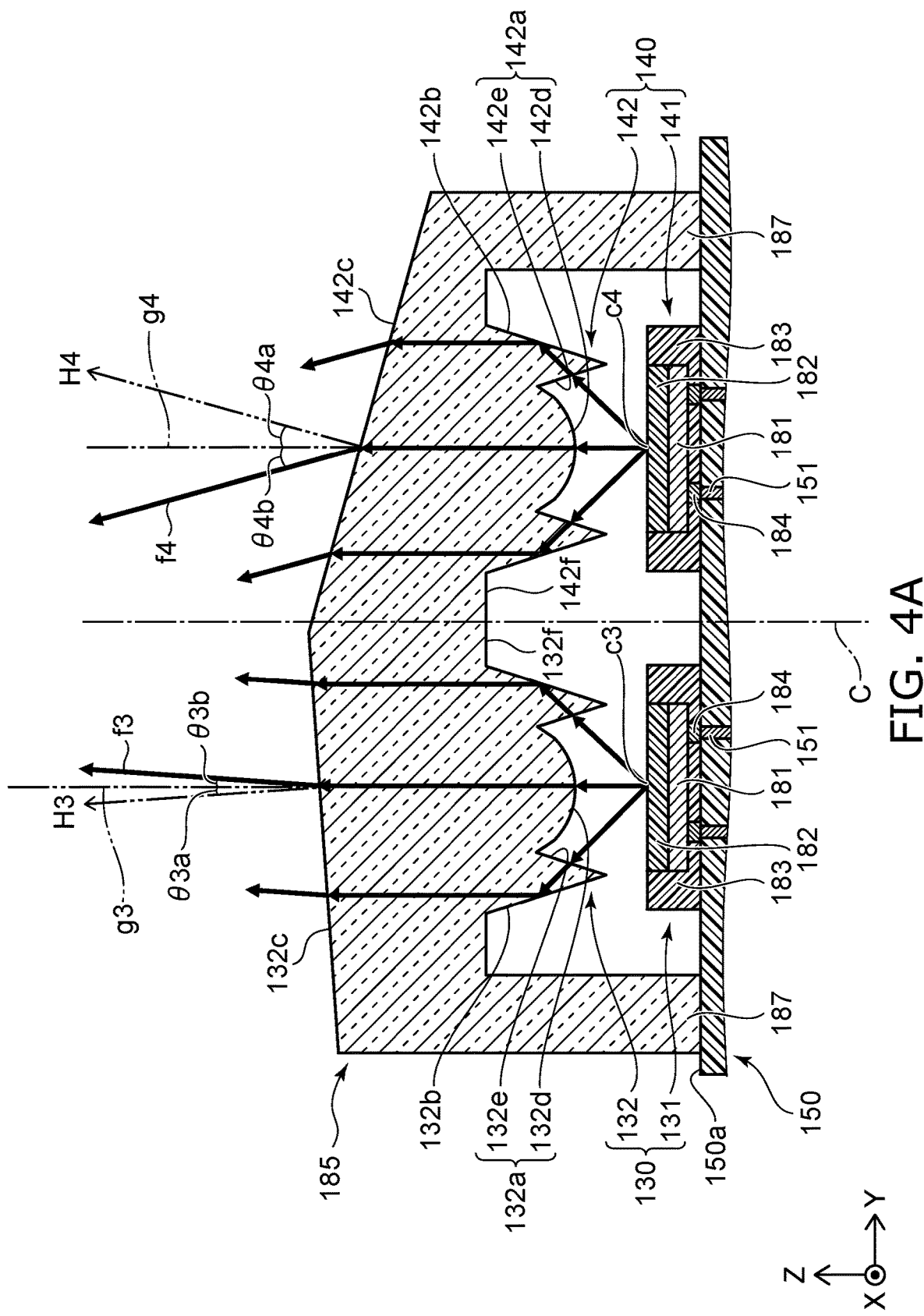
FIG. 4A is an enlarged cross-sectional view showing the third light source unit, the fourth light source unit, and a portion of the substrate at a cross section along line IV-IV of FIG. 1.

FIG. 4A is an enlarged cross-sectional view of the third light source unit, the fourth light source unit, and a portion of the substrate at a cross section along line IV-IV of FIG. 1.

Figure 4B:
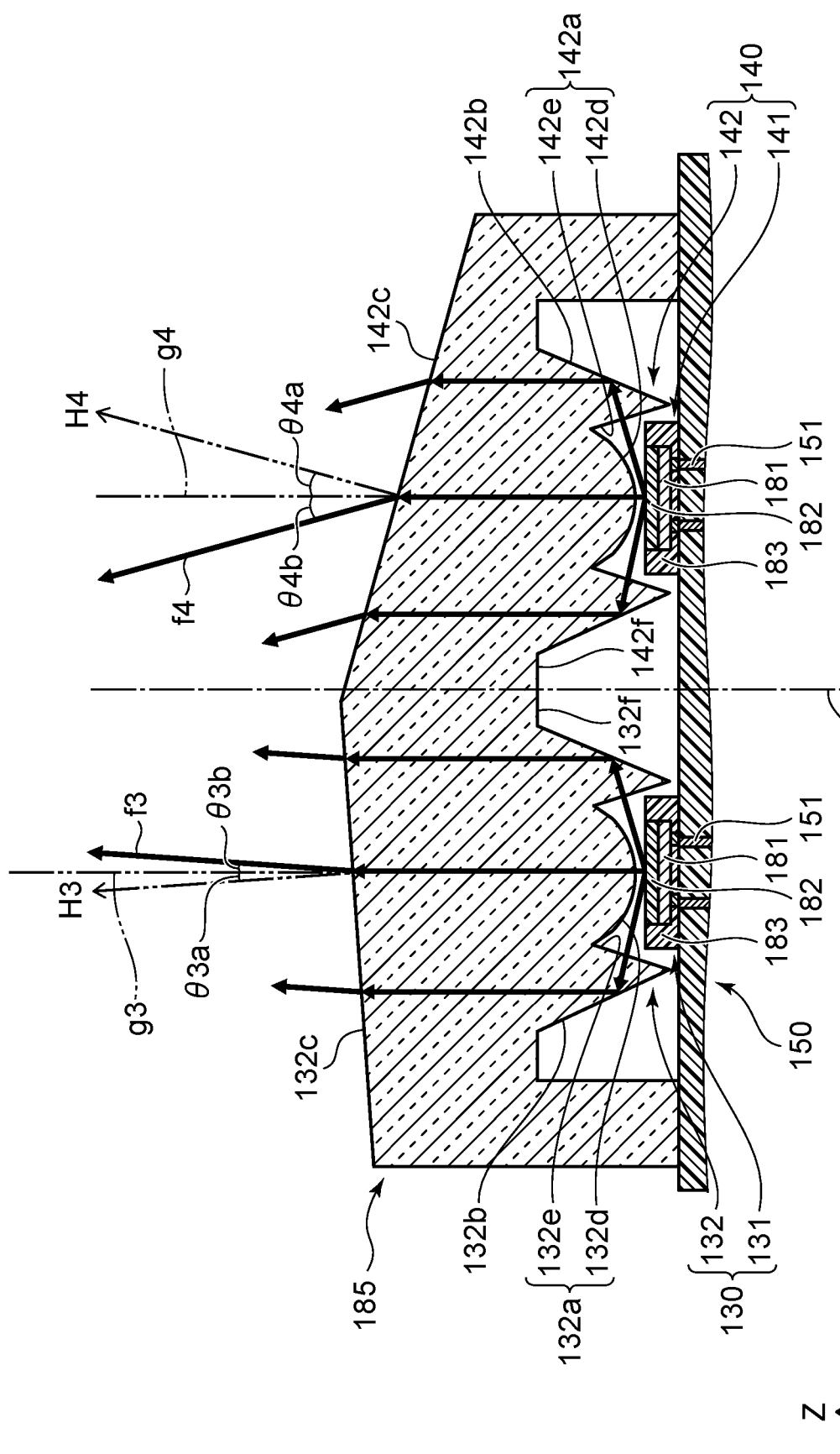
FIG. 4B is a cross-sectional view showing another example of the third light source unit and the fourth light source unit.

FIG. 4B is a cross-sectional view showing another example of the third light source unit and the fourth light source unit.

As shown in FIGS. 3A and 4A, the four light sources 111, 121, 131, and 141 are mounted to the upper surface 150a. However, the number of light sources mounted to the upper surface 150a is not limited to this number as long as the number is not less than one. For example, the number of light sources mounted to the upper surface 150a may be one to three, five, or more.

According to the embodiment, the light sources 111, 121, 131, and 141 each include a light-emitting element 181, a wavelength conversion member 182, and a light-reflective member 183.

The light-emitting element 181 is, for example, an LED (Light Emitting Diode: light-emitting diode). The light-emitting element 181 includes at least a semiconductor stacked body and a positive and negative pair of electrodes 184. According to the embodiment, it is favorable to use, as the material of the semiconductor, a nitride semiconductor that is a material capable of emitting light of a short wavelength that can efficiently excite the wavelength conversion substance included in the wavelength conversion member. The nitride semiconductor is mainly represented by the general formula $In_xAl_yGa_{1-x-y}N$ ($0 \leq x$, $0 \leq y$, and $x+y<1$). From the perspective of the luminous efficiency, the excitation of the wavelength conversion substance, the color mixing relationship of the light emission of the wavelength conversion substance, etc., it is favorable for the light emission peak wavelength of the light-emitting element to be not less than 400 nm and not more than 530 nm, more favorably not less than 420 nm and not more than 490 nm, and even more favorably not less than 450 nm and not more than 475 nm. Also, the material of the semiconductor can include an InAlGaAs semiconductor, an InAlGaP semiconductor, etc. The electrodes 184 of the light-emitting element 181 are electrically connected respectively to the wiring parts 151 of the substrate 150. According to the embodiment, the color of the light emitted from the light-emitting element 181 is blue.

The wavelength conversion member 182 is located on the light-emitting element 181. The wavelength conversion member 182 includes a resin such as silicone or the like as a base material, and includes a wavelength conversion substance. The wavelength conversion substance is a member that absorbs at least a portion of primary light emitted by the light-emitting element 181 and emits secondary light of a different wavelength from the primary light. As the wavelength conversion substance, for example, an yttrium-aluminum-garnet-based fluorescer (e.g., $Y_3(Al,Ga)_5O_{12}:Ce$), a lutetium-aluminum-garnet-based fluorescer (e.g., $Lu_3(Al,Ga)_5O_{12}:Ce$), a terbium-aluminum-garnet-based fluorescer (e.g., $Tb_3(Al,Ga)_5O_{12}:Ce$), a β-sialon fluorescer (e.g., $(Si,Al)_3(O,N)_4:Eu$), an α-sialon fluorescer (e.g., $M_z(Si,Al)_{12}(O,N)_{16}$ (however, $0<z \leq 2$, and M is Li, Mg, Ca, Y, and lanthanoid elements other than La and Ce)), a nitride-based fluorescer such as a CASN-based fluorescer (e.g., $CaAlSiN_3:Eu$), a SCASN-based fluorescer (e.g., $(Sr,Ca)AlSiN_3:Eu$), or the like, a fluoride-based fluorescer such as a KSF-based fluorescer (e.g., $K_2SiF_6:Mn$), a MGF-based fluorescer (e.g., $3.5MgO \cdot 0.5MgF_2 \cdot GeO_2:Mn$), or the like, a CCA-based fluorescer (e.g., $(Ca,Sr)_{10}(PO_4)_6Cl_2:Eu$), a quantum dot of a sulfide-based fluorescer, perovskite, chalcopyrite, etc., can be used. Also, the wavelength conversion substance can include one of these fluorescers alone, or a combination of two or more of these fluorescers. The color that is emitted by the wavelength conversion member 182 is, for example, yellow. The light sources 111, 121, 131, and 141 emit white light due to the color mixing of the blue of the light emitted from the light-emitting element 181 and the yellow of the light emitted from the wavelength conversion member 182.

To extract the light from the light-emitting element 181 toward the upper surface side (the +Z direction side), it is favorable for the light-reflective member 183 to be a white resin in which a white pigment such as titanium oxide, magnesium oxide, or the like is included in the base material of the light-reflective member 183. Examples of the base material of the light-reflective member 183 include resins such as silicone, epoxy, phenol, polycarbonate, acrylic, and the like and modified resins of such resins. The light-reflective member 183 covers at least the side surfaces of the light-emitting element 181 and the wavelength conversion member 182. The upper surface of the wavelength conversion member 182 (the region of the wavelength conversion member 182 not covered with the light-reflective member 183) is used as the light-emitting surface (namely, the light-emitting surface) of each of the light sources 111, 121, 131, and 141.

The configurations of the light sources 111, 121, 131, and 141 are not limited to those described above. For example, the wavelength conversion member 182 of each of the light sources 111, 121, 131, and 141 may include a red fluorescer that emits red light by performing wavelength conversion of blue light, and a green fluorescer that emits green light by performing wavelength conversion of blue light. In such a case, the light sources 111, 121, 131, and 141 can emit white light due to the color mixing of the blue of the light emitted from the light-emitting element 181 and the red and green of the light emitted from the wavelength conversion member 182. Also, the wavelength conversion member 182 may be omitted from one or more light sources among the four light sources 111, 121, 131, and 141.

Although the shapes of the light sources 111, 121, 131, and 141 in a top view are quadrilateral according to the embodiment as shown in FIG. 1, the shapes are not limited thereto. For example, the shapes of the light sources 111, 121, 131, and 141 in a top view may be circular or polygonal such as triangular or the like.

The first light source 111, the second light source 121, the third light source 131, and the fourth light source 141 are arranged on a circumference e centered on the rotation axis C. Specifically, in a top view, a center c1 of the first light source 111, a center c4 of the fourth light source 141, a center c2 of the second light source 121, and a center c3 of the third light source 131 are positioned clockwise in this order on the circumference e centered on the rotation axis C. When the shape of the first light source 111 in a top view is quadrilateral as in the embodiment, the center c1 is positioned at the intersection of the diagonal lines of the first light source 111 in a top view. This is similar for the centers c2, c3, and c4 as well. However, the positions of the light sources 111, 121, 131, and 141 are not limited to those described above. For example, the four light sources 111, 121, 131, and 141 also may be arranged along the X-direction or the Y-direction of the upper surface 150a of the substrate 150.

As shown in FIG. 3A, the first lens 112 is located in the +Z direction of the first light source 111, and the second lens 122 is located in the +Z direction of the second light source 121. Also, as shown in FIG. 4A, the third lens 132 is located in the +Z direction of the third light source 131, and the fourth lens 142 is located in the +Z direction of the fourth light source 141. According to the embodiment, the first lens 112, the second lens 122, the third lens 132, and the fourth lens 142 are formed to have a continuous body as one light-transmitting member 185 by being linked at their surfaces emitting light.

According to the embodiment as shown in FIG. 3A, the first lens 112 is a lens that includes a total reflection surface totally reflecting light. Specifically, the first lens 112 includes a total reflection surface that totally reflects light inside the first lens 112. Therefore, the light that is emitted from the first light source 111 can be projected by being condensed or collimated by the first lens 112. The full width at half maximum of the light emitted from the first lens 112 is, for example, 15 degrees. The surfaces of the first lens 112 include a first surface 112a, a second surface 112b, a third surface 112c, and a fourth surface 112f. In FIG. 3A, the thick solid-line arrows illustrate paths of the light.

The first surface 112a faces the first light source 111. The light that is emitted from the first light source 111 is incident on the first surface 112a. The first surface 112a includes a first region 112d curved in a convex shape toward the first light source 111, and a second region 112e that contacts the outer edge of the first region 112d and extends from the outer edge of the first region 112d toward the first light source 111.

As shown in FIG. 1, the shapes of the outer perimeter of the first region 112d and the outer perimeter of the second region 112e in a top view are quadrilateral with rounded corners. The center of the first region 112d is positioned on the center c1 of the first light source 111 in a top view. Hereinbelow, as shown in FIG. 3A, an axis that passes through the center c1 parallel to the rotation axis C (namely, the Z-axis) is called a "central axis g1." The second region 112e is inclined away from the central axis g1 toward the −Z direction. To make the light from the first light source 111 incident on the first lens 112, it is favorable for the light-emitting surface of the first light source 111 to be between the two lower ends of the second region 112e in the X-direction or the Y-direction when viewed in a cross-section passing through the center c1 of the first light source 111, and it is more favorable for the first light source 111 to be between the two lower ends of the second region 112e in the X-direction or the Y-direction as shown in FIG. 3B.

The second surface 112b is located at the periphery of the first surface 112a. The second surface 112b is inclined to approach the central axis g1 toward the −Z direction. The second surface 112b reflects at least a portion of the light that enters the first lens 112 through the first surface 112a toward the interior of the first lens 112. The second surface 112b corresponds to a total reflection surface.

The third surface 112c is positioned at the side opposite to the first surface 112a. The third surface 112c emits at least a portion of the light that enters the first lens 112 through the first surface 112a. The third surface 112c is a flat surface. The flat surface (the upper surface) of the third surface 112c approaches the substrate 150 away from the rotation axis C. Accordingly, a direction H1 perpendicular to the third surface 112c is inclined to become distal to the rotation axis C toward the +Z direction at an angle θ1a with respect to the rotation axis C (namely, the central axis g1). Therefore, the greater part of the light propagating through the first lens 112 is refracted in a direction tilted at an angle θ1b with respect to the rotation axis C (namely, the central axis g1) to approach the rotation axis C toward the +Z direction when emitted from the third surface 112c. That is, the central axis f1 of the light emitted from the first lens 112 is tilted at the angle θ1*b* with respect to the rotation axis C (namely, the central axis g1) to approach the rotation axis C toward the +Z direction.

The fourth surface 112*f* is located at the periphery of the second surface 112*b*. The fourth surface 112*f* is parallel to the upper surface 150*a* of the substrate 150. However, the fourth surface 112*f* may be oriented other than parallel to the upper surface 150*a* of the substrate 150. This is similar for a fourth surface 122*f* of the second lens 122 described below, a fourth surface 132*f* of the third lens 132, and a fourth surface 142*f* of the fourth lens 142 as well.

According to the embodiment, the second lens 122 is a lens that includes a total reflection surface totally reflecting the light. Specifically, the second lens 122 includes a total reflection surface totally reflecting the light inside the second lens 122. Therefore, the light that is emitted from the second light source 121 can be projected by the second lens 122 by condensing or collimating. The full width at half maximum of the light emitted from the second lens 122 is, for example, 15 degrees. The surfaces of the second lens 122 include a first surface 122*a*, a second surface 122*b*, a third surface 122*c*, and the fourth surface 122*f*.

The first surface 122*a* faces the second light source 121. The light that is emitted from the second light source 121 is incident on the first surface 122*a*. The first surface 122*a* includes a first region 122*d* curved in a convex shape toward the second light source 121, and a second region 122*e* that contacts the outer edge of the first region 122*d* and extends from the outer edge of the first region 122*d* toward the second light source 121.

As shown in FIG. 1, the shapes of the outer perimeter of the first region 122*d* and the outer perimeter of the second region 122*e* in a top view are quadrilateral with rounded corners. The center of the first region 122*d* is positioned on the center c2 of the second light source 121 in a top view. Hereinbelow, as shown in FIG. 3A, an axis that passes through the center c2 parallel to the rotation axis C (namely, the Z-axis) is called a "central axis g2." The second region 122*e* is inclined away from the central axis g2 toward the –Z direction. To make the light from the second light source 121 incident on the second lens 122, it is favorable for the light-emitting surface of the second light source 121 to be between the two lower ends of the second region 122*e* in the X-direction or the Y-direction when viewed in a cross-section passing through the center c2 of the second light source 121, and it is more favorable for the second light source 121 to be between the two lower ends of the second region 122*e* in the X-direction or the Y-direction as shown in FIG. 3B.

The second surface 122*b* is located at the periphery of the first surface 122*a*. The second surface 122*b* is inclined to approach the central axis g2 toward the –Z direction. The second surface 122*b* reflects at least a portion of the light that enters the second lens 122 through the first surface 122*a* toward the interior of the second lens 122. The second surface 122*b* corresponds to a total reflection surface.

The third surface 122*c* is positioned at the side opposite to the first surface 122*a*. The third surface 122*c* emits at least a portion of the light that enters the second lens 122 through the first surface 122*a*. The third surface 122*c* is a flat surface. The flat surface (the upper surface) of the third surface 122*c* approaches the substrate 150 away from the rotation axis C. Accordingly, a direction H2 perpendicular to the third surface 122*c* is tilted at an angle θ2*a* with respect to the rotation axis C (namely, the central axis g2) to become distal to the rotation axis C toward the +Z direction. Therefore, the greater part of the light propagating through the second lens 122 is refracted in a direction tilted at an angle θ2*b* with respect to the rotation axis C (namely, the central axis g2) to approach the rotation axis C toward the +Z direction when emitted from the third surface 122*c*. That is, a central axis f2 of the light emitted from the second lens 122 is tilted at the angle θ2*b* with respect to the rotation axis C (namely, the central axis g2) to approach the rotation axis C toward the +Z direction.

The fourth surface 122*f* is located at the periphery of the second surface 122*b*. The fourth surface 122*f* is parallel to the upper surface 150*a* of the substrate 150.

According to the embodiment, the light-transmitting member 185 includes convex portions protruding in the +Z direction due to the third surface 112*c* of the first lens 112 and the third surface 122*c* of the second lens 122. The fourth surface 112*f* of the first lens 112 and the fourth surface 122*f* of the second lens 122 are coplanar.

According to the embodiment as shown in FIG. 4A, the third lens 132 is a lens that includes a total reflection surface totally reflecting the light. Specifically, the third lens 132 includes a total reflection surface that totally reflects light inside the third lens 132. Therefore, the light that is emitted from the third light source 131 can be projected by the third lens 132 by condensing or collimating. The full width at half maximum of the light emitted from the third lens 132 is, for example, 15 degrees. The surfaces of the third lens 132 include a first surface 132*a*, a second surface 132*b*, a third surface 132*c*, and the fourth surface 132*f*. In FIG. 4A, the thick solid-line arrows illustrate paths of the light.

The first surface 132*a* faces the third light source 131. The light that is emitted from the third light source 131 is incident on the first surface 132*a*. The first surface 132*a* includes a first region 132*d* curved in a convex shape toward the third light source 131, and a second region 132*e* that contacts the outer edge of the first region 132*d* and extends from the outer edge of the first region 132*d* toward the third light source 131.

As shown in FIG. 1, the shapes of the outer perimeter of the first region 132*d* and the outer perimeter of the second region 132*e* in a top view are quadrilateral with rounded corners. The center of the first region 132*d* is positioned on the center c3 of the third light source 131 in a top view. Hereinbelow, as shown in FIG. 4A, an axis that passes through the center c3 parallel to the rotation axis C (namely, the Z-axis) is called a "central axis g3." The second region 132*e* is inclined away from the central axis g3 toward the –Z direction. To make the light from the third light source 131 incident on the third lens 132, it is favorable for the light-emitting surface of the third light source 131 to be between the two lower ends of the second region 132*e* in the X-direction or the Y-direction when viewed in a cross-section passing through the center c3 of the third light source 131, and it is more favorable for the third light source 131 to be between the two lower ends of the second region 132*e* in the X-direction or the Y-direction as shown in FIG. 4B.

The second surface 132*b* is located at the periphery of the first surface 132*a*. The second surface 132*b* is inclined to approach the central axis g3 toward the –Z direction. The second surface 132*b* reflects at least a portion of the light that enters the third lens 132 through the first surface 132*a* toward the interior of the third lens 132. The second surface 132*b* corresponds to a total reflection surface.

The third surface 132*c* is positioned at the side opposite to the first surface 132*a*. The third surface 132*c* emits at least a portion of the light that enters the third lens 132 through the first surface 132*a*. The third surface 132*c* is a flat surface.

The flat surface (the upper surface) of the third surface 132c approaches the substrate 150 away from the rotation axis C. Accordingly, a direction H3 perpendicular to the third surface 132c is tilted at an angle θ3a with respect to the rotation axis C (namely, the central axis g3) to become distal to the rotation axis C toward the +Z direction. Therefore, the greater part of the light propagating through the third lens 132 is refracted in a direction tilted at an angle θ3b with respect to the rotation axis C (namely, the central axis g3) to approach the rotation axis C toward the +Z direction when emitted from the third surface 132c. That is, a central axis f3 of the light emitted from the third lens 132 is tilted at the angle θ3b with respect to the rotation axis C (namely, the central axis g3) to approach the rotation axis C toward the +Z direction.

The fourth surface 132f is located at the periphery of the second surface 132b. The fourth surface 132f is parallel to the upper surface 150a of the substrate 150. The fourth surface 132f is coplanar and in contact with the fourth surface 112f of the first lens 112 and the fourth surface 122f of the second lens 122.

According to the embodiment, the fourth lens 142 is a lens that includes a total reflection surface totally reflecting light. Specifically, the fourth lens 142 includes a total reflection surface that totally reflects light inside the fourth lens 142. Therefore, the light that is emitted from the fourth light source 141 can be projected by the fourth lens 142 by condensing or collimating. The full width at half maximum of the light emitted from the fourth lens 142 is, for example, 15 degrees. The surfaces of the fourth lens 142 include a first surface 142a, a second surface 142b, a third surface 142c, and the fourth surface 142f.

The first surface 142a faces the fourth light source 141. The light that is emitted from the fourth light source 141 is incident on the first surface 142a. The first surface 142a includes a first region 142d curved in a convex shape toward the fourth light source 141, and a second region 142e that contacts the outer edge of the first region 142d and extends from the outer edge of the first region 142d toward the fourth light source 141.

As shown in FIG. 1, the shapes of the outer perimeter of the first region 142d and the outer perimeter of the second region 142e in a top view are quadrilateral with rounded corners. The center of the first region 142d is positioned on the center c4 of the fourth light source 141 in a top view. Hereinbelow, as shown in FIG. 4A, an axis that passes through the center c4 parallel to the rotation axis C (namely, the Z-axis) is called a "central axis g4." The second region 142e is inclined away from the central axis g4 toward the −Z direction. To make the light from the fourth light source 141 incident on the fourth lens 142, it is favorable for the light-emitting surface of the fourth light source 141 to be between the two lower ends of the second region 142e in the X-direction or the Y-direction when viewed in a cross-section passing through the center c4 of the fourth light source 141, and it is more favorable for the fourth light source 141 to be between the two lower ends of the second region 142e in the X-direction or the Y-direction as shown in FIG. 4B.

The second surface 142b is located at the periphery of the first surface 142a. The second surface 142b is inclined to approach the central axis g4 toward the −Z direction. The second surface 142b reflects at least a portion of the light that enters the fourth lens 142 through the first surface 142a toward the interior of the fourth lens 142. The second surface 142b corresponds to a total reflection surface.

The third surface 142c is positioned at the side opposite to the first surface 142a. The third surface 142c emits at least a portion of the light that enters the fourth lens 142 through the first surface 142a. The third surface 142c is a flat surface. The flat surface (the upper surface) of the third surface 142c approaches the substrate 150 away from the rotation axis C. Accordingly, a direction H4 perpendicular to the third surface 142c is tilted at an angle θ4a with respect to the rotation axis C (namely, the central axis g4) to become distal to the rotation axis C toward the +Z direction. Therefore, the greater part of the light propagating through the fourth lens 142 is refracted in a direction tilted at an angle θ4b with respect to the rotation axis C (namely, the central axis g4) to approach the rotation axis C toward the +Z direction when emitted from the third surface 142c. That is, a central axis f4 of the light emitted from the fourth lens 142 is tilted at the angle θ4b with respect to the rotation axis C (namely, the central axis g4) to approach the rotation axis C toward the +Z direction.

The fourth surface 142f is located at the periphery of the second surface 142b. The fourth surface 142f is parallel to the upper surface 150a of the substrate 150. The fourth surface 142f is coplanar and in contact with the fourth surface 112f of the first lens 112 and the fourth surface 122f of the second lens 122.

According to the embodiment, the light-transmitting member 185 includes convex portions protruding in the +Z direction due to the third surface 132c of the third lens 132 and the third surface 142c of the fourth lens 142. As shown in FIG. 1, the third surface 112c of the first lens 112 contacts the third surface 132c of the third lens 132 and the third surface 142c of the fourth lens 142. The third surface 122c of the second lens 122 contacts the third surface 132c of the third lens 132 and the third surface 142c of the fourth lens 142.

According to the embodiment as shown in FIGS. 3A and 4A, the angle θ1a, the angle θ2a, the angle θ3a, and the angle θ4a are different from each other, i.e., angle θ3a<angle θ2a<angle θ4a<angle θ1a. Accordingly, angle θ3b<angle θ2b<angle θ4b<angle θ1b. The magnitude relationship of the angle θ1a, the angle θ2a, the angle θ3a, and the angle θ4a is not limited to that described above because the tilt angles of the third surface 112c of the first lens 112, the third surface 122c of the second lens 122, the third surface 132c of the third lens 132, and the third surface 142c of the fourth lens 142 with respect to the rotation axis C (or the Z-axis) can be adjusted as appropriate.

While being flat surfaces according to the embodiment, the third surface 112c of the first lens 112, the third surface 122c of the second lens 122, the third surface 132c of the third lens 132, and the third surface 142c of the fourth lens 142 are not limited to flat surfaces as long as the central axes f1, f2, f3, and f4 of the light emitted from the lenses are oblique to the rotation axis C.

Also, the center c1 of the first light source 111 may be shifted from the center of the first region 112d in a top view. In particular, when the distance between the rotation axis C and the center c1 of the first light source 111 is greater than the distance between the rotation axis C and the center of the first region 112d, the first light source 111 is separated from the second lens 122 compared to when the center c1 of the first light source 111 is positioned on the center of the first region 112d in a top view. As a result, the light that is emitted from the first light source 111 can be prevented from traveling toward the third surface 122c of the second lens 122 after entering the first lens 112. There is a possibility that a portion of the light emitted from the first light source 111 and entering the first lens 112 may be refracted in a direction other than the direction tilted at the angle θ2b with respect to the rotation axis C (namely, the Z-axis) when a portion of the light propagates through the second lens 122 and is emitted from the third surface 122c of the second lens 122. In other words, there is a possibility that light (stray light) also may be emitted from the third surface 122c toward a direction other than the expected light toward the direction tilted at the angle θ2b with respect to the rotation axis C. As described above, by separating the first light source 111 from the second lens 122, the light that is emitted from the first light source 111 can be prevented from traveling toward the third surface 122c of the second lens 122 after entering the first lens 112. As a result, the occurrence of such stray light can be suppressed. The positional relationship between the second lens 122 and the second light source 121, the positional relationship between the third lens 132 and the third light source 131, and the positional relationship between the fourth lens 142 and the fourth light source 141 also may have similar configurations.

According to the embodiment, the rotation axis C, the Z-axis, and the central axes g1, g2, g3, and g4 are parallel to each other. Therefore, according to the first embodiment, when a straight line that is an extension of the central axis f1 of the light emitted from the first lens 112 and a straight line that is an extension of the rotation axis C of the first lens 112 have an intersection or are skew, "the angle between the rotation axis C and the central axis f1 of the light emitted from the first lens 112" is the same as "the angle between the Z-axis and the central axis f1 of the light emitted from the first lens 112" or "the angle between the central axis f1 of the light emitted from the first lens 112 and the central axis g1 passing through the center c1 of the first light source 111." This is similar for the second lens 122, the third lens 132, and the fourth lens 142 as well.

As shown in FIGS. 3A and 4A, a support part 187 that extends toward the substrate 150 is located at the outer perimeter portion of the light-transmitting member 185. The support part 187 is fixed to the upper surface 150a of the substrate 150. The support part 187 holds the lenses 112, 122, 132, and 142 in a state of being separated from the light sources 111, 121, 131, and 141. According to the embodiment as shown in FIG. 1, the support part 187 has a tubular shape surrounding the periphery of the first lens 112, the second lens 122, the third lens 132, and the fourth lens 142. The support part 187 is not limited to a tubular shape and may be a plurality of columnar-shaped support parts arranged at the outer perimeter of the light-transmitting member 185. Also, the support part may include a member other than the light-transmitting member 185. In such a case, the support part is not necessarily transmissive.

Also, the light-transmitting member 185 is not necessarily formed of the four lenses 112, 122, 132, and 142 formed to have a continuous body. For example, the lenses 112, 122, 132, and 142 that are made of different materials or have different refractive indexes may be bonded to form a continuous body by an adhesive, etc. Also, the lenses 112, 122, 132, and 142 that are made of different materials or have different refractive indexes may be individually mounted to the upper surface 150a of the substrate 150 without being bonded to each other.

According to the embodiment as shown in FIG. 2, the driver 160 rotates the first light source unit 110, the second light source unit 120, the third light source unit 130, and the fourth light source unit 140 by rotating the substrate 150 around an axis parallel to the Z-axis.

According to the embodiment, the driver 160 includes a motor 161, and a shaft 162 that is linked to the substrate 150 and moves with the motor 161. The shaft 162 rotates when the motor 161 drives. In response to the rotation of the shaft 162, the substrate 150 rotates around the rotation axis C, which is parallel to the Z-axis, as a central axis, and the light-transmitting member 185 (the lenses 112, 122, 132, and 142) that is fixed to the substrate 150 rotates.

A rotary connector 190 that includes a ring unit 191 and a brush unit 192 is located at the shaft 162. According to the embodiment, the rotary connector 190 is a slip ring. The rotary connector 190 electrically connects the controller 170 and the plurality of wiring parts 151 embedded in the rotating substrate 150.

The ring unit 191 includes a tubular body 191a that is linked to the shaft 162 and has the shaft 162 located in the interior of the tubular body 191a, and a plurality of rings 191b that are located at the outer perimeter of the tubular body 191a and are conductive. The ring unit 191 rotates together with the shaft 162. The plurality of rings 191b and the plurality of wiring parts 151 embedded in the substrate 150 are electrically connected one-to-one via the interior of the shaft 162 and the interior of the tubular body 191a.

The brush unit 192 includes a plurality of brushes 192a that are conductive and respectively contact the plurality of rings 191b, and a holder 192b that holds the plurality of brushes 192a. The plurality of brushes 192a are individually electrically connected to the controller 170. In FIG. 2, the connectional relationship between the controller 170 and the rotary connector 190 is simply shown by one line. The controller 170 and the brush unit 192 do not rotate. For example, when the light-emitting module 100 is used as the light source of the flash of a smartphone, the controller 170 and the brush unit 192 are fixed with respect to the housing of the smartphone, etc. Therefore, when the motor 161 is driven, the brush unit 192 can transmit an electrical signal to the ring unit 191 without rotating. However, the light-emitting module 100 may be used other than as the light source of a flash of a smartphone.

The configuration of the rotary connector 190 is not limited to the configuration described above. For example, the rotary connector 190 may be a rotary connector that uses a liquid metal, etc.

The controller 170 includes, for example, a CPU (Central Processing Unit), memory, etc. The controller 170 is electrically connected to the motor 161 of the driver 160. The controller 170 rotates the substrate 150 around the rotation axis C by controlling the motor 161. Although not particularly limited, the rotational speed of the substrate 150 is, for example, not less than 60 rpm and not more than 24000 rpm. The rotational speed of the substrate 150 is, for example, 14000 rpm. However, the controller 170 may be configured to be able to adjust the number of rotations of the motor 161.

The controller 170 individually controls the outputs of the four light sources 111, 121, 131, and 141. "Control the output" includes switching the light source on, switching the light source off, and adjusting the luminance of the light emitted from the light source when the light source is lit. Specifically, the controller 170 individually controls the outputs of the light sources 111, 121, 131, and 141 by individually adjusting the current amounts supply to the light sources 111, 121, 131, and 141 via the rotary connector 190.

The controller 170 controls the output of the first light source 111 according to the position of the circumferential trajectory of the central axis f1 of the light emitted from the first lens 112 when the substrate 150 is rotated around the rotation axis C. Also, the controller 170 controls the output of the second light source 121 according to the position of the circumferential trajectory of the central axis f2 of the light emitted from the second lens 122 when the substrate 150 is rotated around the rotation axis C. Also, the controller 170 controls the output of the third light source 131 according to the position of the circumferential trajectory of the central axis f3 of the light emitted from the third lens 132 when the substrate 150 is rotated around the rotation axis C. Also, the controller 170 controls the output of the fourth light source 141 according to the position of the circumferential trajectory of the central axis f4 of the light emitted from the fourth lens 142 when the substrate 150 is rotated around the rotation axis C.

For example, the controller 170 may estimate the positions on the trajectories of the central axes f1, f2, f3, and f4 of the light based on the positions of the lenses 112, 122, 132, and 142 prior to rotation, the rotational speed and/or number of rotations of the motor 161, etc. Also, the controller 170 may estimate the positions on the trajectories of the central axes f1, f2, f3, and f4 of the light during rotation by using the detection result of a rotation angle detection sensor such as a rotary encoder, etc. Specifically, the rotation angle detection sensor uses a state in which the substrate 150 is not rotating or the like as a reference state and detects the rotation amount (the rotation angle) of the substrate 150 from the reference state. Then, the positions on the trajectories of the central axes f1, f2, f3, and f4 of the light during rotation can be estimated based on the rotation angle of the substrate 150 from the reference state.

Operations of the light-emitting module 100 according to the embodiment will now be described.

Figure 5:
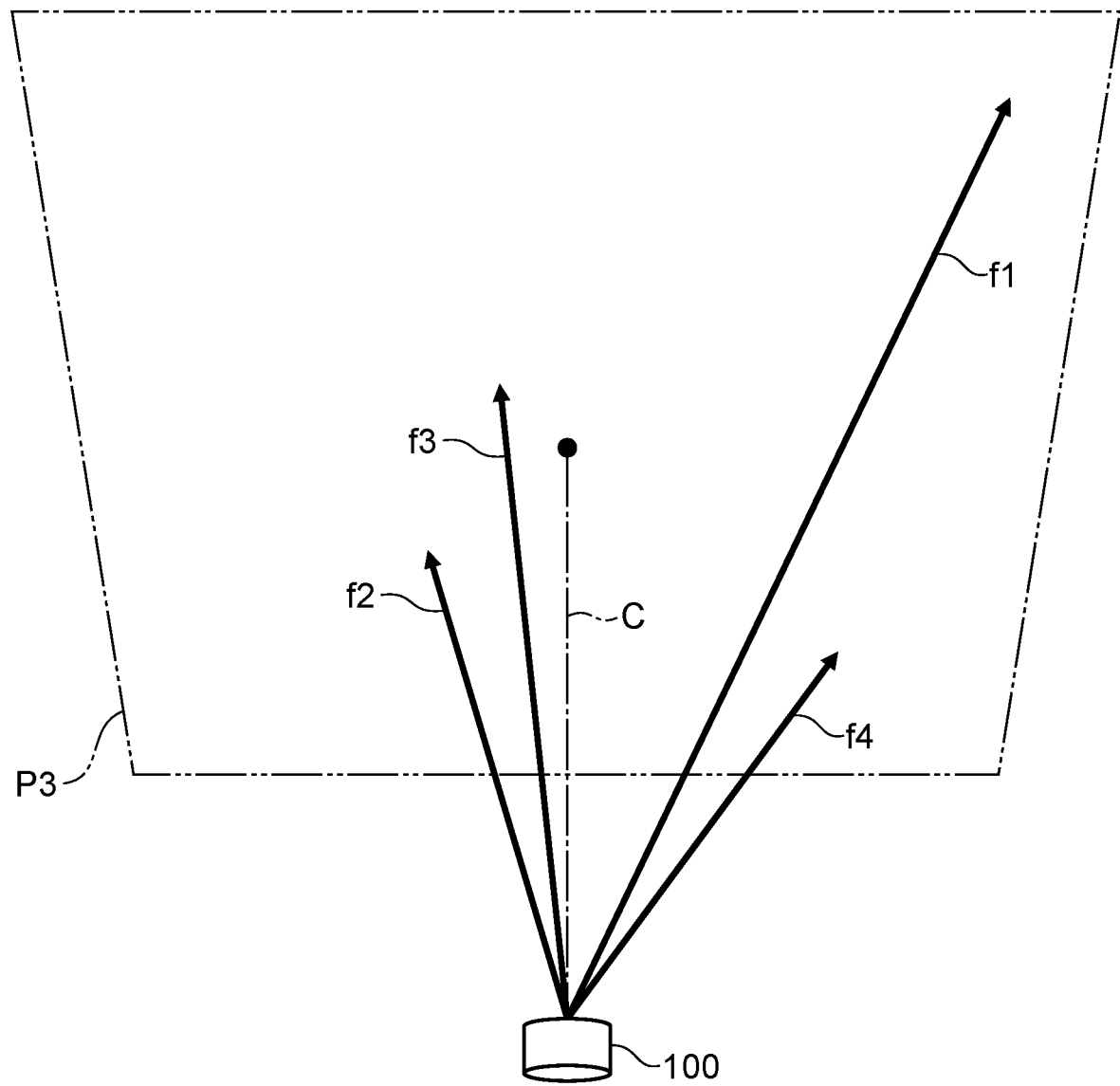
FIG. 5 is a drawing showing positions at a plane orthogonal to the axis direction of the light emitted from the light source units.

FIG. 5 is a drawing showing positions at a plane orthogonal to the Z-axis of the light emitted from the light source units.

Figure 6:
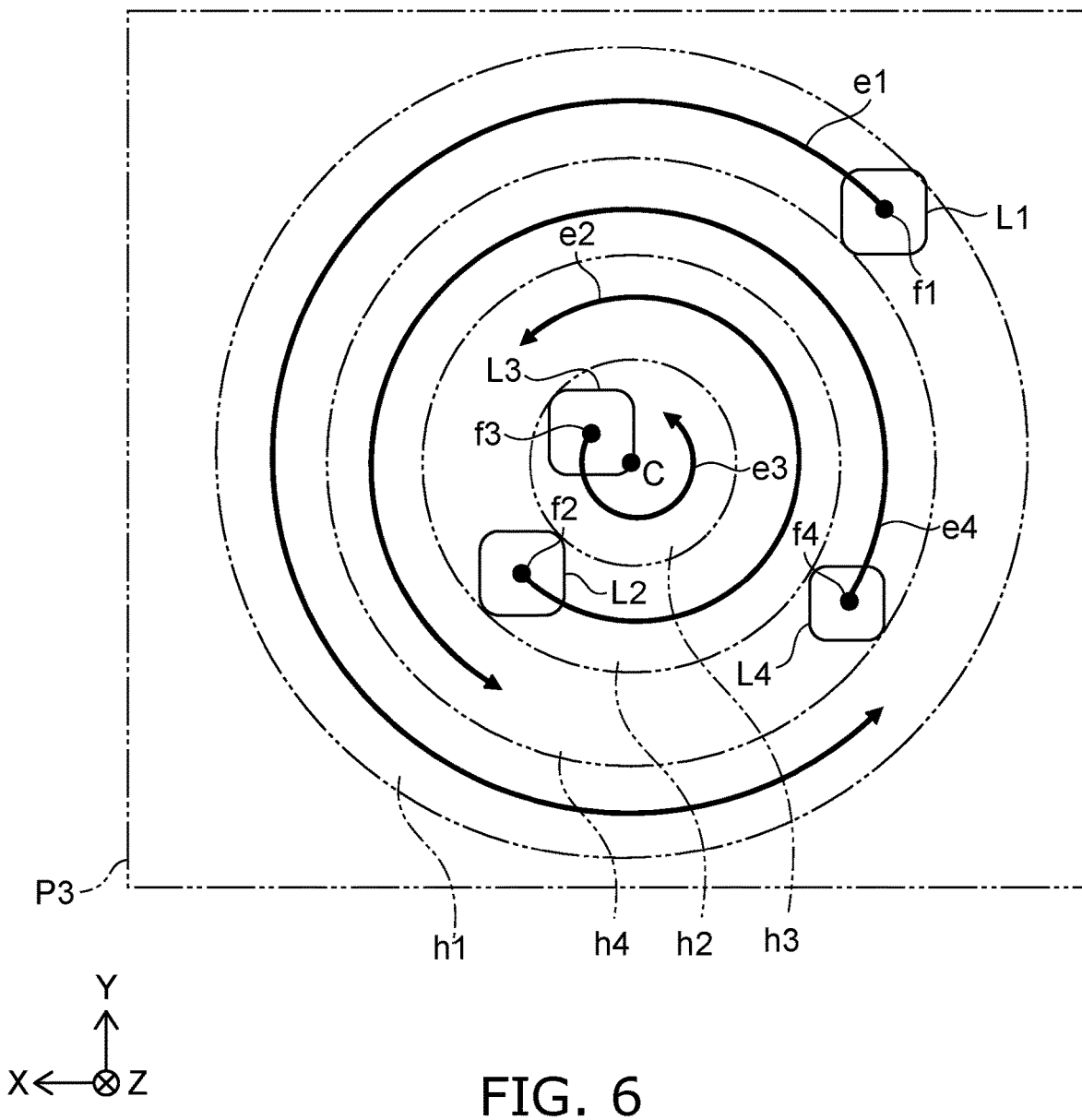
FIG. 6 is a drawing showing the positions and trajectories at the plane orthogonal to the axis direction of the light emitted from the light source units.

FIG. 6 is a drawing showing the positions and trajectories at the plane orthogonal to the Z-axis of the light emitted from the light source units.

When the light sources 111, 121, 131, and 141 are lit in a state in which the substrate 150 is not rotating as shown in FIG. 5, the central axes f1, f2, f3, and f4 of the light emitted from the light sources 111, 121, 131, and 141 are tilted to become distal to the rotation axis C away from the light-emitting module 100 in the +Z direction. Therefore, the light can be irradiated in a wide area while keeping the light-emitting module 100 compact.

According to the embodiment, angle θ3b<angle θ2b<angle θ4b<angle θ1b. Accordingly, as shown in FIG. 6, the trajectory of the central axis f3 of light L3 emitted from the third lens 132 is at a position separated from the rotation axis C in one plane P3 orthogonal to the Z-axis. The trajectory of the central axis f2 of light L2 emitted from the second lens 122 is at a position separated from the rotation axis C more than the position of the trajectory of the central axis f3 in the plane P3. The trajectory of the central axis f4 of light L4 emitted from the fourth lens 142 is at a position separated from the rotation axis C more than the position of the trajectory of the central axis f2 in the plane P3. The trajectory of the central axis f1 of the light L1 emitted from the first lens 112 is at a position separated from the rotation axis C more than the position of the trajectory of the central axis f4 in the plane P3.

When the substrate 150 rotates once around the rotation axis C in the state in which the four light sources 111, 121, 131, and 141 are lit, the light source units 110, 120, 130, and 140 also rotate once around the rotation axis C. At this time, the central axis f3 of the third light source unit 130 moves in the plane P3 on a circumferential trajectory e3 centered on the rotation axis C. The central axis f2 of the second light source unit 120 moves in the plane P3 on a circumferential trajectory e2 that is centered on the rotation axis C and has a larger radius than the trajectory e3. The central axis f4 of the fourth light source unit 140 moves in the plane P3 on a circumferential trajectory e4 that is centered on the rotation axis C and has a larger radius than the trajectory e2. The central axis f1 of the first light source unit 110 moves in the plane P3 on a circumferential trajectory e1 that is centered on the rotation axis C and has a larger radius than the trajectory e4.

At this time, the controller 170 can realize various light distribution patterns by controlling the outputs of the light sources 111, 121, 131, and 141 according to the positions of the central axes f1, f2, f3, and f4 in the rotational direction.

Hereinbelow, the region on which the light L1 emitted from the first light source unit 110 is irradiated when the substrate 150 is rotated once around the rotation axis C in the state in which the first light source 111 is lit is called a "first irradiation region h1." Also, the region on which the light L2 emitted from the second light source unit 120 is irradiated when the substrate 150 is rotated once around the rotation axis C in the state in which the second light source 121 is lit is called a "second irradiation region h2." Also, the region on which the light L3 emitted from the third light source unit 130 is irradiated when the substrate 150 is rotated once around the rotation axis C in the state in which the third light source 131 is lit is called a "third irradiation region h3." The region on which the light L4 emitted from the fourth light source unit 140 is irradiated when the substrate 150 is rotated once around the rotation axis C in the state in which the fourth light source 141 is lit is called a "fourth irradiation region h4."

Although FIG. 6 shows a one-to-one relationship for the regions (i.e., the first irradiation region h1, the second irradiation region h2, the third irradiation region h3, and the fourth irradiation region h4, generally referred to as the "irradiation regions" below) on which the light from the light source units 110, 120, 130, and 140 is irradiated, the light that is emitted from the light source units is not actually limited to illuminating only the corresponding irradiation region. The irradiation region that corresponds to each light source unit is the region that is the irradiation target of the light source unit. Accordingly, actually, the light that is emitted from one light source unit also may illuminate at least a portion of an adjacent irradiation region. That is, although FIG. 6 shows an example in which the adjacent irradiation regions do not overlap, the adjacent irradiation regions may partially overlap.

For example, according to the embodiment, the first irradiation region h1, the second irradiation region h2, and the fourth irradiation region h4 are ring-shaped. In contrast, the third irradiation region h3 is circular. Thus, the irradiation region changes from ring-shaped toward circular as the angle between the rotation axis and the central axis of the light decreases.

According to the embodiment, all of the central axes f1, f2, f3, and f4 of the lights L1, L2, L3, and L4 emitted from the lenses 112, 122, 132, and 142 are oblique to the rotation axis C. However, it is sufficient for the central axis of the light emitted from at least one lens to be oblique to the rotation axis C. For example, the light-emitting module may include a lens emitting light having a central axis parallel to the rotation axis C. The trajectory of the central axis in the plane P3 of the light emitted from such a lens is positioned inward of the trajectory of the light having central axes oblique to the rotation axis C. Also, although the trajectory of the central axis of the light emitted from such a lens is a circumferential trajectory, the irradiation region of the light emitted from such a lens is circular in the plane P3 similarly to the third irradiation region h3 shown in FIG. 6.

An application example of the light-emitting module 100 will now be described. The light-emitting module 100 is applicable to the light source of a flash of a smartphone camera.

Figure 7A:
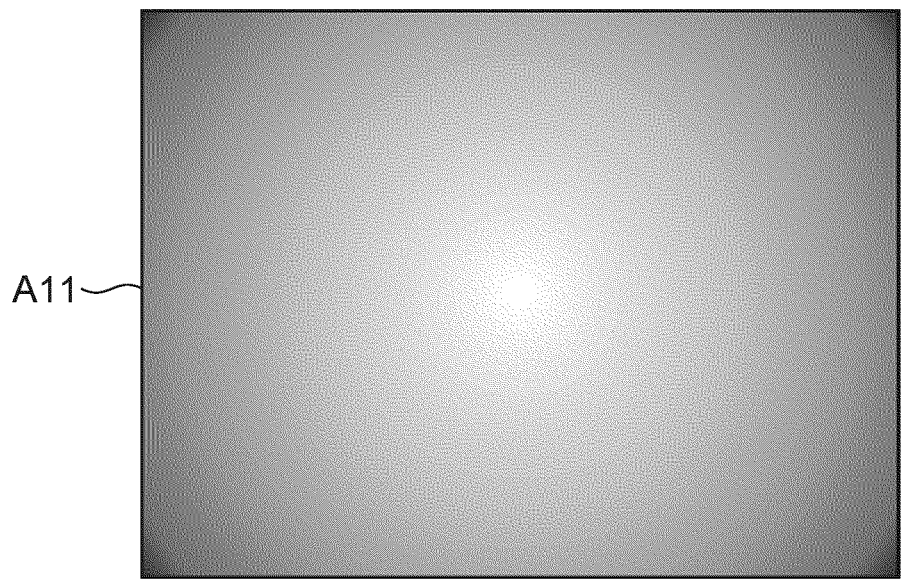
FIG. 7A is a schematic view illustrating a light distribution pattern of a light source of a flash according to a reference example.

FIG. 7A is a schematic view illustrating a light distribution pattern of a light source of a flash according to a reference example.

Figure 7B:
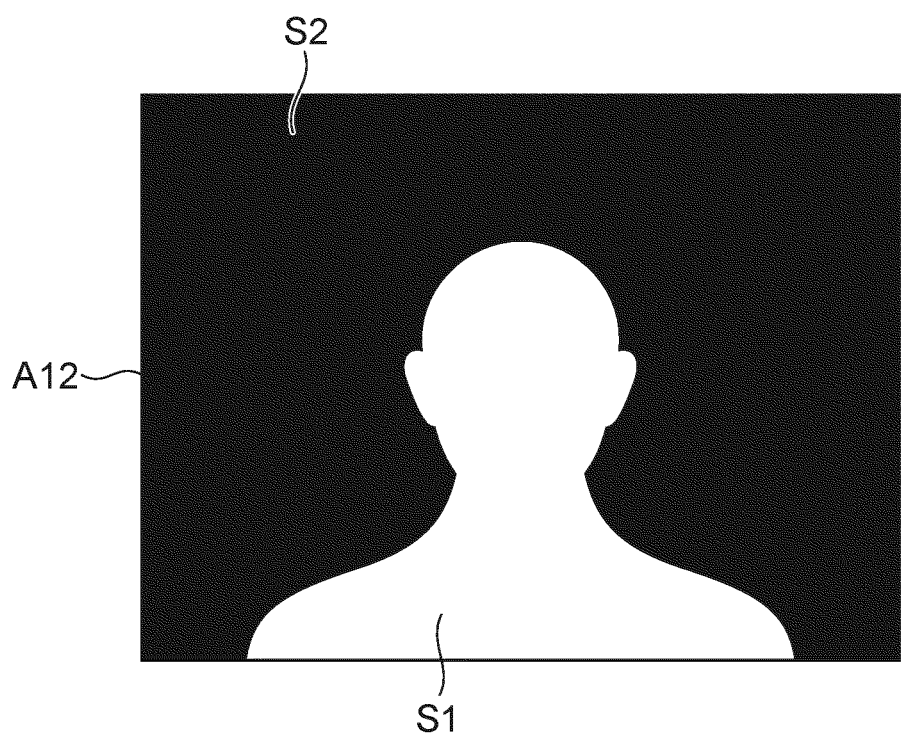
FIG. 7B is a schematic view illustrating a photograph imaged using the light distribution pattern shown in FIG. 7A.

FIG. 7B is a schematic view illustrating a photograph imaged using the light distribution pattern shown in FIG. 7A.

Figure 8A:
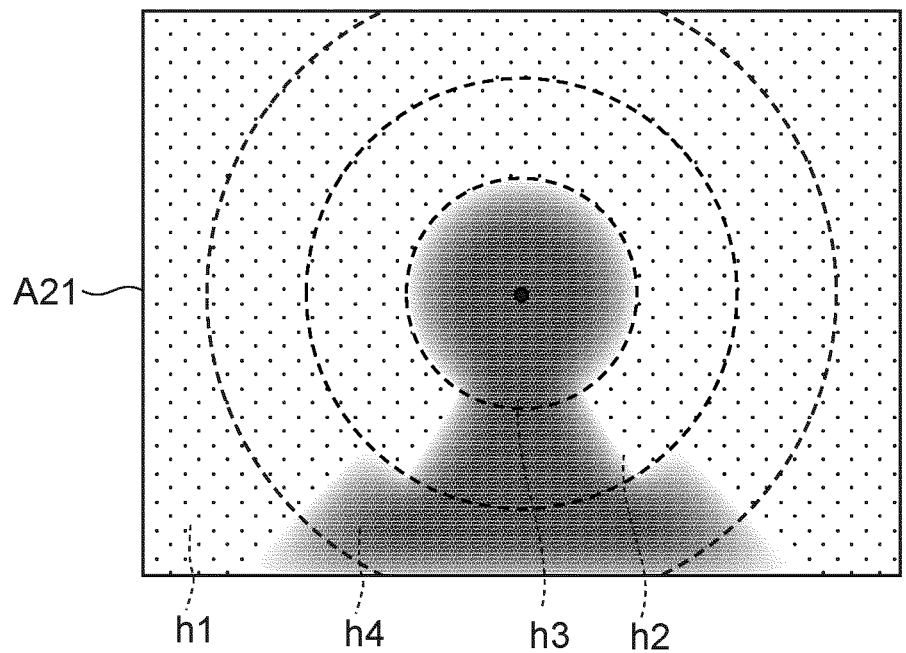
FIG. 8A is a schematic view illustrating a light distribution pattern when applying the light-emitting module according to the first embodiment to a light source of a flash.

FIG. 8A is a schematic view illustrating a light distribution pattern when applying the light-emitting module 100 according to the embodiment to the light source of the flash.

Figure 8B:
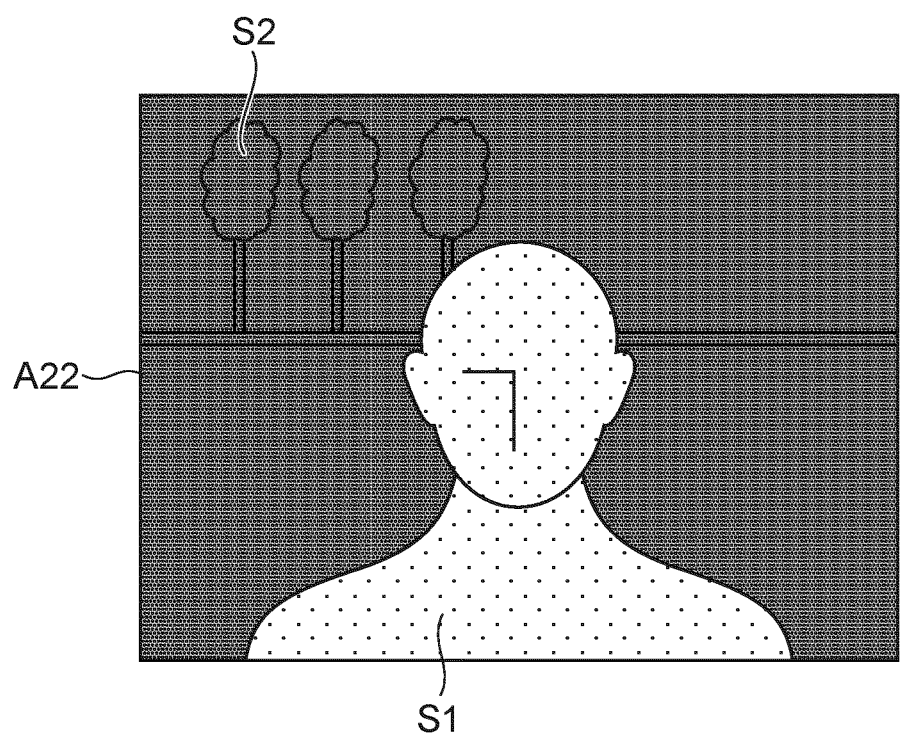
FIG. 8B is a schematic view illustrating a photograph imaged using the light distribution pattern shown in FIG. 8A.

FIG. 8B is a schematic view illustrating a photograph imaged using the light distribution pattern shown in FIG. 8A.

As shown in FIG. 7A, for a light source of the flash in which the light distribution pattern is always constant (a light distribution pattern A11), for example, the illuminance is highest at the central portion of the light distribution pattern. Therefore, as shown in FIG. 7B, in a photograph A12 imaged using the light distribution pattern A11, an imaging subject S1 proximate to the light source of the flash becomes bright, and an imaging subject S2 distant to the light source of the flash becomes dark. As a result, in the photograph A12, the imaging subject S1 that is proximate to the light source of the flash may be whited out, and the imaging subject S2 that is distant to the light source of the flash may be blacked out. Thus, for a light source of a flash in which the light distribution pattern is always constant, a phenomenon of lost gradation may occur.

In contrast, for a light source of a flash to which the light-emitting module 100 according to the embodiment is applied, the light distribution pattern can be adjusted according to the distances between the light-emitting module 100 and the imaging subjects S1 and S2. Specifically, as shown in FIG. 8A, the light-emitting module 100 emits a light distribution pattern A21 in which the illuminance of the imaging subject S1 is less than the illuminance of the imaging subject S2. Specifically, in the light distribution pattern A21, the illuminances in the entire third irradiation region h3, the lower region of the second irradiation region h2, the lower region of the fourth irradiation region h4, and the lower region of the first irradiation region h1 are less than the illuminances in the other regions of the light distribution pattern A21.

Therefore, in a photograph A22 imaged using the light distribution pattern A21 as shown in FIG. 8B, the excessive brightness of the imaging subject Si proximate to the light source of the flash is suppressed, and the excessive darkness of the imaging subject S2 distant to the light source of the flash is suppressed. As a result, the occurrence of white-out and/or black-out in the photograph A22 can be suppressed.

Figure 8C:
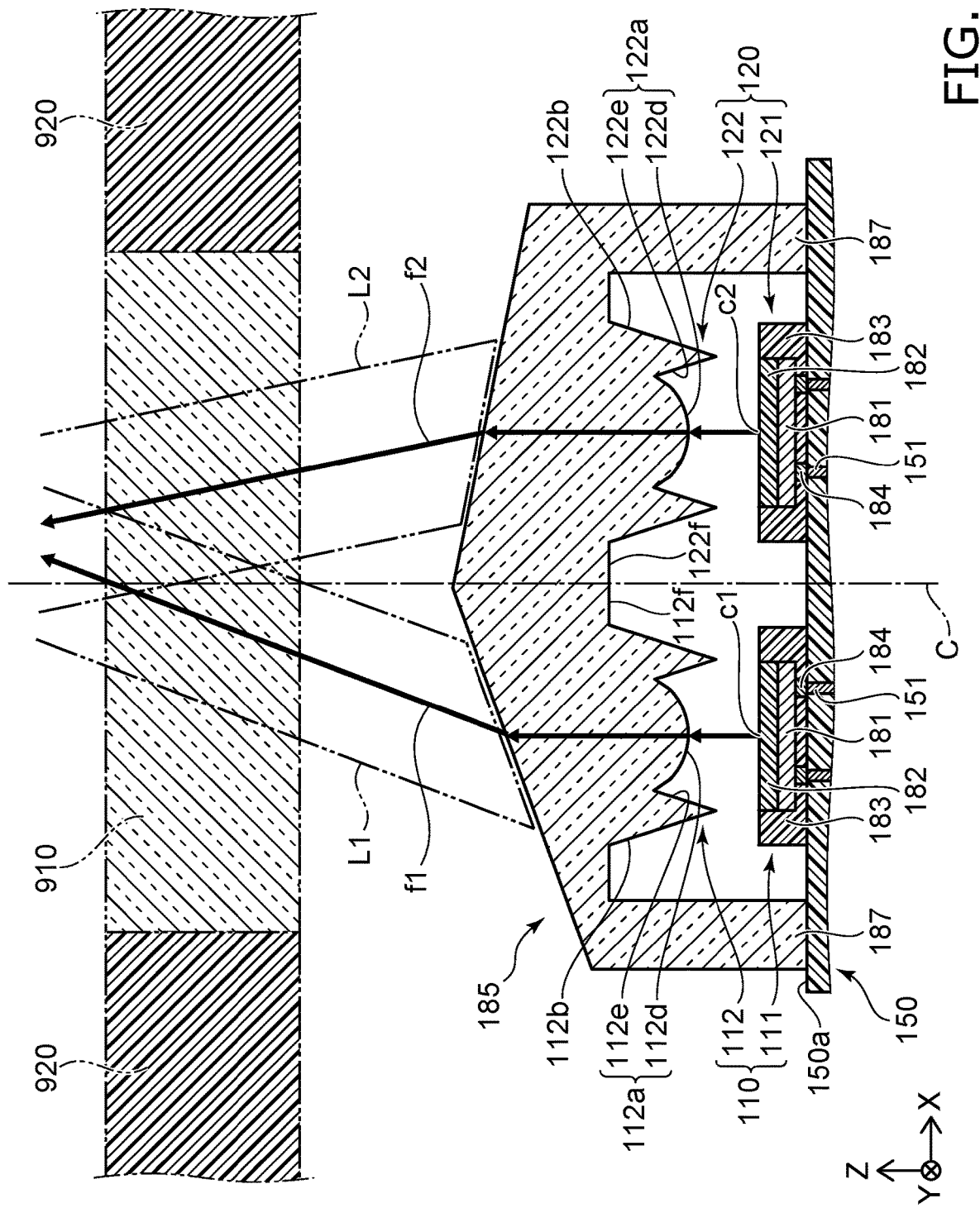
FIG. 8C is a cross-sectional view of the light-emitting module according to the first embodiment mounted in a smartphone.

FIG. 8C is a cross-sectional view of the light-emitting module according to the embodiment mounted in a smartphone.

In the light-emitting module 100 according to the embodiment, a transmissive cover member 910 may be located above (in the +Z direction) of the lenses 112, 122, 132, and 142. For example, when the light-emitting module according to the embodiment is mounted in a device such as a smartphone, etc., it is favorable for the transmissive cover member 910 to be located above (in the +Z direction) of the lenses 112, 122, 132, and 142 from the perspective of preventing the user of the device from contacting the rotating lenses 112, 122, 132, and 142. For example, such a cover member 910 is mounted to a housing 920 of a device such as a smartphone, etc. For example, the cover member 910 is made of a light-transmitting material such as glass, a polycarbonate resin, etc. For example, the housing 920 is made of a metal or a resin (e.g., a polycarbonate resin) that includes a light-diffusing material such as titanium oxide or the like or a light-absorbing material such as a black pigment or the like.

According to the embodiment, the light that is emitted from the lenses 112, 122, 132, and 142 travels in directions toward the rotation axis C. Therefore, the light that is emitted from the lenses 112, 122, 132, and 142 easily is incident on the cover member 910. Shielding of the light emitted from the lenses 112, 122, 132, and 142 by the housing 920, etc., can be suppressed thereby.

Effects of the embodiment will now be described.

The light-emitting module 100 according to the embodiment includes the first light source unit 110 that includes the first light source 111 and the first lens 112 on which the light emitted from the first light source 111 is incident, the driver 160 that is capable of rotating the first lens 112, and the controller 170 that controls the output of the first light source 111 conjunctively with the driver 160. The central axis f1 of the light L1 emitted from the first lens 112 is oblique to the rotation axis C of the first lens 112. Therefore, the light can be irradiated on a wide region by one light source unit 110. Furthermore, the controller 170 can modify the light distribution pattern by controlling the output of the first light source 111 conjunctively with the driver 160. Accordingly, a light-emitting module can be realized in which the light distribution pattern can be modified. Also, the light distribution pattern can be modified even when the number of light sources is low.

Also, the driver 160 is capable of rotating the first light source unit 110 around the rotation axis C. Thus, by rotating the first light source 111 together with the first lens 112, the light-emitting module 100 can have a simple structure.

Also, the light-emitting module 100 includes the second light source unit 120 that includes the second light source 121 and the second lens 122 on which the light emitted from the second light source 121 is incident, and the substrate 150 to which the first light source unit 110 and the second light source unit 120 are mounted. By rotating the substrate 150 around the rotation axis C, the driver 160 is capable of rotating the second light source unit 120 around the rotation axis C together with the first light source unit 110. The controller 170 controls the output of the second light source 121 conjunctively with the driver 160. Also, the central axis f2 of the light L2 emitted from the second lens 122 is oblique to the rotation axis C. The angle (the angle θ2b) between the rotation axis C (namely, the central axis g2) and the central axis f2 of the light L2 emitted from the second lens 122 is different from the angle (the angle θ1b) between the rotation axis C (namely, the central axis g1) and the central axis f1 of the light L1 emitted from the first lens 112. Therefore, various light distribution patterns can be realized by the two light source units 110 and 120.

Also, the first light source unit 110 and the second light source unit 120 are on a circumference centered on the rotation axis C on the substrate 150. Therefore, the light-emitting module 100 can be compact.

Also, the controller 170 controls the output of the first light source 111 according to the position of the circumferential trajectory of the central axis f1 of the light emitted from the first lens 112. Therefore, various light distribution patterns can be realized.

Also, the first lens 112 is a lens that includes a total reflection surface totally reflecting light. The first lens 112 includes the first surface 112a on which the light emitted from the first light source 111 is incident, the second surface 112b that is located at the periphery of the first surface 112a and reflects at least a portion of the light that enters the first lens 112 through the first surface 112a, and the third surface 112c that is positioned at the side opposite to the first surface 112a and emits the light that enters through the first surface 112a. The first lens 112 can project the light emitted from the first light source 111 by condensing or collimating.

Also, the direction H1 that is orthogonal to the third surface 112c of the first lens 112 is oblique to the Z-axis. In other words, the central axis f1 of the light L1 emitted from the first lens 112 can be oblique to the rotation axis C by using a simple configuration in which the third surface 112c of the first lens 112 is oblique to the rotation axis C.

An example is described in the first embodiment in which the angles between the rotation axis C and the central axes of the light emitted from the first lens 112, the second lens 122, the third lens 132, and the fourth lens 142 are different from each other. However, for example, the angle between the rotation axis C and the central axis f1 of the light emitted from the first lens 112 and the angle between the rotation axis C and the central axis f2 of the light emitted from the second lens 122 may be the same. In such a case, the first irradiation region h1 and the second irradiation region h2 overlap. Therefore, the light-emitting module 100 can emit a toned light by setting the light emitted from the first light source 111 to be white light and by setting the light emitted from the second light source 121 to be white light having a different color temperature from the light emitted from the first light source 111. Furthermore, in such a case, the angle between the rotation axis C and the central axis f3 of the light emitted from the third lens 132 may be different from the angle between the rotation axis C and the central axis f1 of the light emitted from the first lens 112 and the same as the angle between the rotation axis C and the central axis f4 of the light emitted from the fourth lens 142. In such a case, the third irradiation region h3 and the fourth irradiation region h4 overlap. Therefore, by setting the color of the light emitted from the third light source 131 to be the same as the color of the light emitted from the first light source 111 and by setting the color of the light emitted from the fourth light source 141 to be the same as the color of the light emitted from the second light source 121, various light distribution patterns can be realized while emitting toned light from the light-emitting module 100.

Second Embodiment

A second embodiment will now be described.

Figure 9:
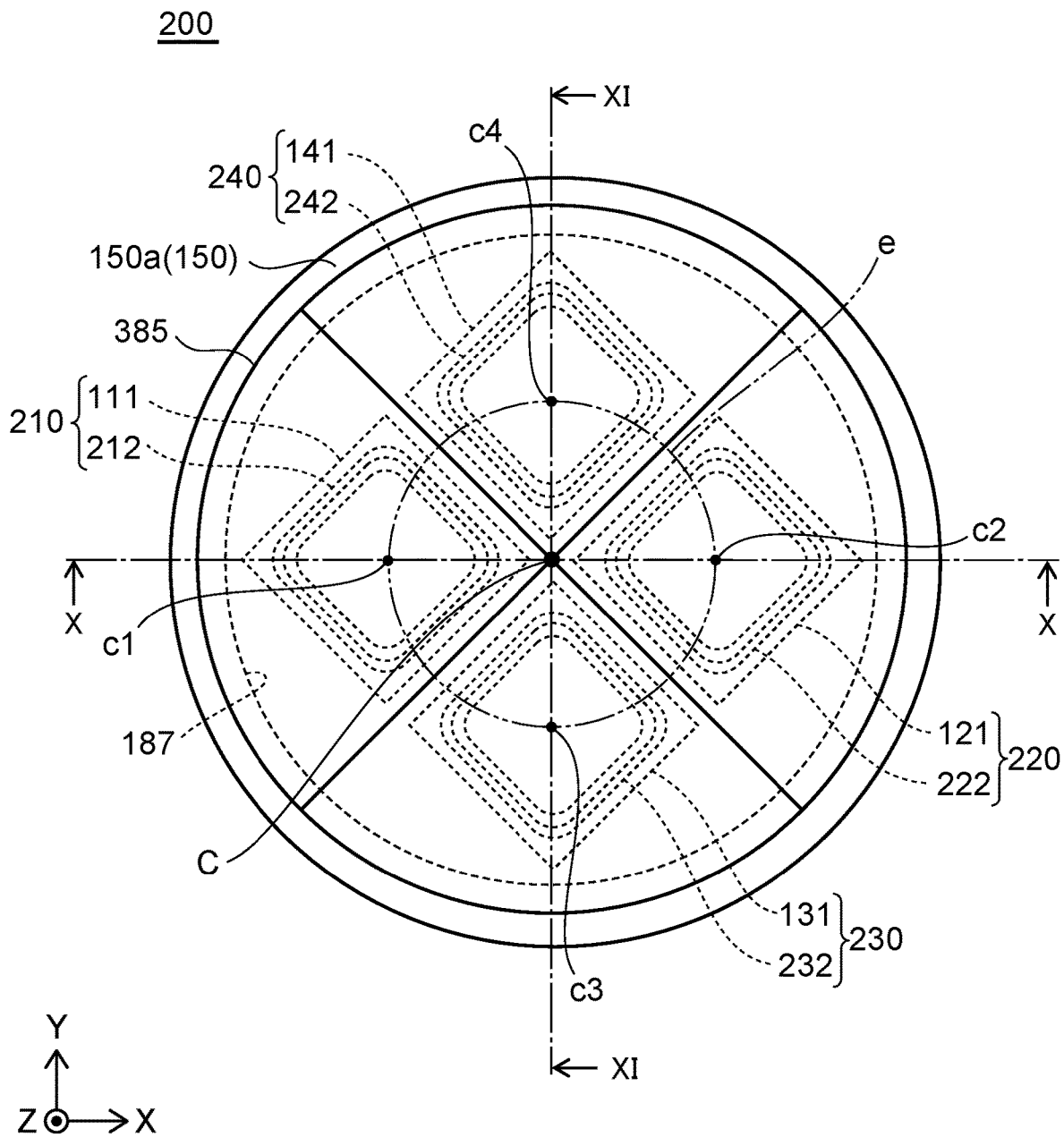
FIG. 9 is a top view showing a light-emitting module according to a second embodiment.

FIG. 9 is a top view showing a light-emitting module according to the embodiment.

Figure 10:
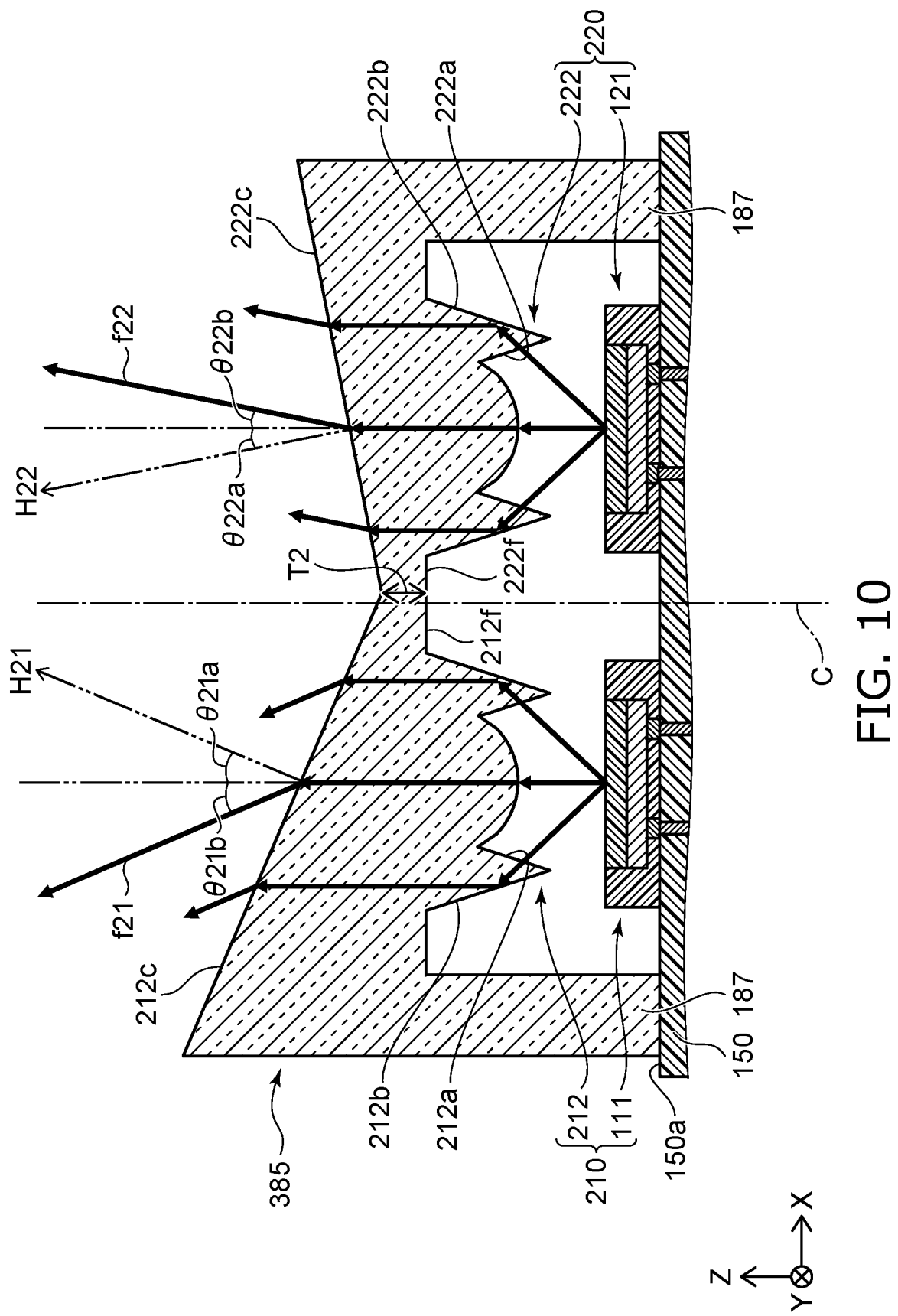
FIG. 10 is an enlarged cross-sectional view showing the first light source unit, the second light source unit, and a portion of the substrate at a cross section along line X-X of FIG. 9.

FIG. 10 is an enlarged cross-sectional view showing the first light source unit, the second light source unit, and a portion of the substrate at a cross section along line X-X of FIG. 9.

Figure 11:
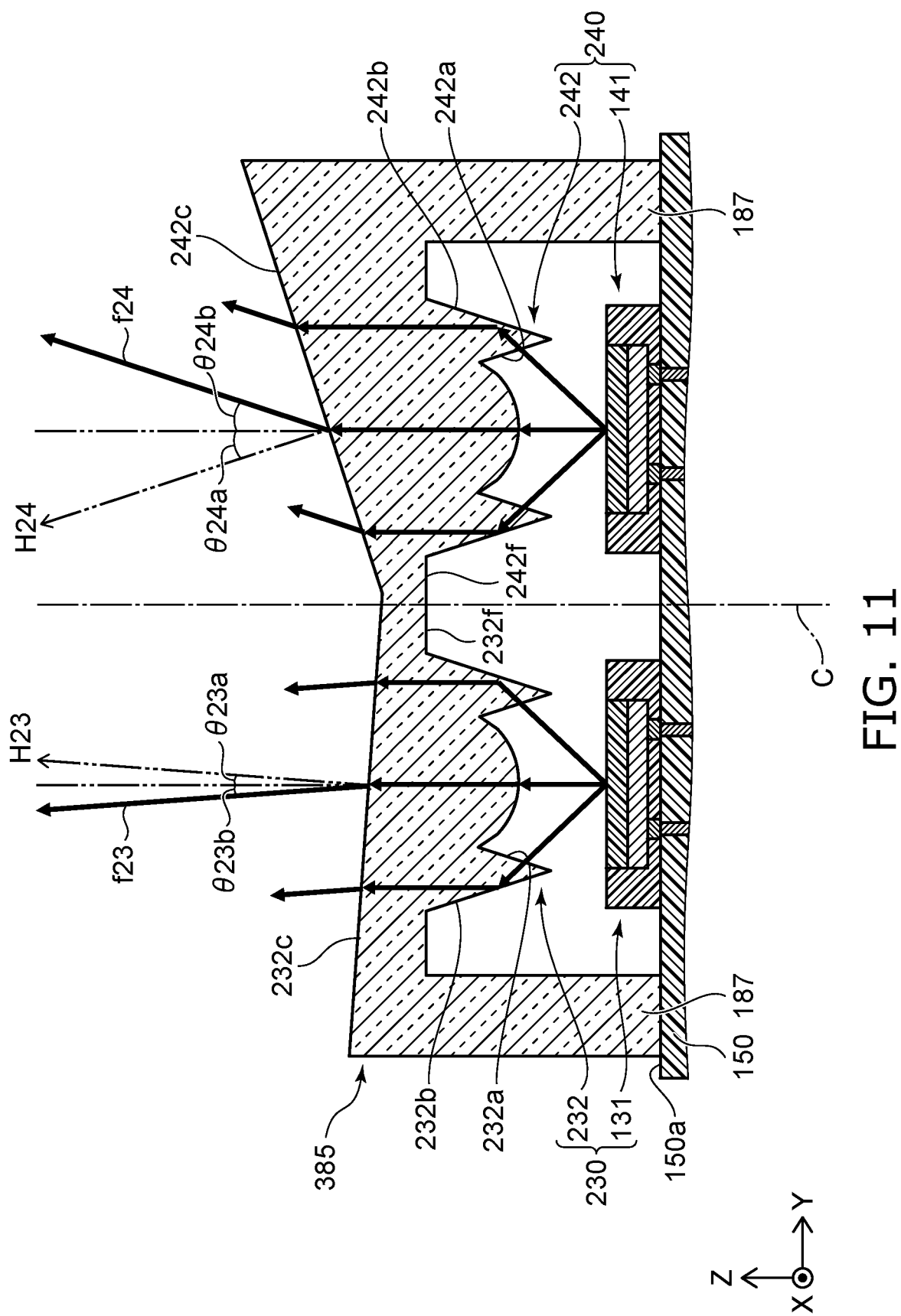
FIG. 11 is an enlarged cross-sectional view showing the third light source unit, the fourth light source unit, and a portion of the substrate at a cross section along line XI-XI of FIG. 9.

FIG. 11 is an enlarged cross-sectional view showing the third light source unit, the fourth light source unit, and a portion of the substrate at a cross section along line XI-XI of FIG. 9.

Configurations of a first lens 212, a second lens 222, a third lens 232, and a fourth lens 242 of the light-emitting module 200 according to the embodiment are different from those of the light-emitting module 100 according to the first embodiment.

As a general rule in the following description, the differences between the first embodiment are mainly described. Other than the items described below, the embodiment is similar to the first embodiment. This is similar for the embodiments and modifications below as well.

As shown in FIG. 9, the light-emitting module 200 includes a first light source unit 210, a second light source unit 220, a third light source unit 230, and a fourth light source unit 240. The first light source unit 210 includes the first light source 111, and the first lens 212 on which the light emitted from the first light source 111 is incident. The second light source unit 220 includes the second light source 121, and the second lens 222 on which the light emitted from the second light source 121 is incident. The third light source unit 230 includes the third light source 131, and the third lens 232 on which the light emitted from the third light source 131 is incident. The fourth light source unit 240 includes the fourth light source 141, and the fourth lens 242 on which the light emitted from the fourth light source 141 is incident.

According to the embodiment, the four lenses 212, 222, 232, and 242 are formed to have a continuous body as one light-transmitting member 385 by being linked at the surface emitting light.

As shown in FIG. 10, the first lens 212 is located in the +Z direction of the first light source 111. According to the embodiment, the first lens 212 is a lens that includes a total reflection surface totally reflecting light. Specifically, the first lens 212 includes a total reflection surface that totally reflects light inside the first lens 212. The surfaces of the first lens 212 include a first surface 212a, a second surface 212b, a third surface 212c, and a fourth surface 212f. Paths of the light are illustrated by solid-line arrows in FIG. 10.

The configuration of the first surface 212a is similar to the configuration of the first surface 112a of the first lens 112 according to the first embodiment; the configuration of the second surface 212b is similar to the configuration of the second surface 112b of the first lens 112 according to the first embodiment; the configuration of the fourth surface 212f is similar to the configuration of the fourth surface 112f of the first lens 112 according to the first embodiment, and descriptions thereof are therefore omitted.

The third surface 212c is positioned at the side opposite to the first surface 212a. The third surface 212c emits at least a portion of the light that enters the first lens 212 through the first surface 212a. The third surface 212c is a flat surface. The flat surface (the upper surface) of the third surface 212c is inclined to become distal to the substrate 150 away from the rotation axis C. Accordingly, a direction H21 perpendicular to the third surface 212c is tilted at an angle θ21a with respect to the rotation axis C to approach the rotation axis C toward the +Z direction. Therefore, the greater part of the light propagating through the first lens 212 is refracted in a direction tilted at an angle θ21b with respect to the rotation axis C to become distal to the rotation axis C toward the +Z direction when emitted from the third surface 212c. That is, the central axis f21 of the light emitted from the first lens 212 is tilted at the angle θ21b with respect to the rotation axis C to become distal to the rotation axis C toward the +Z direction.

The second lens 222 is located in the +Z direction of the second light source 121. According to the embodiment, the second lens 222 is a lens that includes a total reflection surface totally reflecting light. Specifically, the second lens 222 includes a total reflection surface that totally reflects light inside the second lens 222. The surfaces of the second lens 222 include a first surface 222a, a second surface 222b, a third surface 222c, and a fourth surface 222f.

The configuration of the first surface 222a is similar to the configuration of the first surface 122a of the second lens 122 according to the first embodiment; the configuration of the second surface 222b is similar to the configuration of the second surface 122b of the second lens 122 according to the first embodiment; the fourth surface 222f is similar to the configuration of the fourth surface 122f of the second lens 122 according to the first embodiment, and descriptions thereof are therefore omitted.

The third surface 222c is positioned at the side opposite to the first surface 222a. The third surface 222c emits at least a portion of the light that enters the second lens 222 through the first surface 222a. The third surface 222c is a flat surface. The flat surface (the upper surface) of the third surface 222c is inclined to become distal to the substrate 150 away from the rotation axis C. Accordingly, a direction H22 perpendicular to the third surface 222c is tilted at an angle θ22a with respect to the rotation axis C to approach the rotation axis C toward the +Z direction. Therefore, the greater part of the light propagating through the second lens 222 is refracted in a direction tilted at an angle θ22b with respect to the rotation axis C to become distal to the rotation axis C toward the +Z direction when emitted from the third surface 222c. That is, a central axis f22 of the light emitted from the second lens 222 is tilted at the angle θ22b with respect to the rotation axis C to become distal to the rotation axis C toward the +Z direction.

According to the embodiment, a recess that is concave toward the −Z direction is formed in the light-transmitting member 385 by the third surface 212c of the first lens 212 and the third surface 222c of the second lens 222.

As shown in FIG. 11, the third lens 232 is located in the +Z direction of the third light source 131. According to the embodiment, the third lens 232 is a lens that includes a total reflection surface totally reflecting light. Specifically, the third lens 232 includes a total reflection surface totally reflecting light inside the third lens 232. The surfaces of the third lens 232 include a first surface 232a, a second surface 232b, a third surface 232c, and a fourth surface 232f. Paths of the light are illustrated by solid-line arrows in FIG. 11.

The configuration of the first surface 232a is similar to the configuration of the first surface 132a of the third lens 132 according to the first embodiment; the configuration of the second surface 232b is similar to the configuration of the second surface 132b of the third lens 132 according to the first embodiment; the configuration of the fourth surface 232f is similar to the configuration of the fourth surface 132f of the third lens 132 according to the first embodiment, and descriptions thereof are therefore omitted.

The third surface 232c is positioned at the side opposite to the first surface 232a. The third surface 232c emits at least a portion of the light that enters the third lens 232 through the first surface 232a. The third surface 232c is a flat surface. The flat surface (the upper surface) of the third surface 232c is inclined to become distal to the substrate 150 away from the rotation axis C. Accordingly, a direction H23 perpendicular to the third surface 232c is tilted at an angle θ23a with respect to the rotation axis C to approach the rotation axis C toward the +Z direction. Therefore, the greater part of the light propagating through the third lens 232 is refracted in a direction tilted at an angle θ23b with respect to the rotation axis C to become distal to the rotation axis C toward the +Z direction when emitted from the third surface 232c. That is, a central axis f23 of the light emitted from the third lens 232 is tilted at the angle θ23b with respect to the rotation axis C to become distal to the rotation axis C toward the +Z direction.

The fourth lens 242 is located in the +Z direction of the fourth light source 141. According to the embodiment, the fourth lens 242 is a lens that includes a total reflection surface totally reflecting light. Specifically, the fourth lens 242 includes a total reflection surface totally reflecting light inside the fourth lens 242. The surfaces of the fourth lens 242 include a first surface 242a, a second surface 242b, a third surface 242c, and a fourth surface 242f.

The configuration of the first surface 242a is similar to the configuration of the first surface 142a of the fourth lens 142 according to the first embodiment; the configuration of the second surface 242b is similar to the configuration of the second surface 142b of the fourth lens 142 according to the first embodiment; the configuration of the fourth surface 242f is similar to the fourth surface 142f of the fourth lens 142 according to the first embodiment, and descriptions thereof are therefore omitted.

The third surface 242c is positioned at the side opposite to the first surface 242a. The third surface 242c emits at least a portion of the light that enters the fourth lens 242 through the first surface 242a. The third surface 242c is a flat surface. The flat surface (the upper surface) of the third surface 242c is inclined to become distal to the substrate 150 away from the rotation axis C. Accordingly, a direction H24 perpendicular to the third surface 242c is tilted at an angle θ24a with respect to the rotation axis C to approach the rotation axis C toward the +Z direction. Therefore, the greater part of the light propagating through the fourth lens 242 is refracted in a direction tilted at an angle θ24b with respect to the rotation axis C to become distal to the rotation axis C toward the +Z direction when emitted from the third surface 242c. That is, a central axis f24 of the light emitted from the fourth lens 242 is tilted at the angle θ24b with respect to the rotation axis C to become distal to the rotation axis C toward the +Z direction.

According to the embodiment, a recess that is concave toward the −Z direction is formed in the light-transmitting member 385 by the third surface 232c of the third lens 232 and the third surface 242c of the fourth lens 242.

According to the embodiment, the angle θ21a, the angle θ22a, the angle θ23a, and the angle θ24a are different from each other, i.e., angle θ23a<angle θ22a<angle θ24a<angle θ21a. Accordingly, angle θ23b<angle θ22b<angle θ24b<angle θ21b. The magnitude relationship of the angle θ21a, the angle θ22a, the angle θ23a, and the angle θ24a is not limited to that described above because the tilt angles with respect to the rotation axis C (or the Z-axis) of the third surface 212c of the first lens 212, the third surface 222c of the second lens 222, the third surface 232c of the third lens 232, and the third surface 242c of the fourth lens 242 can be adjusted as appropriate.

As described above, the third surfaces 212c, 222c, 232c, and 242c also may be tilted to become distal to the substrate 150 away from the rotation axis C.

In the light-emitting module 200 according to the embodiment, a recess that is concave toward the substrate 150 is formed by the third surface 212c of the first lens 212 and the third surface 222c of the second lens 222. Therefore, a thickness T2 of the portion of the light-transmitting member 385 between the first lens 212 and the second lens 222 can be thin compared to a thickness T1 of the portion of the light-transmitting member 185 between the first lens 112 and the second lens 122 according to the first embodiment (see FIG. 3A). The occurrence of stray light such as that entering the second lens 222 from the first lens 212 or stray light such as that entering the first lens 212 from the second lens 222 can be suppressed thereby. In other words, in the light-transmitting member 385, the occurrence of stray light entering the different lenses can be suppressed by the link portion of the first lens 212, the second lens 222, the third lens 232, and the fourth lens 242.

Third Embodiment

Figure 12:
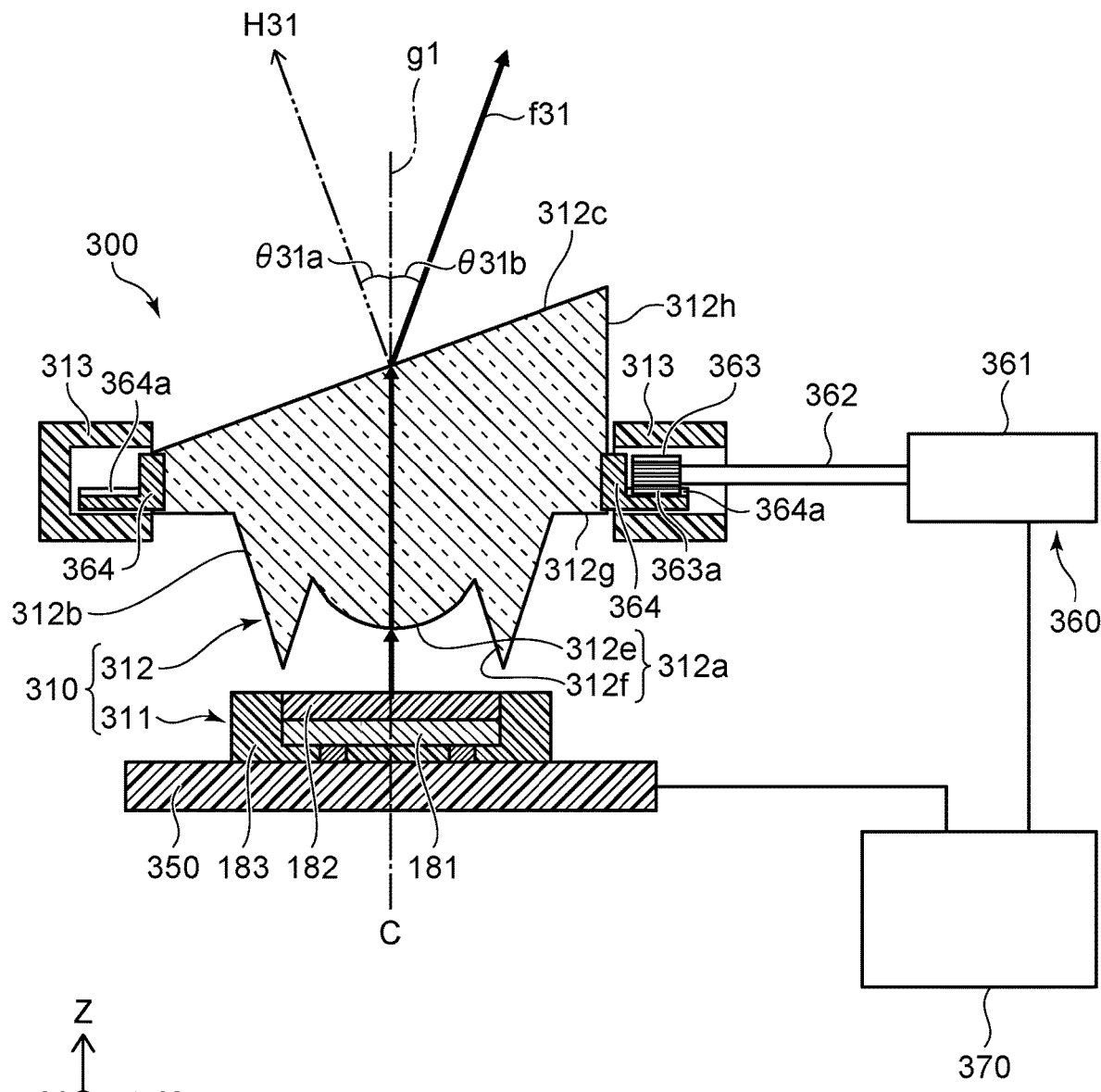
FIG. 12 is a partial cross-sectional view showing a light-emitting module according to a third embodiment.

FIG. 12 is a partial cross-sectional view showing a light-emitting module according to the embodiment.

The light-emitting module 300 according to the embodiment differs from the light-emitting module 100 according to the first embodiment in that one light source unit 310 is provided, and a lens 312 of the light source unit 310 rotates with respect to a light source 311.

The light-emitting module 300 includes a substrate 350, the light source unit 310, a driver 360, and a controller 370. The light source unit 310 includes the light source 311 and the lens 312.

According to the embodiment, the substrate 350 is a wiring substrate in which a plurality of wiring parts connected to the light source 311 are located in a base material made of an insulating material such as a resin material, etc. The light source 311 is mounted on the substrate 350. The upper surface and lower surface of the substrate 350 are orthogonal to the Z-axis.

The configuration of the light source 311 is similar to that of the first light source 111 according to the first embodiment, and a description is therefore omitted. The lens 312 is located in the +Z direction of the light source 311.

According to the embodiment, the lens 312 is a lens that includes a total reflection surface totally reflecting light. Specifically, the lens 312 includes a total reflection surface that totally reflects light inside the lens 312. The lens 312 is held by a holding part 313 to rotate around the rotation axis C. When, for example, the light-emitting module 300 is used as the light source of a flash of a smartphone, the substrate 350 and the holding part 313 are fixed to the housing of the smartphone, etc. However, the light-emitting module 300 may be used other than as a light source of a flash of a smartphone.

The surfaces of the lens 312 include a first surface 312a, a second surface 312b, a third surface 312c, a fourth surface 312g, and a fifth surface 312h. Paths of the light are illustrated by thick solid-line arrows in FIG. 12.

The first surface 312a faces the light source 311. The light that is emitted from the light source 311 is incident on the first surface 312a. The first surface 312a includes a first region 312e that is curved in a convex shape toward the light source 311, and a second region 312f that contacts the outer perimeter of the first region 312e and extends toward the light source 311.

The second surface 312b is located at the periphery of the first surface 312a. The second surface 312b is inclined to approach the rotation axis C toward the −Z direction. The second surface 312b reflects, toward the interior of the lens 312, at least a portion of the light that enters the lens 312 through the first surface 312a. The second surface 312b corresponds to a total reflection surface.

The third surface 312c is positioned at the side opposite to the first surface 312a. The third surface 312c emits at least a portion of the light that enters the lens 312 through the first surface 312a. The third surface 312c is a flat surface. In FIG. 12, the flat surface (the upper surface) of the third surface 312c is inclined away from the substrate 350 toward the +X direction. Therefore, a direction H31 perpendicular to the third surface 312c is tilted at an angle θ31a with respect to the rotation axis C to become distal to the rotation axis C toward the +Z direction. Accordingly, the greater part of the light propagating through the lens 312 is refracted in a direction tilted at an angle θ31b with respect to the rotation axis C when emitted from the third surface 312c. That is, a central axis f31 of the light emitted from the lens 312 is tilted at the angle θ31b with respect to the rotation axis C.

The fourth surface 312g is located at the periphery of the second surface 312b. The fourth surface 312g is parallel to the upper surface of the substrate 350.

The fifth surface 312h is a surface that is parallel to the Z-axis and positioned between the third surface 312c and the fourth surface 312g. The fifth surface 312h is tubular. In other words, the exterior shape of the lens 312 is circular in a top view.

The driver 360 is capable of rotating the lens 312 around the rotation axis C. According to the embodiment, the driver 360 includes a motor 361, a shaft 362 that moves with the motor 361, a first gear 363 that is linked to the shaft 362, and a second gear 364 that meshes with the first gear 363 and is tubular in a top view. The lens 312 is located at the inner side of the second gear 364, and the second gear 364 is mounted to the fifth surface 312h. A tooth 364a of the second gear 364 meshes with a tooth 363a of the first gear 363. The shaft 362 and the first gear 363 are rotated when the motor 361 is rotated. The second gear 364 that meshes with the first gear 363 is rotated by rotating the first gear 363. The lens 312 is rotated thereby.

The controller 370 includes, for example, a CPU, memory, etc. The controller 370 is electrically connected to the driver 360 and the wiring parts of the substrate 350. The controller 370 controls the output of the light source 311 conjunctively with the driver 360.

In the light-emitting module 300 according to the embodiment as described above, the driver 360 is capable of rotating the lens 312 (corresponding to the first lens) with respect to the light source 311 (corresponding to the first light source). That is, the central axis f31 of the light of the light source 311 (corresponding to the first light source) emitted from the lens 312 can be oblique to the rotation axis C by fixing the light source 311 and rotating the lens 312 itself around the rotation axis C. Thereby, the light-emitting module 300 can be realized in which the light distribution pattern is modifiable.

Also, the light distribution pattern can be modified even when the number of light sources is low.

Lens Modifications

In the configuration of the first to third embodiments, each lens is a lens that includes a total reflection surface totally reflecting light, and the central axis of the light emitted from each lens is oblique to the rotation axis so that the third surface, i.e., an emission surface of each lens, is oblique. However, lenses in which the central axis of the emitted light is oblique to the rotation axis are not limited thereto. Modifications of lenses will now be described. For easier understanding of the following description, examples are described in which the number of light source units in the light-emitting module of each modification is one, and the rotation axis passes through the center of the light source parallel to the Z-axis.

Figure 13:
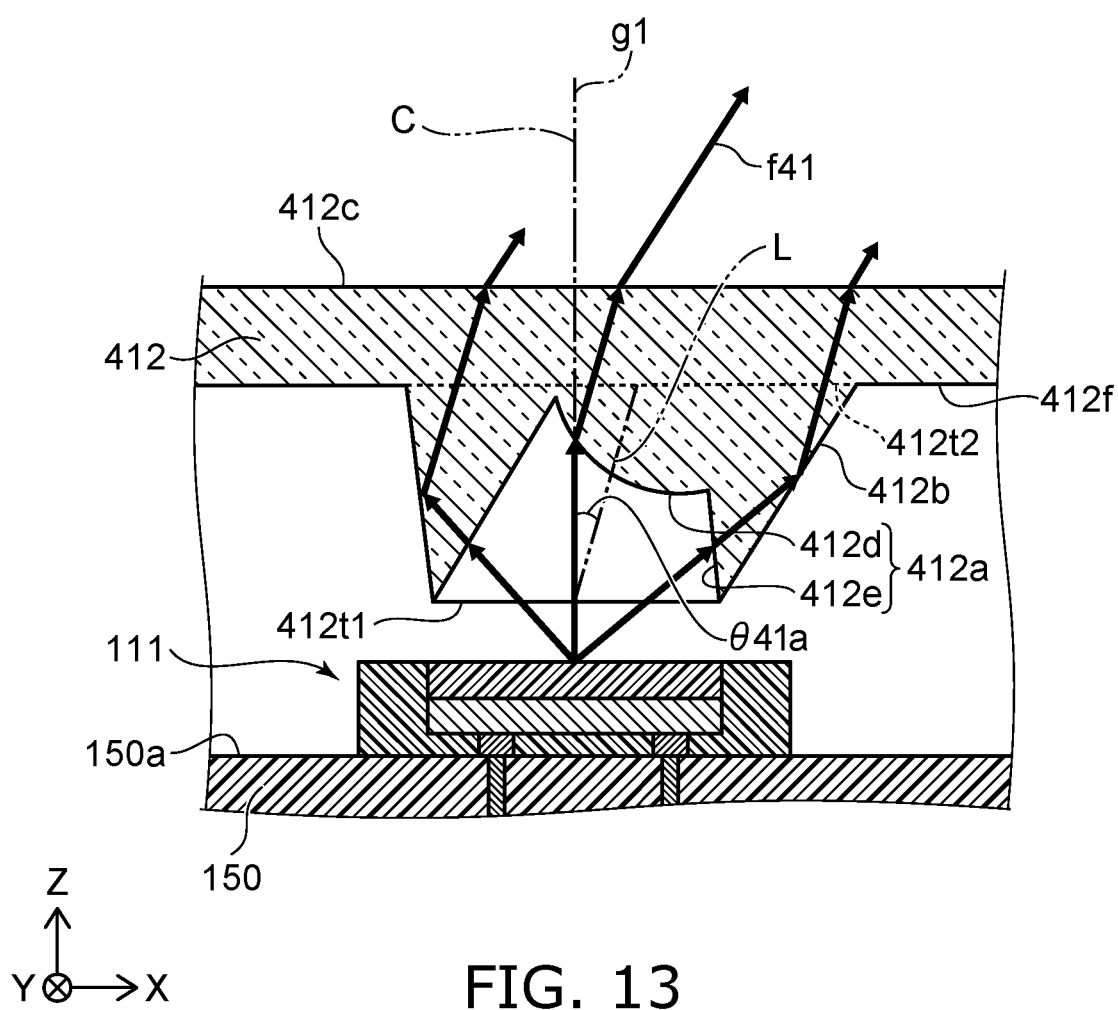
FIG. 13 is a cross-sectional view showing a first modification of the lens.

FIG. 13 is a cross-sectional view showing a first modification of the first lens.

Paths of the light are illustrated by solid-line arrows in FIG. 13.

According to the first modification, a first lens 412 is a lens that includes a total reflection surface totally reflecting light. Specifically, the first lens 412 includes a total reflection surface that totally reflects light inside the first lens 412. The surfaces of the first lens 412 include a first surface 412a, a second surface 412b, a third surface 412c, and a fourth surface 412f.

The first surface 412a faces a light source 111. The light that is emitted from the light source 111 is incident on the first surface 412a. The first surface 412a includes a first region 412d that is curved in a convex shape toward the light source 111, and a second region 412e that contacts the outer perimeter of the first region 412d and extends toward the light source 111.

The second surface 412b is located at the periphery of the first surface 412a. The second surface 412b is inclined to approach the central axis g1 toward the −Z direction. The second surface 412b reflects, toward the interior of the first lens 412, at least a portion of the light that enters the first lens 412 through the first surface 412a. The second surface 412b corresponds to a total reflection surface.

According to the embodiment, the central axis g1 is the rotation axis C. The second surface 412b includes a first perimeter edge 412t1 in the −Z direction (the direction from the first lens 412 toward the light source 111), and a second perimeter edge 412t2 positioned at the side opposite to the first perimeter edge 412t1. The first perimeter edge 412t1 is the ring-shaped lower end of the second surface 412b. The second perimeter edge 412t2 is the ring-shaped upper end of the second surface 412b and is the boundary between the second surface 412b and the fourth surface 412f. A line L that connects the center of the first perimeter edge 412t1 and the center of the second perimeter edge 412t2 is oblique to the rotation axis C.

The third surface 412c is positioned at the side opposite to the first surface 412a. The third surface 412c emits at least a portion of the light that enters the first lens 412 through the first surface 412a. The third surface 412c is parallel to the upper surface 150a of the substrate 150. The third surface 412c may be oblique to the rotation axis C.

The fourth surface 412f is located at the periphery of the second surface 412b. The fourth surface 412f is parallel to the upper surface 150a of the substrate 150.

In the first lens 412 of the first modification as described above, the line L that connects the center of the first perimeter edge 412t1 and the center of the second perimeter edge 412t2 is oblique to the rotation axis C. Therefore, the greater part of the light incident on the second surface 412b is totally reflected toward a direction tilted from the rotation axis C. That is, a central axis f41 of the light emitted from the first lens 412 is oblique to the rotation axis C.

The angle between the rotation axis C and the central axis f41 of the light emitted from the first lens 412 can be adjusted by adjusting an angle θ41a between the rotation axis C and the line L of the first lens 412.

Figure 14:
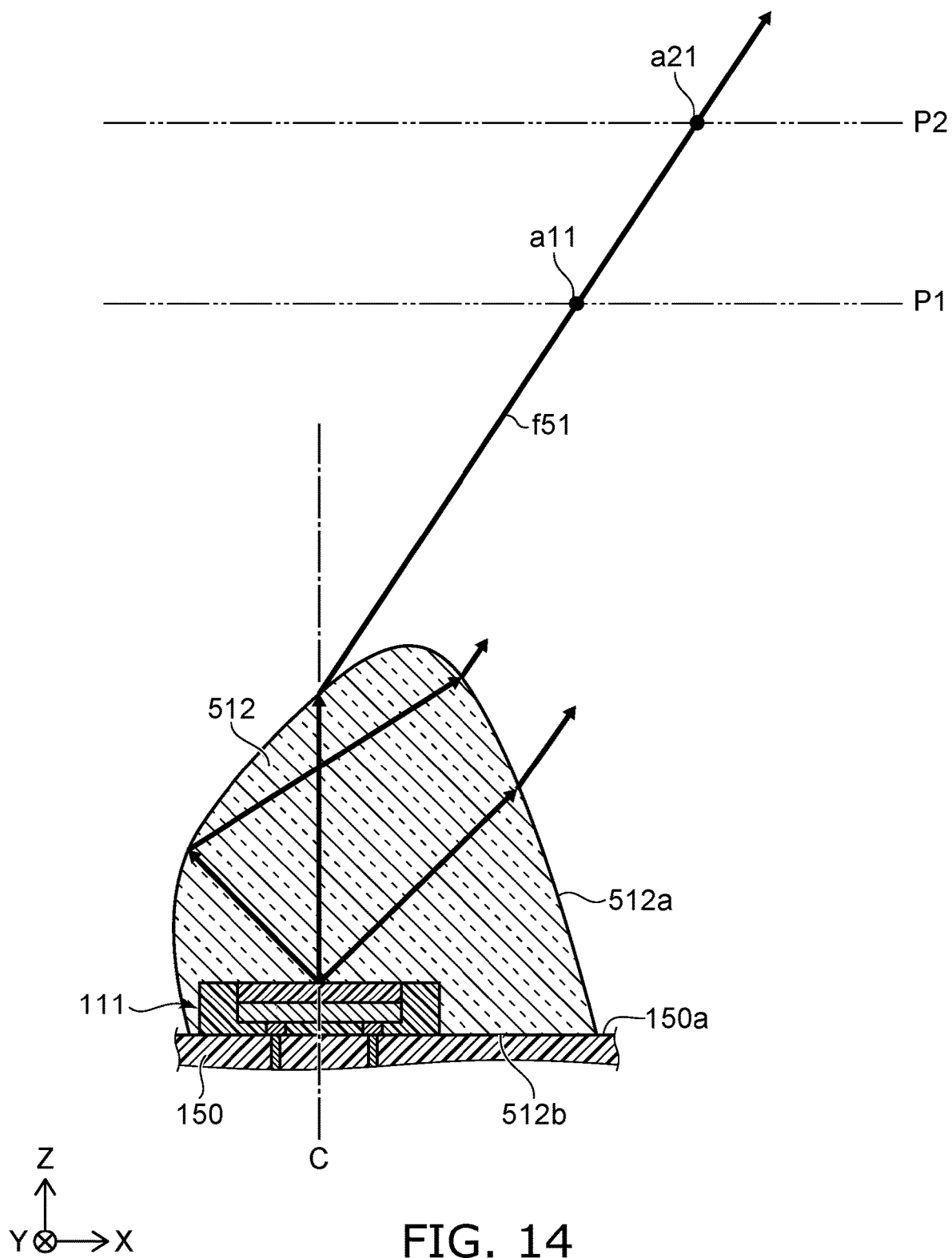
FIG. 14 is a cross-sectional view showing a second modification of the lens.

FIG. 14 is a cross-sectional view showing a second modification of the first lens.

Paths of the light are illustrated by solid-line arrows in FIG. 14.

A first lens 512 of the second modification is a convex lens. The first lens 512 seals the light source 111. The surfaces of the first lens 512 include an upper surface 512a and a lower surface 512b.

The upper surface 512a is a curved surface having a convex shape in a direction (the +Z direction) away from the substrate 150. The lower surface 512b contacts the upper surface 150a of the substrate 150. A central axis f51 of the light of the first lens 512 is oblique to the Z-axis. Herein, "the central axis of the light of the first lens 512" means a straight line passing through a position a11 at which the illuminance of the light emitted from the first lens 512 has a maximum in an arbitrary plane P1 orthogonal to the Z-axis and a position a21 at which the illuminance of the light has a maximum in another arbitrary plane P2 that is separated in the +Z direction from the plane P1 and orthogonal to the Z-axis. Namely, the central axis f51 of the light of the first lens 512 is the optical axis of the first lens 512.

As described above, the first lens 512 of the second modification is a convex lens, and the central axis f51 of the light emitted from the first lens 512 is oblique to the rotation axis C. In other words, the optical axis of the first lens 512 is oblique to the Z-axis.

Examples are described in the modifications above in which the number of light source units included in the light-emitting module is one, and the rotation axis passes through the center of the light source parallel to the Z-axis. However, similarly to the first embodiment, the number of light source units included in the light-emitting module may be two or more. In such a case, similarly to the first embodiment, for example, the plurality of light source units may be arranged on a circumference centered on the rotation axis.

Modifications of Method for Controlling Light Source Output

Modifications of method for controlling the light source output will now be described.

Figure 15A:
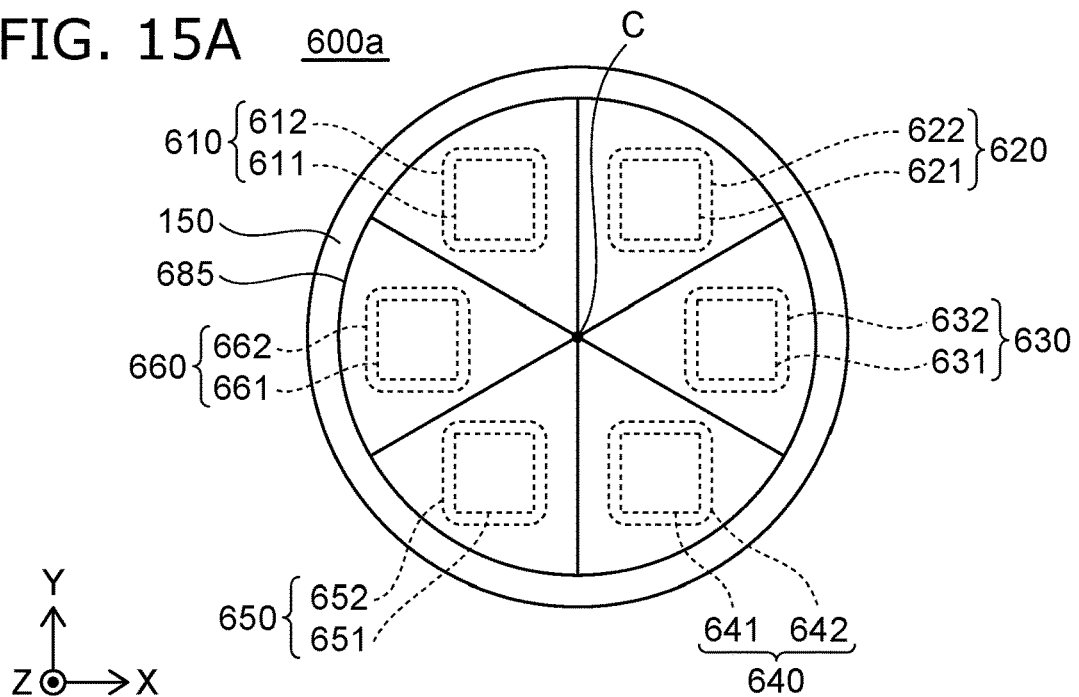
FIG. 15A is a schematic view for describing a modification of a method for controlling outputs of a plurality of light sources.
Figure 15B:
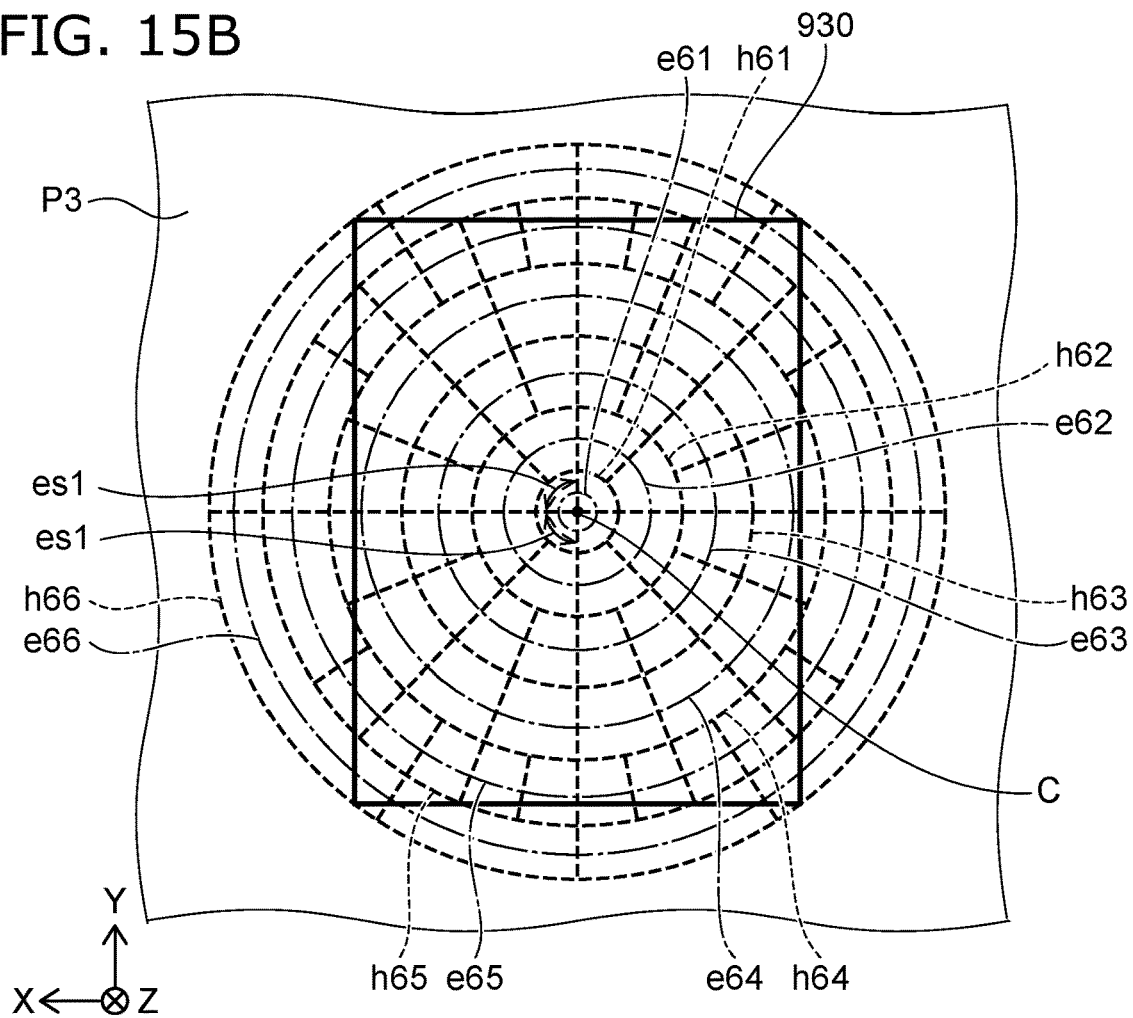
FIG. 15B is a schematic view for describing the modification of the method for controlling the output of the plurality of light sources.

FIGS. 15A and 15B are schematic views for describing a modification of the method for controlling outputs of a plurality of light sources.

Figure 16A:
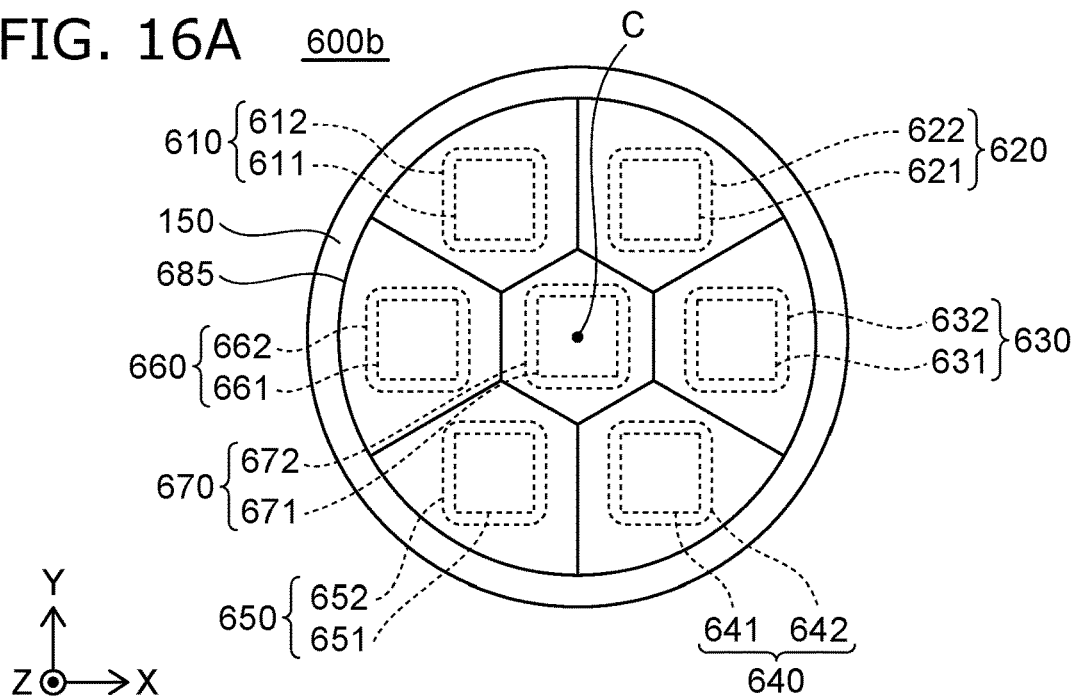
FIG. 16A is a schematic view for describing a modification of the method for controlling outputs of a plurality of light sources.
Figure 16B:
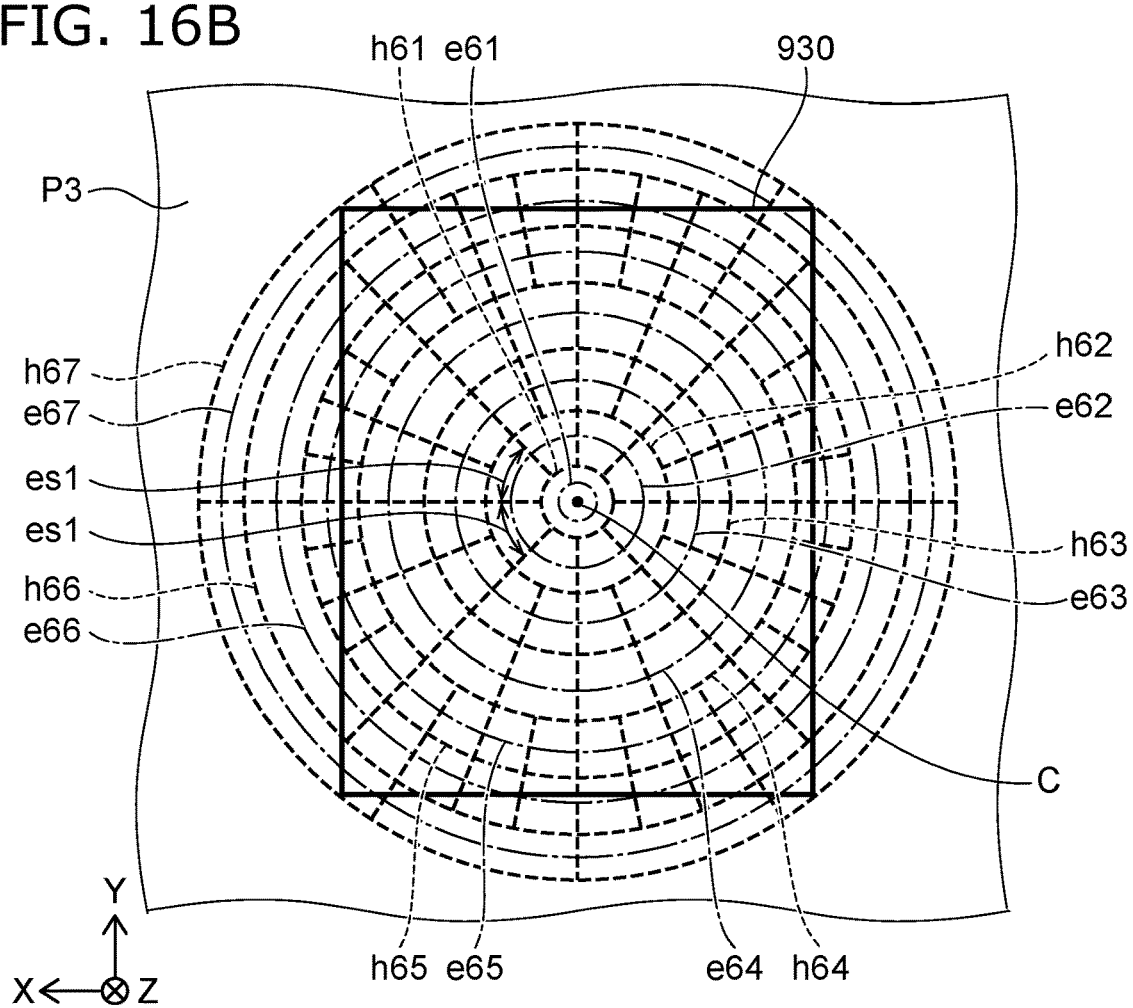
FIG. 16B is a schematic view for describing the modification of the method for controlling the output of the plurality of light sources.

FIGS. 16A and 16B are schematic views for describing a modification of the method for controlling outputs of a plurality of light sources.

The light-emitting module 600a shown in FIG. 15A includes a first light source unit 610, a second light source unit 620, a third light source unit 630, a fourth light source unit 640, a fifth light source unit 650, and a sixth light source unit 660.

The first light source unit 610 includes a first light source 611, and a first lens 612 on which the light emitted from the first light source 611 is incident. The second light source unit 620 includes a second light source 621, and a second lens 622 on which the light emitted from the second light source 621 is incident. The third light source unit 630 includes a third light source 631, and a third lens 632 on which the light emitted from the third light source 631 is incident. The fourth light source unit 640 includes a fourth light source 641, and a fourth lens 642 on which the light emitted from the fourth light source 641 is incident. The fifth light source unit 650 includes a fifth light source 651, and a fifth lens 652 on which the light emitted from the fifth light source 651 is incident. The sixth light source unit 660 includes a sixth light source 661, and a sixth lens 662 on which the light emitted from the sixth light source 661 is incident.

The first lens 612, the second lens 622, the third lens 632, the fourth lens 642, the fifth lens 652, and the sixth lens 662 are formed to have a continuous body as one light-transmitting member 685 by being linked at the surface emitting light. The light sources 611, 621, 631, 641, 651, and 661 and the light-transmitting member 685 are fixed to the substrate 150.

In the light-emitting module 600a, the angle between the rotation axis C and the central axis of the light emitted from the first lens 612 < the angle between the rotation axis C and the central axis of the light emitted from the second lens 622<the angle between the rotation axis C and the central axis of the light emitted from the third lens 632<the angle between the rotation axis C and the central axis of the light emitted from the fourth lens 642<the angle between the rotation axis C and the central axis of the light emitted from the fifth lens 652<the angle between the rotation axis C and the central axis of the light emitted from the sixth lens 662.

Accordingly, the light that is emitted from the first lens 612 is irradiated on a first irradiation region h61 in the plane P3 orthogonal to the rotation axis C as shown in FIG. 15B. The first irradiation region h61 is a circular region centered on the rotation axis C (restated, a region surrounded with the exterior shape of the first irradiation region h61). The central axis of the light emitted from the first lens 612 moves on a circumferential trajectory e61 inside the first irradiation region h61 when the substrate 150 is rotated.

The light that is emitted from the second lens 622 is irradiated on a second irradiation region h62 in the plane P3. The second irradiation region h62 is a circular-ring-shaped region that is centered on the rotation axis C and positioned outward of the first irradiation region h61 (restated, a region surrounded with the exterior shape of the second irradiation region h62 and the exterior shape of the first irradiation region h61). The central axis of the light emitted from the second lens 622 moves on a circumferential trajectory e62 inside the second irradiation region h62 when the substrate 150 is rotated.

The light that is emitted from the third lens 632 is irradiated on a third irradiation region h63 in the plane P3. The third irradiation region h63 is a circular-ring-shaped region that is centered on the rotation axis C and positioned outward of the second irradiation region h62 (restated, a region surrounded with the exterior shape of the third irradiation region h63 and the exterior shape of the second irradiation region h62). The central axis of the light emitted from the third lens 632 moves on a circumferential trajectory e63 inside the third irradiation region h63 when the substrate 150 is rotated.

The light that is emitted from the fourth lens 642 is irradiated on a fourth irradiation region h64 in the plane P3. The fourth irradiation region h64 is a circular-ring-shaped region that is centered on the rotation axis C and positioned outward of the third irradiation region h63 (restated, a region surrounded with the exterior shape of the fourth irradiation region h64 and the exterior shape of the third irradiation region h63). The central axis of the light emitted from the fourth lens 642 moves on a circumferential trajectory e64 inside the fourth irradiation region h64 when the substrate 150 is rotated.

The light that is emitted from the fifth lens 652 is irradiated on a fifth irradiation region h65 in the plane P3. The fifth irradiation region h65 is a circular-ring-shaped region that is centered on the rotation axis C and positioned outward of the fourth irradiation region h64 (restated, a region surrounded with the exterior shape of the fifth irradiation region h65 and the exterior shape of the fourth irradiation region h64). The central axis of the light emitted from the fifth lens 652 moves on a circumferential trajectory e65 inside the fifth irradiation region h65 when the substrate 150 is rotated.

The light that is emitted from the sixth lens 662 is irradiated on a sixth irradiation region h66 in the plane P3. The sixth irradiation region h66 is a circular-ring-shaped region that is centered on the rotation axis C and positioned outward of the fifth irradiation region h65 (restated, a region surrounded with the exterior shape of the sixth irradiation region h66 and the exterior shape of the fifth irradiation region h65). The central axis of the light emitted from the sixth lens 662 moves on a circumferential trajectory e66 inside the sixth irradiation region h66 when the substrate 150 is rotated.

An example in which the light-emitting module 600a is used in combination with a camera will now be described. The shape of an imaging region 930 of the camera is, for example, rectangular as shown in FIG. 15B.

The controller 170 controls the output of the first light source 611 so that the illuminance of the first irradiation region h61 is the desired illuminance. Thereby, for example, the illuminance of the first irradiation region h61 can be an illuminance corresponding to the distance to the imaging subject positioned inside the first irradiation region h61 when viewed along the Z-direction. At this time, the controller 170 may set the output of the first light source 611 to further include driving parameters of the light-emitting module 600a such as the rotational speed of the substrate 150 or the like and/or imaging parameters of the camera such as the shutter speed of the camera, etc.

The light that is emitted from the lenses 612, 622, 632, 642, 652, and 662 is divided into a plurality of subdivisions es1 on the trajectories e61, e62, e63, e64, e65, and e66 of the central axes of the light emitted from the lenses 612, 622, 632, 642, 652, and 662. In other words, the irradiation regions in the plane P3 are divided into the plurality of subdivisions es1. In FIG. 15B, the trajectories e61, e62, e63, e64, e65, and e66 are divided into the plurality of subdivisions es1 by a plurality of broken lines extending in the radial direction of a circle. The controller 170 controls the outputs of the light sources 611, 621, 631, 641, 651, and 661 in the plurality of subdivisions es1. The light that is emitted from the first lens 612 is not necessarily divided into a plurality of subdivisions on the trajectory e61 of the central axis of the light.

For example, the trajectory e61 is divided into four subdivisions es1; the trajectory e62 is divided into eight subdivisions es1; the trajectory e63 is divided into sixteen subdivisions es1; the trajectory e64 is divided into sixteen subdivisions es1; the trajectory e65 is divided into twenty-four subdivisions es1, and the trajectory e66 is divided into eight subdivisions es1. The plurality of subdivisions es1 are set to divide the regions of the trajectories e61, e62, e63, e64, e65, and e66 positioned inside the imaging region 930. Therefore, the trajectories e61, e62, e63, and e64 that are positioned entirely inside the imaging region 930 are set so that the lengths of the subdivisions es1 are substantially uniform. In contrast, the lengths of the subdivisions es1 are nonuniform for the trajectories e65 and e66 because portions of the trajectories e65 and e66 are positioned inside the imaging region 930 and the other portions are positioned outside the imaging region 930, and because the subdivisions es1 are set to divide the portions positioned inside the imaging region 930.

However, the number of the subdivisions es1 and the lengths of the subdivisions in each trajectory are not limited to those described above.

The controller 170 determines the setting values of the outputs of the light sources 611, 621, 631, 641, 651, and 661 for each subdivision es1. Then, as the subdivisions es1 on which the light emitted from the lenses 612, 622, 632, 642, 652, and 662 is irradiated are switched in response to the rotation of the substrate 150, the controller 170 switches the setting values corresponding to the subdivisions es1 after the outputs of the light sources 611, 621, 631, 641, 651, and 661 are switched. Thereby, for example, the first irradiation region h61 is divided into a plurality of subdivisions es1 arranged on the trajectory e61, and the illuminance of each subdivision es1 can be an illuminance corresponding to each distance to the imaging subject positioned inside each subdivision es1 when viewed along the Z-direction. This is similar for the other irradiation regions h62, h63, h64, h65, and h66 as well. At this time, the controller 170 may set the outputs of the subdivisions es1 of the light sources 611, 621, 631, 641, 651, and 661 to further include driving parameters of the light-emitting module 600a such as the rotational speed of the substrate 150 or the like and/or imaging parameters of the camera such as the shutter speed of the camera, etc.

Thus, in the light-emitting module 600a, the imaging region 930 can be divided into seventy-six regions having controllable illuminances by using seventy-six subdivisions es1.

A light-emitting module 600b shown in FIG. 16A differs from the light-emitting module 600a shown in FIG. 15A in that a seventh light source unit 670 is further included, and the light that is emitted from the first lens 612 is not divided into a plurality of subdivisions on the trajectory e61 of the central axis of the light as shown in FIG. 16B. The seventh light source unit 670 includes a seventh light source 671, and a seventh lens 672 on which the light emitted from the seventh light source 671 is incident. In the light-emitting module 600b, the angle between the rotation axis C and the central axis of the light emitted from the sixth lens 662<the angle between the rotation axis C and the central axis of the light emitted from the seventh lens 672. Accordingly, as shown in FIG. 16B, the light that is emitted from the seventh lens 672 is irradiated on a seventh irradiation region h67 in the plane P3. The seventh irradiation region h67 is a circular-ring-shaped region that is centered on the rotation axis C and positioned outward of the sixth irradiation region h66. The central axis of the light emitted from the seventh lens 672 moves on a circumferential trajectory e67 inside the seventh irradiation region h67 when the substrate 150 is rotated.

According to the modification, the angle between the rotation axis C and the central axis of the light emitted from the seventh light source unit 670 most proximate to the rotation axis C is greater than the angle between the rotation axis C and the central axes of the light emitted from the light source units 610, 620, 630, 640, 650, and 660 that are more distant to the rotation axis C than the seventh light source unit 670. However, the angle between the rotation axis C and the central axis of the emitted light may decrease for light source units more proximate to the rotation axis C. By reducing the angle between the rotation axis C and the central axis of the emitted light for light source units more proximate to the rotation axis C, shielding of the light emitted from the lenses by a housing, etc., can be suppressed when, for example, the light-emitting module is used as the light source of a flash of a smartphone.

In the light-emitting module 600b, the controller 170 controls the output of the first light source 611 so that the illuminance of the first irradiation region h61 is the desired illuminance. Thereby, for example, the illuminance of the first irradiation region h61 can be an illuminance corresponding to the distance to the imaging subject positioned inside the first irradiation region h61 when viewed along the Z-direction. At this time, the controller 170 may set the output of the first light source 611 to further include driving parameters of the light-emitting module 600b such as the rotational speed of the substrate 150 or the like and/or imaging parameters of the camera such as the shutter speed of the camera, etc.

Also, in the light-emitting module 600b, other than the first lens 612, the light that is emitted from the lenses 622, 632, 642, 652, 662, and 672 is divided into a plurality of subdivisions es1 on the trajectories e62, e63, e64, e65, e66, and e67. The controller 170 controls the output of the first light source 611 and the outputs of the light sources 621, 631, 641, 651, 661, and 671 in the plurality of subdivisions es1. Specifically, for example, the trajectory e62 is divided into eight subdivisions es1; the trajectory e63 is divided into sixteen subdivisions es1; the trajectory e64 is divided into sixteen subdivisions es1; the trajectory e65 is divided into thirty-two subdivisions es1; the trajectory e66 is divided into twenty subdivisions es1, and the trajectory e67 is divided into eight subdivisions es1. However, the number and lengths of the subdivisions es1 included in each trajectory are not limited to those described above.

Thus, in the light-emitting module 600b, the imaging region 930 can be divided into one hundred and one regions having controllable illuminances by using the first irradiation regions h61 and one hundred subdivisions es1.

According to the modification shown in FIG. 15A, the light that is emitted from the lenses 612, 622, 632, 642, 652, and 662 is divided into a plurality of subdivisions es1 on the trajectories e61, e62, e63, e64, e65, and e66 of the central axes of the light emitted from the lenses 612, 622, 632, 642, 652, and 662. The controller 170 controls the outputs of the light sources 611, 621, 631, 641, 651, and 661 in the plurality of subdivisions es1. Therefore, the light-emitting module 600a can divide the irradiation regions into a plurality of regions and can individually control the illuminances of the plurality of regions. As shown in FIG. 16A, the light that is emitted from the first lens 612 is not necessarily divided into a plurality of subdivisions on the trajectory e61 of the central axis of the light.

Fourth Embodiment

Figure 17:
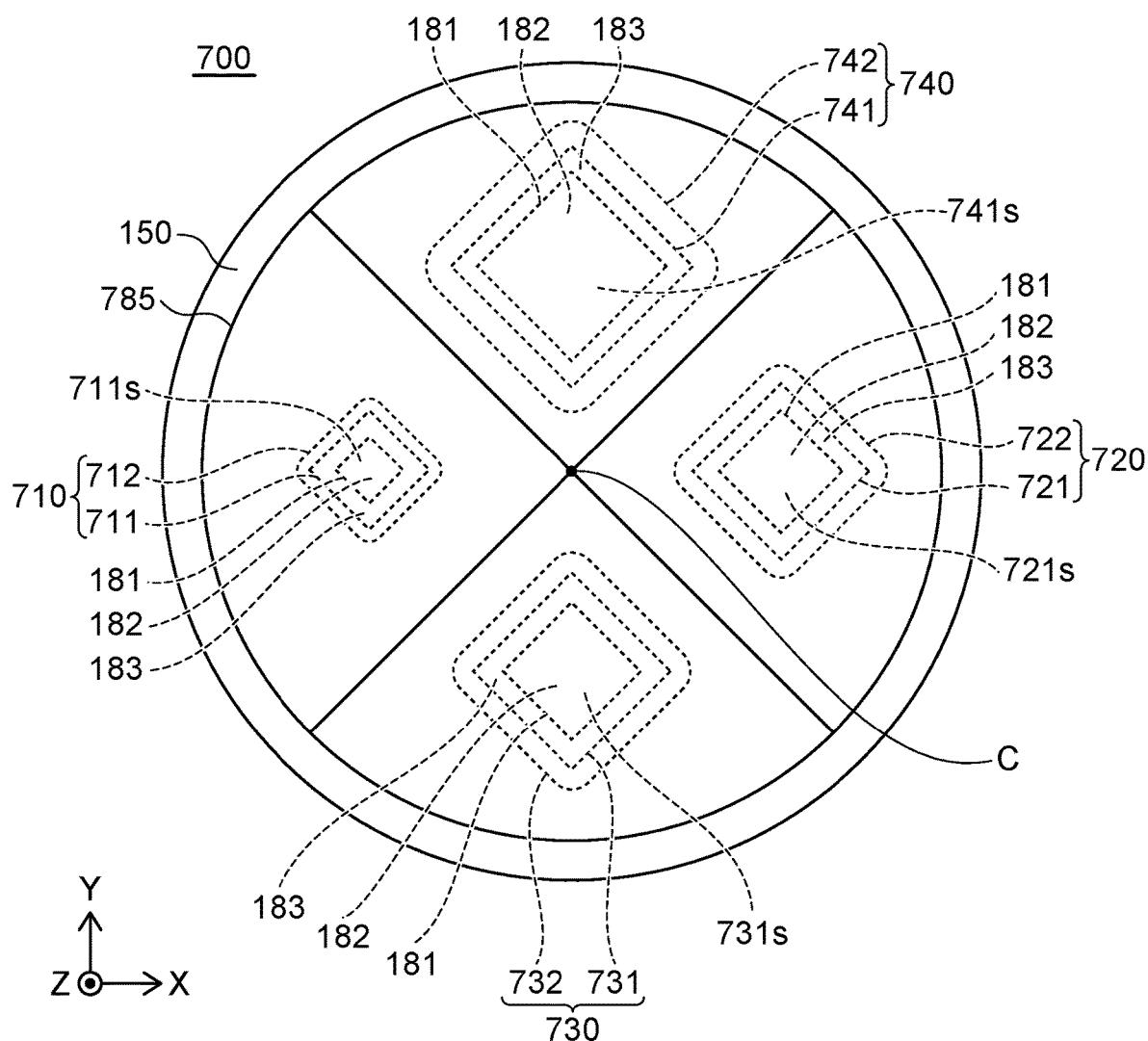
FIG. 17 is a top view showing a light-emitting module according to a fourth embodiment.

A fourth embodiment will now be described.
FIG. 17 is a top view showing a light-emitting module according to the embodiment.

The light-emitting module 700 according to the embodiment differs from the light-emitting module 100 according to the first embodiment in that the surface areas of light-emitting surfaces 711s, 721s, 731s, and 741s of a plurality of light sources 711, 721, 731, and 741 are different from each other, etc.

A first light source unit 710 includes the first light source 711, and a first lens 712 on which the light emitted from the first light source 711 is incident. A second light source unit 720 includes the second light source 721, and a second lens 722 on which the light emitted from the second light source 721 is incident. A third light source unit 730 includes the third light source 731, and a third lens 732 on which the light emitted from the third light source 731 is incident. A fourth light source unit 740 includes the fourth light source 741, and a fourth lens 742 on which the light emitted from the fourth light source 741 is incident.

The first lens 712, the second lens 722, the third lens 732, and the fourth lens 742 are formed to have a continuous body as one light-transmitting member 785 by being linked at the surface emitting light. The light sources 711, 721, 731, and 741 and the light-transmitting member 785 are fixed to the substrate 150.

Similarly to the first embodiment, each of the light sources 711, 721, 731, and 741 includes the light-emitting element 181, the wavelength conversion member 182, and the light-reflective member 183.

In the light-emitting module 700, the angle between the rotation axis C and the central axis of the light emitted from the first lens 712<the angle between the rotation axis C and the central axis of the light emitted from the second lens 722<the angle between the rotation axis C and the central axis of the light emitted from the third lens 732<the angle between the rotation axis C and the central axis of the light emitted from the fourth lens 742.

When the substrate 150 is rotated, the peripheral velocity when the light emitted from the lens moves along the trajectory in the irradiation region increases as the angle between the rotation axis C and the central axis of the light emitted from the lens increases. The light intensity that is irradiated on the irradiation region per unit time decreases as the peripheral velocity increases; therefore, the irradiation region easily becomes dark. In contrast, according to the embodiment, the surface area of the light-emitting surface 711$s$ of the first light source 711<the surface area of the light-emitting surface 721$s$ of the second light source 721<the surface area of the light-emitting surface 731$s$ of the third light source 731<the light-emitting surface 741$s$ of the fourth light source 741. Therefore, the luminous intensity of the light that is emitted can be higher for light source units having greater angles between the rotation axis C and the central axis of the light emitted from the lens. Therefore, the occurrence of an illuminance difference between the irradiation regions of the plurality of light source units 710, 720, 730, and 740 caused by the peripheral velocity difference can be suppressed.

Also, according to the embodiment, in a top view, the surface area of the second lens 722 is greater than the surface area of the first lens 712, the surface area of the third lens 732 is greater than the surface area of the second lens 722, and the surface area of the fourth lens 742 is greater than the surface area of the third lens 732. However, the magnitude relationship of the surface areas of the first lens 712, the second lens 722, the third lens 732, and the fourth lens 742 is not limited to that described above as long as the luminous intensity of the light that is emitted is higher for light source units having greater angles between the rotation axis C and the central axis of the light emitted from the lens.

In the light-emitting module 700 according to the embodiment, the angle between the rotation axis C and the central axis of the light emitted from the second lens 722 is greater than the angle between the rotation axis C and the central axis of the light emitted from the first lens 712. The surface area of the light-emitting surface 721$s$ of the second light source 721 is greater than the surface area of the light-emitting surface 711$s$ of the first light source 711. Therefore, the occurrence of an illuminance difference between the irradiation regions of the first and second light source units 710 and 720 caused by the peripheral velocity difference can be suppressed. This is similar for the third and fourth light source units 730 and 740 as well.

Fifth Embodiment

A fifth embodiment will now be described.

Figure 18:
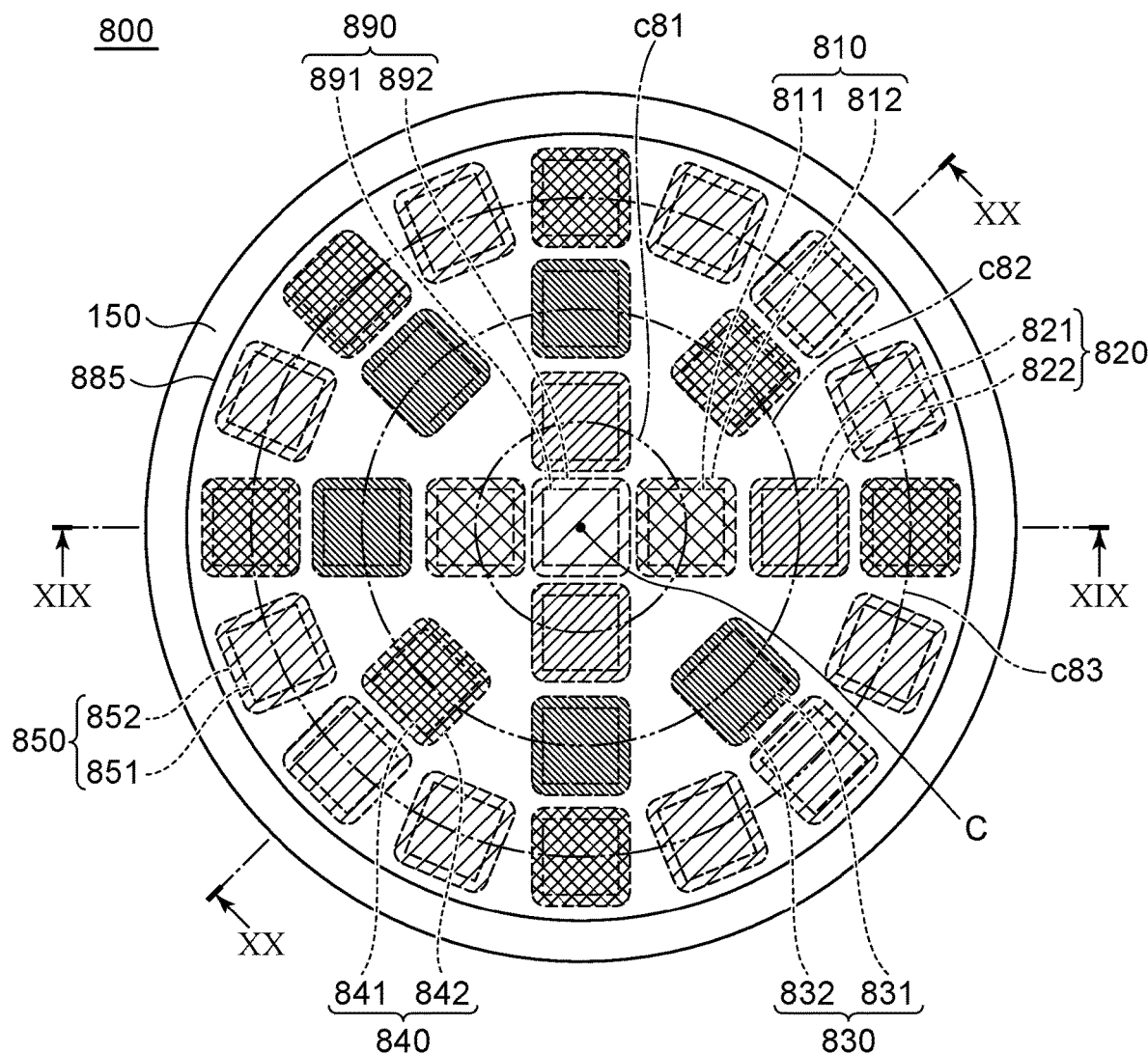
FIG. 18 is a top view showing a light-emitting module according to a fifth embodiment.

FIG. 18 is a top view showing a light-emitting module according to the embodiment.

Figure 19:
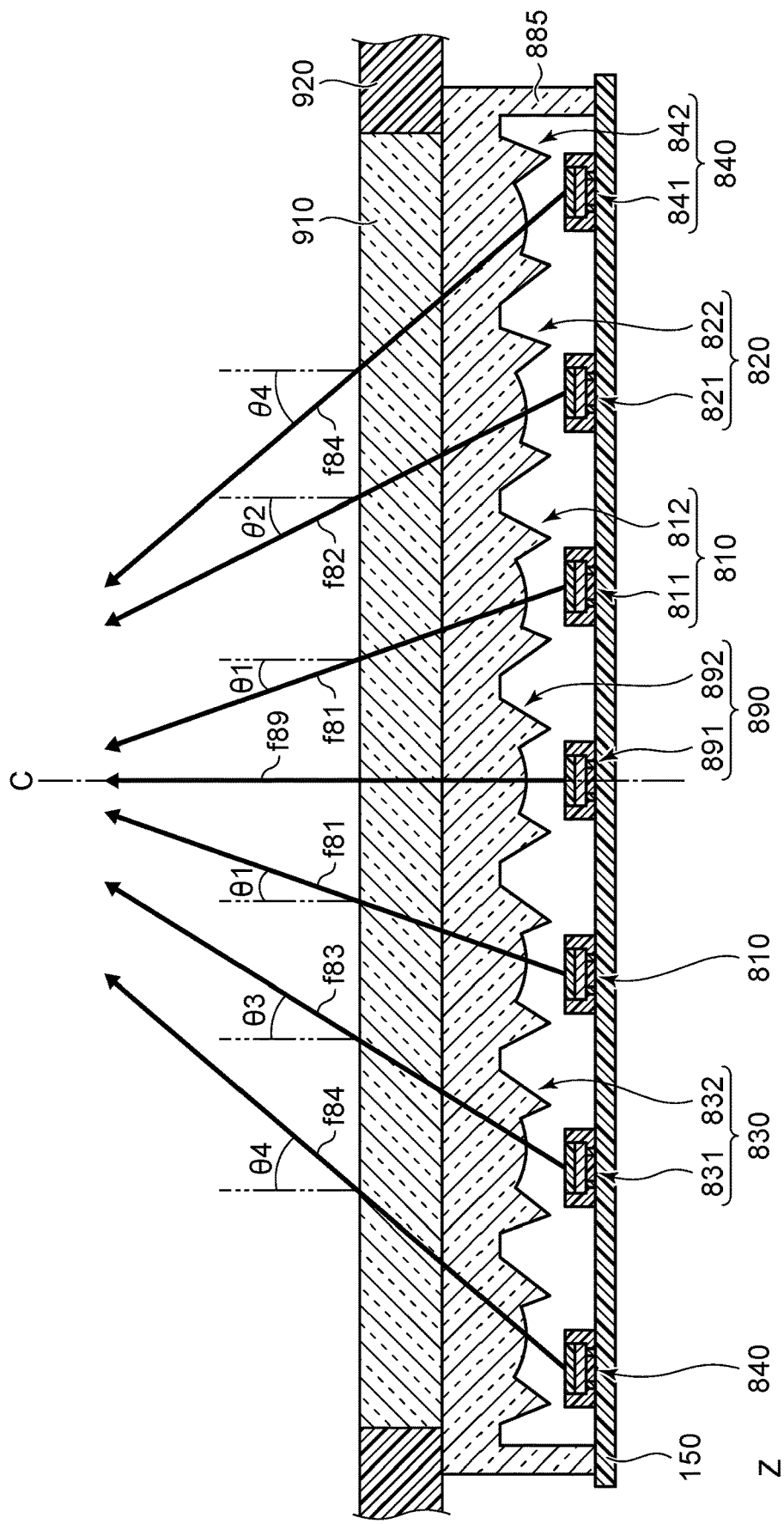
FIG. 19 is an enlarged cross-sectional view showing a plurality of light source units and a substrate at a cross section along line XIX-XIX of FIG. 18.

FIG. 19 is an enlarged cross-sectional view showing a plurality of light source units and a substrate at a cross section along line XIX-XIX of FIG. 18.

Figure 20:
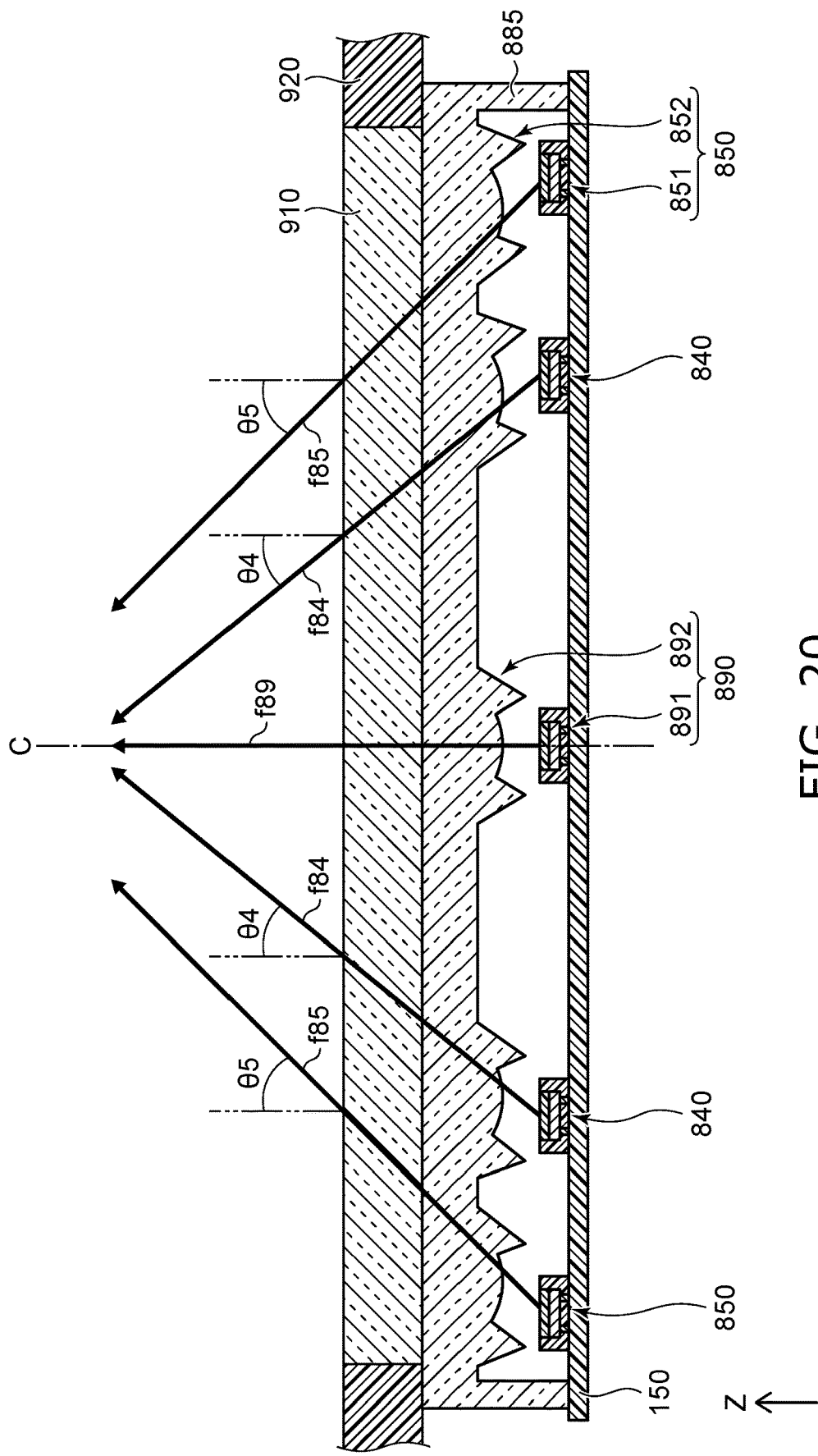
FIG. 20 is an enlarged cross-sectional view showing the plurality of light source units and the substrate at a cross section along line XX-XX of FIG. 18.

FIG. 20 is an enlarged cross-sectional view showing the plurality of light source units and the substrate at a cross section along line XX-XX of FIG. 18.

Figure 21A:
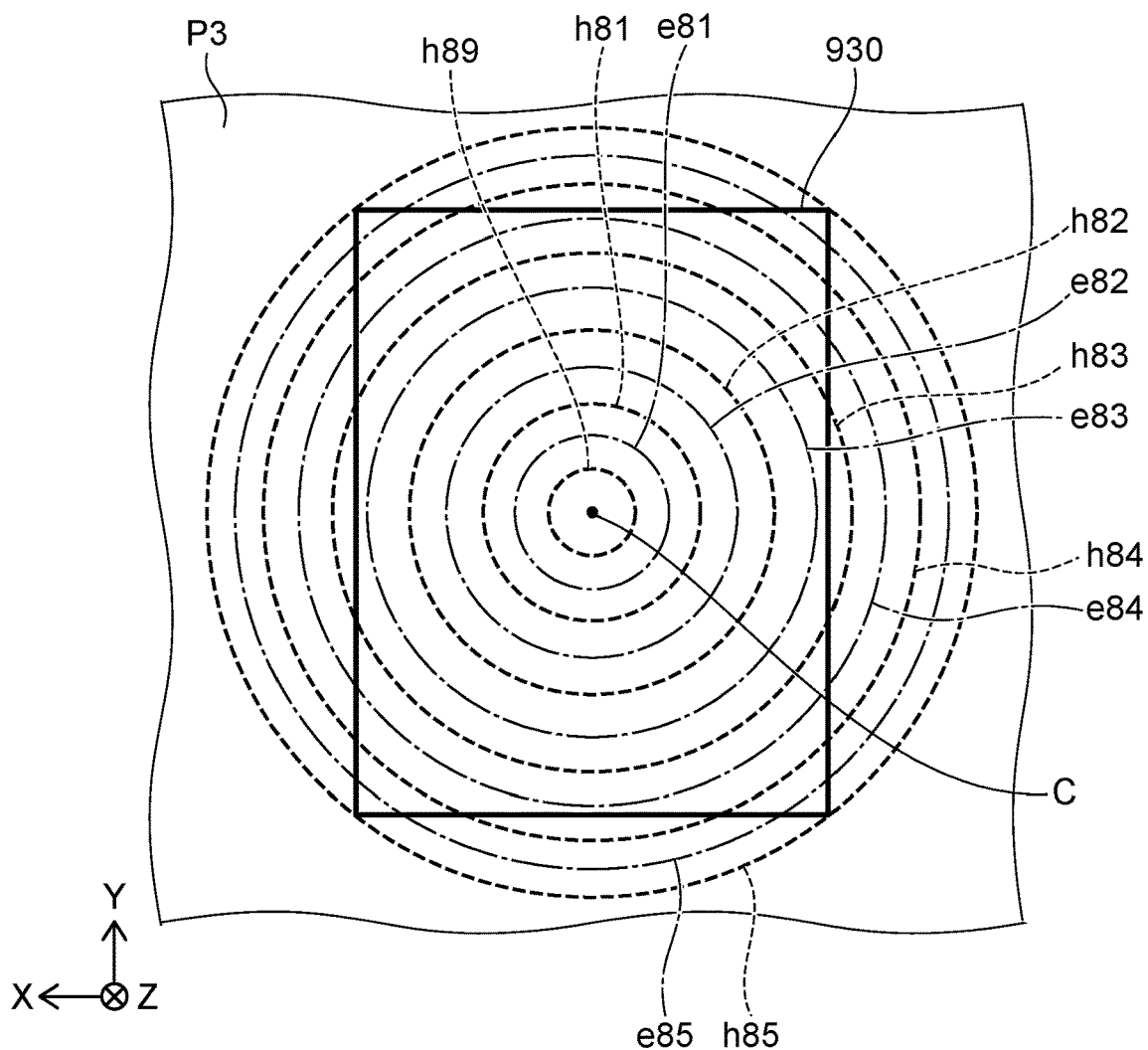
FIG. 21A is a drawing showing irradiation regions of the light emitted from the light source units at a plane orthogonal to the axis direction.

FIG. 21A is a drawing showing irradiation regions of the light emitted from the light source units at a plane orthogonal to the axis direction.

Figure 21B:
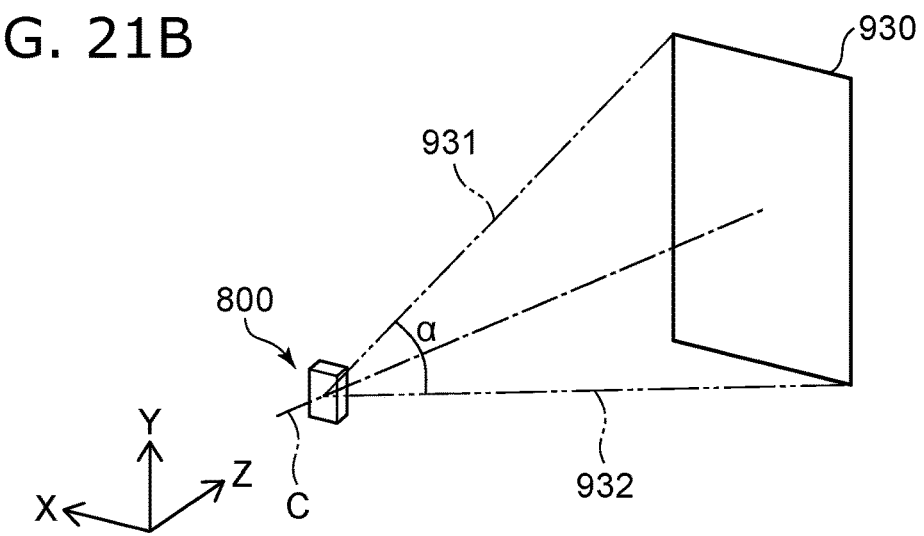
FIG. 21B is a schematic view for describing a method for setting the angle between the rotation axis and the central axes of the light emitted from the light source units.

FIG. 21B is a schematic view for describing a method for setting the angle between the rotation axis and the central axes of the light emitted from the light source units.

The light-emitting module 800 according to the embodiment includes the substrate 150, a plurality of light source units, the driver 160 that is capable of rotating the plurality of light source units, and the controller 170 that is capable of controlling the outputs of the plurality of light sources. The plurality of light source units include the plurality of light sources located at the substrate 150, and the plurality of lenses that are located respectively as pairs with the plurality of light sources and on which the light emitted from the plurality of light sources is incident. The driver 160 rotates the plurality of light source units in a state in which the substrate 150 and the plurality of light source units are fixed. The controller 170 controls the outputs of the plurality of light sources conjunctively with the driver 160.

The plurality of light source units include one central light source unit 890, two first light source units 810, three second light source units 820, five third light source units 830, seven fourth light source units 840, and eleven fifth light source units 850. For easier understanding of the description in FIG. 18, the same unit is shown by the same hatching.

The central light source unit 890 includes a central light source 891, and a central lens 892 on which the light emitted from the central light source 891 is incident. For example, the central light source 891 is located on the rotation axis C. As shown in FIG. 19, a central axis f89 of the light emitted from the central lens 892 substantially matches the rotation axis C. In other words, the angle between the rotation axis C and the central axis f89 of the light emitted from the central lens 892 is about 0 degrees.

Each first light source unit 810 includes a first light source 811, and a first lens 812 on which the light emitted from the first light source 811 is incident. As shown in FIG. 18, for example, the two first light sources 811 are located on a first circumference c81 centered on the rotation axis C. As shown in FIG. 19, a central axis f81 of the light emitted from each first lens 812 is oblique to the rotation axis C. The first lenses 812 are arranged so that the angles (angles θ1) between the rotation axis C and the central axes f81 of the light emitted from the two first lens 812 have substantially the same value.

Each second light source unit 820 includes a second light source 821, and a second lens 822 on which the light emitted from the second light source 821 is incident. As shown in FIG. 18, for example, two of the three second light sources 821 are located on the first circumference c81. For example, the remaining one of the three second light sources 821 is located on a second circumference c82 that is centered on the rotation axis C and has a larger diameter than the first circumference c81. As shown in FIG. 19, a central axis f82 of the light emitted from each second lens 822 is oblique to the rotation axis C. The second lenses 822 are located so that the angles (angles θ2) between the rotation axis C and the central axes f82 of the light emitted from the three second lens 822 have substantially the same value, and the angles θ2 are greater than the angles θ1.

Each third light source unit 830 includes a third light source 831, and a third lens 832 on which the light emitted from the third light source 831 is incident. As shown in FIG. 18, for example, five third light sources 831 are located on the second circumference c82. As shown in FIG. 19, a central axis f83 of the light emitted from each third lens 832 is oblique to the rotation axis C. The third lenses 832 are arranged so that the angles (angles θ3) between the rotation axis C and the central axes f83 of the light emitted from the five third lens 832 have substantially the same value, and the angles θ3 are greater than the angles θ2.

Each fourth light source unit 840 includes a fourth light source 841, and a fourth lens 842 on which the light emitted from the fourth light source 841 is incident. As shown in FIG. 18, for example, two of the seven fourth light sources 841 are located on the second circumference c82. For example, the remaining five of the seven fourth light sources 841 are located on a third circumference c83 that is centered on the rotation axis C and has a larger diameter than the second circumference c82. As shown in FIG. 19, a central axis f84 of the light emitted from each fourth lens 842 is oblique to the rotation axis C. The fourth lenses 842 are arranged so that the angles (angles θ4) between the rotation axis C and the central axes f84 of the light emitted from the seven fourth lens 842 have substantially the same value, and the angles θ4 are greater than the angles θ3.

As shown in FIG. 18, each fifth light source unit 850 includes a fifth light source 851, and a fifth lens 852 on which the light emitted from the fifth light source 851 is incident. For example, eleven fifth light sources 851 are located on the third circumference c83. As shown in FIG. 20, a central axis f85 of the light emitted from each fifth lens 852 is oblique to the rotation axis C. The fifth lenses 852 are arranged so that the angles (angles θ5) between the rotation axis C and the central axes f85 of the light emitted from the eleven fifth lenses 852 have substantially the same value, and the angles θ5 are greater than the angles θ4.

The plurality of first lenses 812, the plurality of second lenses 822, the plurality of third lenses 832, the plurality of fourth lenses 842, the plurality of fifth lenses 852, and one central lens 892 are formed to have a continuous body as one light-transmitting member 885 by being linked at the surface emitting light. The light sources 811, 821, 831, 841, 851, 891, and the light-transmitting member 885 are fixed to the substrate 150.

Thus, as shown in FIG. 21A, the light that is emitted from the central lens 892 is irradiated on a central irradiation region h89 in the plane P3 orthogonal to the rotation axis C. The central irradiation region h89 is a circular region centered on the rotation axis C.

The light that is emitted from the first lens 812 is irradiated on a first irradiation region h81 in the plane P3. The first irradiation region h81 is a circular-ring-shaped region that is centered on the rotation axis C and positioned outward of the central irradiation region h89. The central axis f81 of the light emitted from each first lens 812 moves on a circumferential trajectory e81 inside the first irradiation region h81 when the substrate 150 is rotated.

The light that is emitted from each second lens 822 is irradiated on a second irradiation region h82 in the plane P3. The second irradiation region h82 is a ring-shaped region that is centered on the rotation axis C and positioned outward of the first irradiation region h81. The central axis f82 of the light emitted from each second lens 822 moves on a circumferential trajectory e82 inside the second irradiation region h82 when the substrate 150 is rotated.

The light that is emitted from each third lens 832 is irradiated on a third irradiation region h83 in the plane P3. The third irradiation region h83 is a circular-ring-shaped region that is centered on the rotation axis C and positioned outward of the second irradiation region h82. The central axis f83 of the light emitted from each third lens 832 moves on a circumferential trajectory e83 inside the third irradiation region h83 when the substrate 150 is rotated.

The light that is emitted from each fourth lens 842 is irradiated on a fourth irradiation region h84 in the plane P3. The fourth irradiation region h84 is a circular-ring-shaped region that is centered on the rotation axis C and positioned outward of the third irradiation region h83. The central axis f84 of the light emitted from each fourth lens 842 moves on a circumferential trajectory e84 inside the fourth irradiation region h84 when the substrate 150 is rotated.

The light that is emitted from each fifth lens 852 is irradiated on a fifth irradiation region h85 in the plane P3. The fifth irradiation region h85 is a circular-ring-shaped region that is centered on the rotation axis C and positioned outward of the fourth irradiation region h84. The central axis f85 of the light emitted from each fifth lens 852 moves on a circumferential trajectory e85 inside the fifth irradiation region h85 when the substrate 150 is rotated.

Also, the number of the first lenses 812<the number of the second lenses 822<the number of the third lenses 832<the number of the fourth lenses 842<the number of the fifth lenses 852. In other words, the number of light source units increases for light source units irradiating light on outer irradiation regions. The occurrence of an illuminance difference between the plurality of irradiation regions h81, h82, h83, h84, and h85 caused by the peripheral velocity difference can be suppressed thereby.

Thus, according to the embodiment, among the plurality of lenses 812, 822, 832, 842, and 852, the number of the lenses 812 capable of irradiating light on the trajectory e81 of the first irradiation region h81 centered on the rotation axis C of the plurality of light source units 810, 820, 830, 840, and 850 is less than the number of the lenses 822 capable of irradiating light on the trajectory e82 of the second irradiation region h82 that is centered on the rotation axis C and positioned further outward than the trajectory e81 of the first irradiation region h81. The occurrence of an illuminance difference between the first irradiation region h81 and the second irradiation region h82 caused by the peripheral velocity difference can be suppressed thereby.

Also, according to the embodiment, angles θ0, θ1, θ2, θ3, θ4, and θ5 are determined based on the following Formula (1), where the angle between the rotation axis C and the central axis f89 of the light emitted from the central lens 892 is the "angle θ0."

$$\theta k = k\alpha/[2(n-1)] \quad \text{Formula(1)}$$

Here, n is the total number of the irradiation regions h89, h81, h82, h83, h84, and h85, and is six according to the embodiment. Also, k is the numeral of the irradiation region when the central irradiation region h89 is the 0th irradiation region, k increases by one for each outward irradiation region, and k is any integer not less than 0 and not more than n−1. Also, as shown in FIG. 21B, an angle α (0°<α<180°) is the angle between a straight line 931 and a straight line 932, where the straight line 931 connects a center point, taken to be the intersection between the rotation axis C and the plane in which the light-emitting surfaces of the plurality of light sources extend, and one point among two points positioned at opposite corners of the imaging region 930, and the straight line 932 connects the center point and the other point among the two points. Accordingly, according to the embodiment, the angle θ0=0 degrees, the angle θ1=α/10 degrees, the angle θ2=2α/10 degrees, the angle θ3=3α/10 degrees, the angle θ4=4α/10 degrees, and the angle θ5=5α/10 degrees.

However, the method for setting the angles θ0, θ1, θ2, θ3, θ4, and θ5 is not limited to that described above. For example, the angle θ0 between the rotation axis C and the central axis f89 of the light emitted from the central lens 892 may be greater than 0 degrees and may be less than the angle θ1 between the rotation axis C and the central axis f81 of the light emitted from the first lens 812. In such a case, the angles θ0, θ1, θ2, θ3, θ4, and θ5 may be determined based on the following Formula (2).

$$\theta k=(k+1)\alpha/[2(n-1)] \quad \text{Formula (2)}$$

Here, n, k, and a are defined similarly to Formula (1).

EXAMPLES

Examples will now be described.

Figure 22:
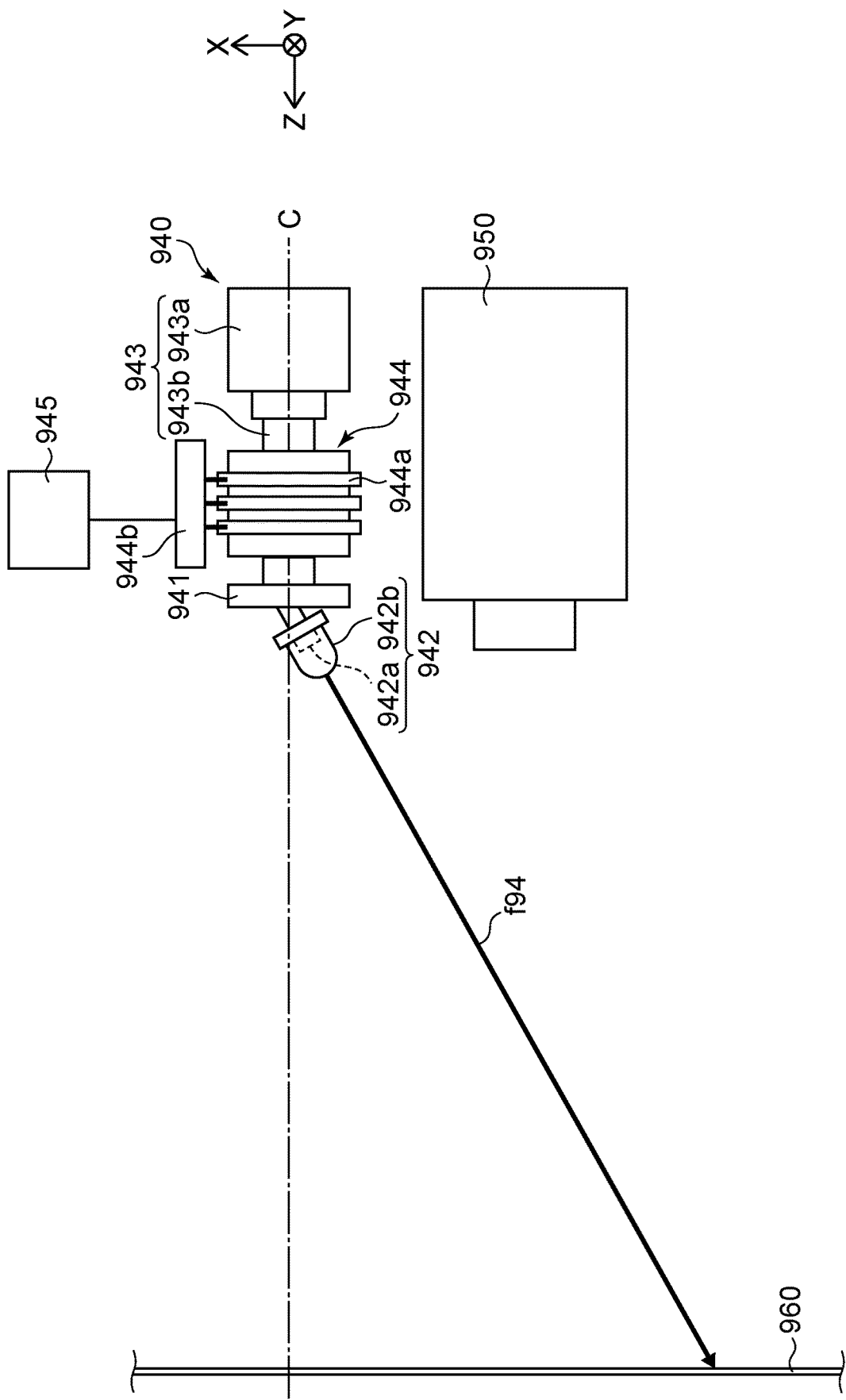
FIG. 22 is a schematic view showing a screen, a camera, and a light-emitting module according to an example.

FIG. 22 is a schematic view showing a screen, a camera, and a light-emitting module according to an example.

Figure 23A:
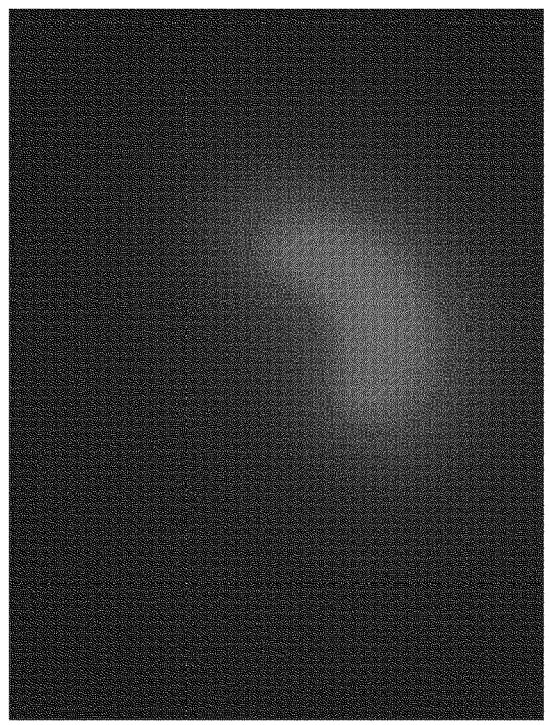
FIG. 23A is an image captured by a camera in an example.
Figure 23B:
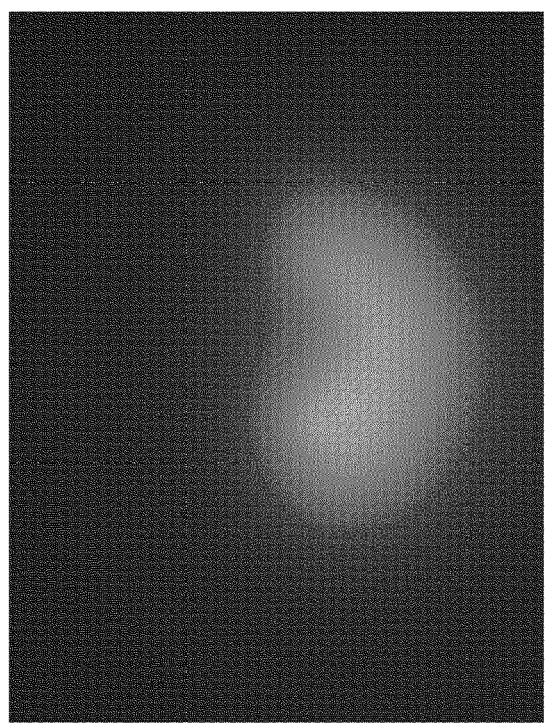
FIG. 23B is an image captured by a camera in an example.

FIGS. 23A and 23B are images captured by the camera in the examples.

FIGS. 24A, 24B, and 24C are images captured by the camera in the examples.

The light-emitting module 940, the camera 950, and the screen 960 were prepared in the examples.

The light-emitting module 940 included a substrate 941, a light source unit 942, a driver 943, a rotary connector 944, and a controller 945.

The light source unit 942 included a light-emitting element, a wavelength conversion member, a light source 942a capable of emitting white light, and a cannonball-shaped lens 942b covering the light source 942a. The full width at half maximum of the light emitted from the lens 942b was about 15 degrees.

The driver 943 included a motor 943a, and a shaft 943b rotatable by the motor 943a. The substrate 941 was mounted to the distal end of the shaft 943b. Also, the light source unit 942 was fixed to the substrate 941 in a state in which a central axis f94 of the light emitted from the lens 942b was tilted 10 degrees with respect to the rotation axis C of the substrate 941. At this time, the pair of electrodes of the light source 942a was electrically connected to wiring parts of the substrate 941.

The rotary connector 944 was slip rings. The shaft 943b was located at the inner side of the rotary connector 944, and rings 944a of the ring unit of the rotary connector 944 were electrically connected to wiring parts of the substrate 941. Also, a brush unit 944b of the rotary connector 944 was electrically connected to the controller 945 that included a signal generator.

The camera 950 was located at the vicinity of the light-emitting module 940. The screen 960 was located at a position about 1 m away from the light-emitting module 940 and the camera 950 in the +Z direction, and light was irradiated from the light source unit 942 in the +Z direction.

First, the substrate 941 and the light source unit 942 were rotated at a period of 900 ms by the driver 943, and the output of the light source 942a was controlled by the controller 945 so that the light source unit 942 was lit for 450 ms each rotation. Then, the screen 960 was imaged using a shutter speed of the camera 950 of 1 s. The captured image of the camera 950 at this time is shown in FIG. 23A. Namely, FIG. 23A is the captured image of the screen 960 while the light source unit 942 rotated about one time.

Also, the screen 960 was imaged using a shutter speed of the camera 950 with 2 s. The captured image of the camera 950 at this time is shown in FIG. 23B. Namely, FIG. 23B is the captured image of the screen 960 while the light source unit 942 rotated about two times.

From FIGS. 23A and 23B, it was found that light can be partially irradiated in a circular-ring-shaped irradiation region centered on the rotation axis C by controlling the output of the light source 942a of the light source unit 942 while rotating the light source unit 942 emitting light of which the central axis f94 is oblique to the rotation axis C.

Also, the portion of the captured image of FIG. 23B on which the light was irradiated by the light-emitting module 940 was brighter than the portion of the captured image of FIG. 23A on which the light was irradiated by the light-emitting module 940. Therefore, it was found that the illuminance of the portion of the irradiation region on which the light is irradiated by the light-emitting module 940 can be increased by increasing the number of times that the light source unit 942 is rotated.

Then, the light source unit 942 was fixed to the substrate 941 in a state in which the central axis f94 of the light emitted from the lens 942b was tilted 30 degrees with respect to the rotation axis C. Then, the light source unit 942 was rotated by the driver 943 at a period of 900 ms, and the output of the light source 942a was controlled by the controller 945 to be constantly lit when rotating. Then, the screen 960 was imaged using a shutter speed of the camera 950 of 1 s. The captured image of the camera 950 at this time is shown in FIG. 24A.

Also, the screen 960 was imaged using a shutter speed of the camera 950 of 2 s. The captured image of the camera 950 at this time is shown in FIG. 24B.

Also, the screen 960 was imaged using a shutter speed of the camera 950 of 3.2 s. The captured image of the camera 950 at this time is shown in FIG. 24C.

In the captured image shown in FIG. 24A, a portion 991 of a ring-shaped irradiation region 990 is brighter than the other portions of the irradiation region 990 due to the rotation of the light source unit 942. This is because the shutter speed of the camera 950 was greater than the rotation period of the light source unit 942, and overlap of the irradiated light of the portion 991 of the irradiation region 990 was more noticeable than the other portions.

In the captured images shown in FIGS. 24B and 24C, the difference of the overlapping light intensity was reduced by increasing the number of rotations of the light source unit 942, and the unevenness of the brightness of the ring-shaped irradiation region was less than that of FIG. 24A. Therefore, it was found that the unevenness of the brightness of the captured image occurring due to a misalignment between the rotation period at which the light source unit 942 rotates and the shutter speed of the camera 950 can be reduced by setting the number of rotations of the light source unit 942 to be a plurality of, and favorably three or more, rotations.

The plurality of embodiments, modifications, and configurations described above can be combined as appropriate within the extent of technical feasibility.

INDUSTRIAL APPLICABILITY

For example, the invention can be utilized in a flash of a camera, lighting, an automotive headlight, etc.

This application is based upon and claims the benefit of priority from Japanese Patent Application 2020-214877 filed with the Japan Patent Office on Dec. 24, 2020, Japanese Patent Application 2021-190792 filed with the Japan Patent Office on Nov. 25, 2021, and Japanese Patent Application 2021-198770 filed with the Japan Patent Office on Dec. 7, 2021, and the entire contents of these Japanese Patent Applications are incorporated herein by reference.

REFERENCE NUMERAL LIST 100, 200, 300, 600a, 600b, 700, 800, 940 light-emitting module
110, 210, 610, 710, 810 first light source unit
111, 611, 711, 811 first light source
112, 212, 412, 512, 612, 712, 812 first lens
112a, 212a, 412a first surface
112b, 212b, 412b second surface
112c, 212c, 412c third surface
120, 220, 620, 720, 820 second light source unit
121, 621, 721, 821 second light source
122, 222, 622, 722, 822 second lens
122a and 222a first surface
122b and 222b second surface
122c and 222c third surface
130, 230, 630, 730, 830 third light source unit
131, 631, 731, 831 third light source
132, 232, 632, 732, 832 third lens
132a and 232a first surface
132b and 232b second surface
132c and 232c third surface
140, 240, 640, 740, 840 fourth light source unit
141, 641, 741, 841 fourth light source
142, 242, 642, 742, 842 fourth lens
142a and 242a first surface
142b and 242b second surface
142c and 242c third surface
150 and 941 substrate
160, 360, 943 driver
161, 361, 943a motor
162, 362, 943b shaft
170, 370, 945 controller
185, 385, 685, 785, 885 light-transmitting member
190, 944 rotary connector
310, 942 light source unit
311, 942a light source
312, 942b lens
312a first surface
312b second surface
312c third surface
412t1 first perimeter edge
412t2 second perimeter edge
650, 850 fifth light source unit
651, 851 fifth light source
652, 852 fifth lens
660 sixth light source unit
661 sixth light source
662 sixth lens
670 seventh light source unit
671 seventh light source
672 seventh lens
711s, 721s, 731s, 741s light-emitting surface
890 central light source unit
891 central light source
892 central lens
910 cover member
920 housing
930 imaging region
950 camera
960 screen
C rotation axis
e1, e2, e3, e4, e61, e62, e63, e64, e65, e66, e67, e81, e82, e83, e84, e85 trajectory
es1 subdivision
h1, h2, h3, h4, h61, h62, h63, h64, h65, h66, h67, h81, h82, h83, h84, h85, h89, 990 irradiation region
L1 to L4 light
f1 to f4, f21 to f24, f31, f41, f51, f81, f82, f83, f84, f85, f89, f94 central axis
$\theta 0, \theta 1, \theta 2, \theta 3, \theta 4, \theta 5, \theta 1a, \theta 1b, \theta 2a, \theta 2b, \theta 3a, \theta 3b, \theta 4a, \theta 4b, \theta 21a, \theta 21b, \theta 22a, \theta 22b, \theta 23a, \theta 23b, \theta 24a, \theta 24b, \theta 31a, \theta 31b, \theta 41a$ angle

The invention claimed is:

1. A light-emitting module comprising:
a first light source unit comprising:
a first light source, and
a first lens that includes a light-incident surface on which light emitted from the first light source is incident, wherein the light-incident surface comprises a convex portion;
a driver configured to rotate the first lens such that a central axis of light emitted from the first lens moves on a circumferential trajectory; and
a controller configured to, conjunctively with the driver, control an output of the first light source; wherein:
the central axis of the light emitted from the first lens is oblique to a rotation axis of the first lens; and
the controller is configured to control the output of the first light source according to a position, on the circumferential trajectory, of the central axis of the light emitted from the first lens.

2. The light-emitting module according to claim 1, wherein:
the driver is configured to rotate the first lens with respect to the first light source.

3. The light-emitting module according to claim 1, wherein
the driver is configured to rotate the first light source unit.

4. The light-emitting module according to claim 3, further comprising:
a second light source unit comprising:
a second light source, and
a second lens on which light emitted from the second light source is incident; and
a substrate to which the first and second light source units are mounted; wherein:
the driver is configured to rotate the second light source unit together with the first light source unit by rotating the substrate;
the controller is configured to, conjunctively with the driver, control an output of the second light source; and
a central axis of light emitted from the second lens is oblique to the rotation axis.

5. The light-emitting module according to claim 4, wherein:
an angle between the rotation axis and the central axis of the light emitted from the second lens is different from an angle between the rotation axis and the central axis of the light emitted from the first lens.

6. The light-emitting module according to claim 4, wherein:
an angle between the rotation axis and the central axis of the light emitted from the second lens is equal to an angle between the rotation axis and the central axis of the light emitted from the first lens;
the light emitted from the first light source is white light; and
the light emitted from the second light source is white light having a color temperature different from a color temperature of the light emitted from the first light source.

7. The light-emitting module according to claim 4, wherein:
an angle between the rotation axis and the central axis of the light emitted from the second lens is greater than an angle between the rotation axis and the central axis of the light emitted from the first lens; and
a surface area of a light-emitting surface of the second light source is greater than a surface area of a light-emitting surface of the first light source.

8. The light-emitting module according to claim 4, wherein:
the first light source unit and the second light source unit are on the substrate at a circumference centered on the rotation axis.

9. The light-emitting module according to claim 1, wherein:
the light emitted from the first lens is divided into a plurality of subdivisions on a trajectory of the central axis of the light emitted from the first lens; and
the controller is configured to control the output of the first light source in the plurality of subdivisions.

10. The light-emitting module according to claim 1, wherein:
the first lens includes:
a light-reflective surface located at a periphery of the light-incident surface, wherein the light-reflective surface is a total reflection surface that totally reflects light; and
a light-emission surface positioned at a side opposite to the light-incident surface, the light-emission surface emitting light entering through the light-incident surface.

11. The light-emitting module according to claim 10, wherein:
the light-emission surface is oblique to the rotation axis.

12. The light-emitting module according to claim 10, wherein:
the light-reflective surface includes:
a first perimeter edge facing toward the first light source from the first lens, and
a second perimeter edge positioned at a side opposite to the first perimeter edge; and
a line connecting a center of the first perimeter edge and a center of the second perimeter edge is oblique to the rotation axis.

13. The light-emitting module according to claim 1, wherein:
the first lens is a convex lens; and
an optical axis of the first lens is oblique to the rotation axis.

14. A light-transmitting member comprising:
a first lens configured to emit light such that a central axis of the light emitted from the first lens is oriented at a first angle relative to a central axis of the light-transmitting member, wherein the first lens includes a light-incident surface comprising a convex portion; and
a second lens configured to emit light such that a central axis of the light emitted from the second lens is oriented at a second angle relative to the central axis of the light-transmitting member, the second lens arranged adjacent to the first lens in a circumferential direction around the central axis of the light-transmitting member, the second angle different than the first angle.

15. The light-transmitting member according to claim 14, wherein:
the first lens includes:
a light-reflective surface located at a periphery of the light-incident surface, wherein the light-reflective surface is a total reflection surface that totally reflects light; and
a light-emission surface positioned at a side opposite to the light-incident surface, the light-emission surface emitting light entering through the light-incident surface.

16. The light-transmitting member according to claim 14, wherein:
the first lens includes a first emission surface oriented at a third angle relative to the central axis of the light-transmitting member; and
the second lens includes a second emission surface oriented at a fourth angle relative to the central axis of the light-transmitting member, the fourth angle different than the third angle.

17. The light-transmitting member according to claim 16, wherein:
the second emission surface is contiguous with the first emission surface.

18. The light-transmitting member according to claim 16, wherein:
the first emission surface and the second emission surface are flat surfaces.

19. The light-transmitting member according to claim 14, wherein:
the first lens is formed from a first material with a first refractive index; and
the second lens is formed from a second material with a second refractive index, the second refractive index different from the first refractive index.

* * * * *